(12) United States Patent
Sotoku et al.

(10) Patent No.: US 9,768,040 B2
(45) Date of Patent: Sep. 19, 2017

(54) SUBSTRATE TREATMENT METHOD

(71) Applicant: SCREEN Holdings Co., Ltd., Kyoto (JP)

(72) Inventors: Kota Sotoku, Kyoto (JP); Takayoshi Tanaka, Kyoto (JP); Masanobu Sato, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/463,705

(22) Filed: Mar. 20, 2017

(65) Prior Publication Data

US 2017/0194173 A1 Jul. 6, 2017

Related U.S. Application Data

(62) Division of application No. 14/193,112, filed on Feb. 28, 2014.

(30) Foreign Application Priority Data

Mar. 15, 2013 (JP) .................................. 2013-54246
Mar. 15, 2013 (JP) .................................. 2013-54247

(51) Int. Cl.
*B08B 3/04* (2006.01)
*B08B 7/00* (2006.01)
*H01L 21/67* (2006.01)
*H01L 21/02* (2006.01)

(52) U.S. Cl.
CPC ........ *H01L 21/67051* (2013.01); *B08B 3/041* (2013.01)

(58) Field of Classification Search
CPC ............... B08B 3/041; H01L 21/67028; H01L 21/02052; H01L 21/67057
See application file for complete search history.

(56) References Cited

U.S. PATENT DOCUMENTS

| 5,975,098 A | 11/1999 | Yoshitani ...................... 134/148 |
| 9,355,872 B2 * | 5/2016 | Tanaka .............. H01L 21/02052 |
| 9,539,589 B2 * | 1/2017 | Araki .................. B05B 17/0607 |

(Continued)

FOREIGN PATENT DOCUMENTS

| CN | 101009208 A | 8/2007 |
| CN | 102214548 A | 10/2011 |

(Continued)

*Primary Examiner* — Alexander Markoff
(74) *Attorney, Agent, or Firm* — Ostrolenk Faber LLP

(57) ABSTRACT

A substrate treatment method and apparatus including a change controlling unit which changes at least one of a protection liquid application position relative to a liquid droplet nozzle and a protection liquid incident angle relative to the liquid droplet nozzle, the protection liquid application position being a position at which the protection liquid is applied on an upper surface of the substrate, the protection liquid incident angle being an angle at which the protection liquid is incident on the liquid application position; wherein the change controlling unit controls the liquid application position and the incident angle in a first condition when the spraying region is located on an upper surface center portion of the substrate, and controls the liquid application position and the incident angle in a second condition when the spraying region is located on an upper surface peripheral portion of the substrate.

7 Claims, 25 Drawing Sheets

(56) References Cited

U.S. PATENT DOCUMENTS

| | | | |
|---|---|---|---|
| 2003/0079764 A1 | 5/2003 | Hirose | 134/95.3 |
| 2004/0207378 A1 | 10/2004 | Bucur | 323/288 |
| 2007/0169793 A1 | 7/2007 | Shimada et al. | 134/26 |
| 2008/0135069 A1 | 6/2008 | Lu et al. | 134/30 |
| 2011/0206486 A1 | 8/2011 | Matsuyama et al. | 414/222.02 |
| 2011/0240601 A1 | 10/2011 | Hashizume et al. | 216/83 |
| 2012/0222707 A1 | 9/2012 | Sato et al. | 134/33 |
| 2012/0247506 A1* | 10/2012 | Tanaka | H01L 21/02052 134/4 |
| 2013/0052360 A1 | 2/2013 | Maegawa et al. | 427/421.1 |
| 2014/0261572 A1* | 9/2014 | Sotoku | H01L 21/67051 134/33 |
| 2015/0246365 A1* | 9/2015 | Maegawa | B05B 17/0607 118/321 |

FOREIGN PATENT DOCUMENTS

| | | |
|---|---|---|
| JP | 10-163161 | 6/1998 |
| JP | 2002-113429 A | 4/2002 |
| JP | 2005-044872 A | 2/2005 |
| JP | 2007-088381 A | 4/2007 |
| JP | 2009-290040 A | 12/2009 |
| JP | 2012-070002 A | 4/2012 |
| JP | 2013-051286 | 3/2013 |
| JP | 2013-065795 | 4/2013 |
| JP | 2013-206977 | 10/2013 |

* cited by examiner

FIG. 7A  FIRST COVERING STEP
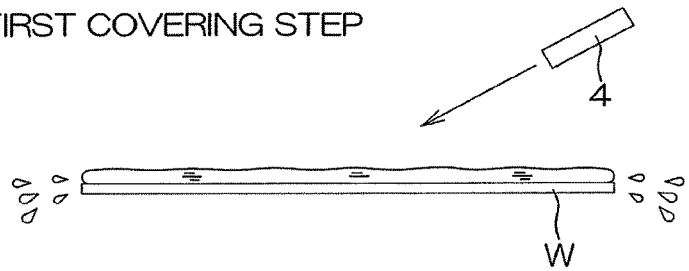
FIG. 7B  CLEANING STEP & SECOND COVERING STEP
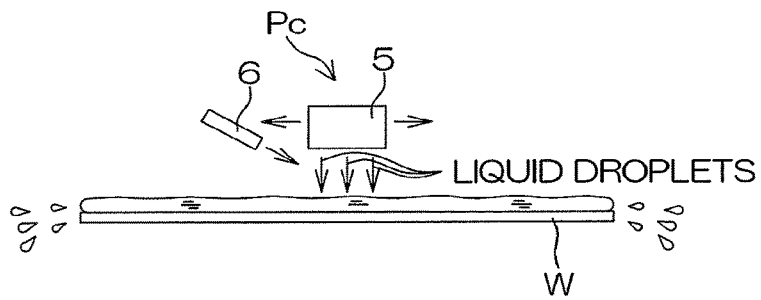
FIG. 7C  CLEANING STEP & SECOND COVERING STEP
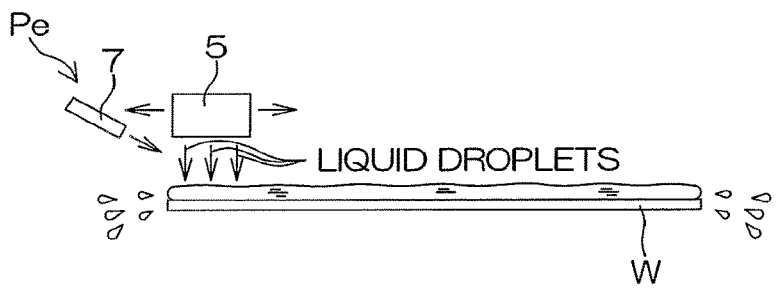
FIG. 7D  RINSING STEP
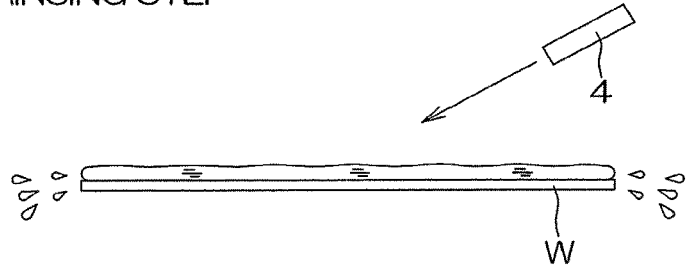
FIG. 7E  DRYING STEP
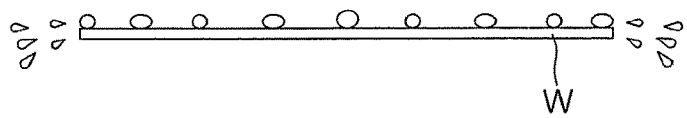

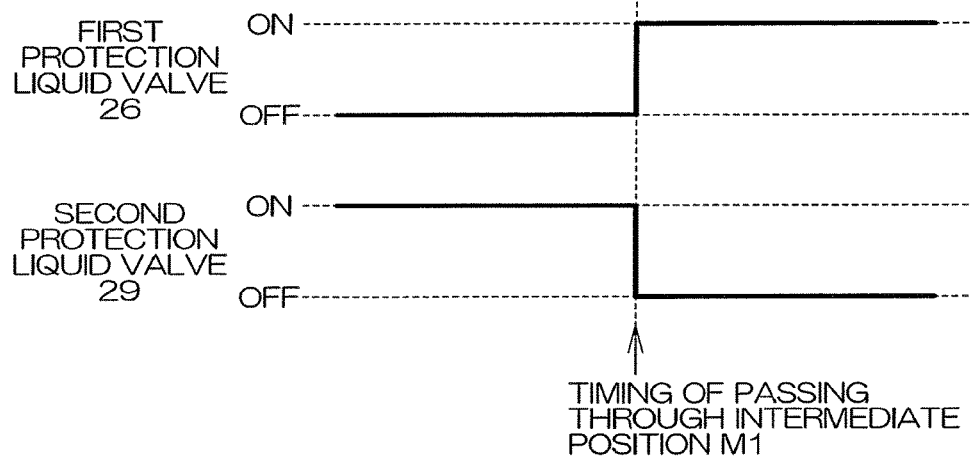
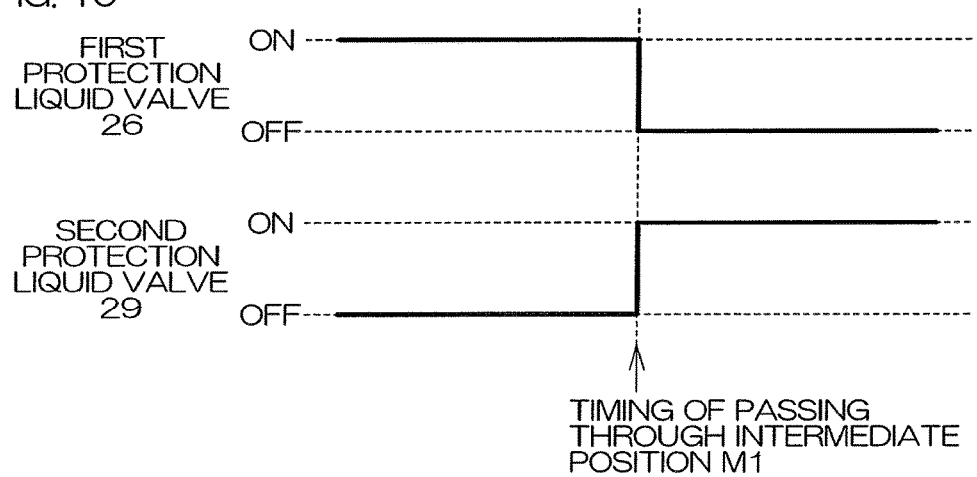

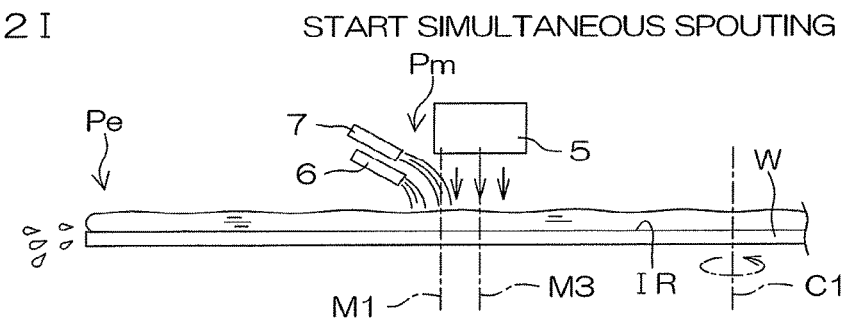
FIG. 12 I  START SIMULTANEOUS SPOUTING
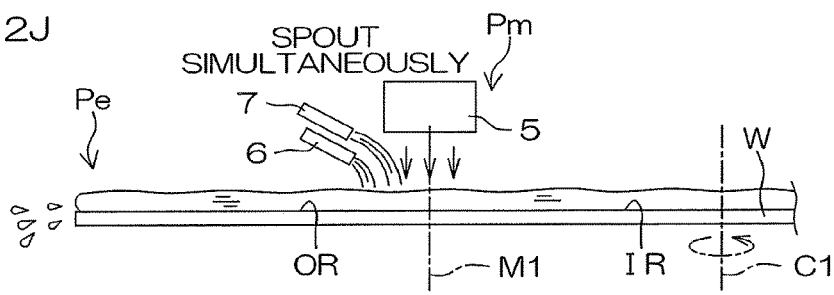
FIG. 12J  SPOUT SIMULTANEOUSLY
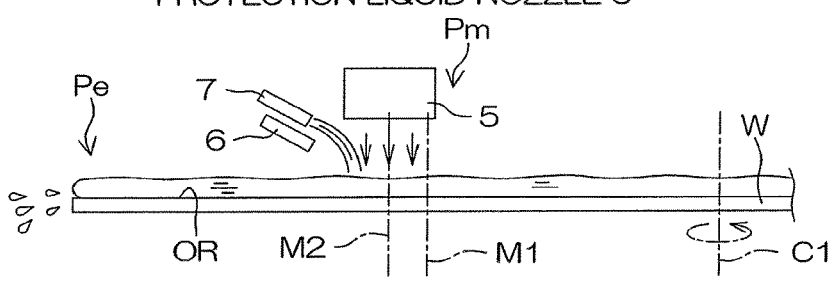
FIG. 12K  STOP SPOUTING FROM FIRST PROTECTION LIQUID NOZZLE 6
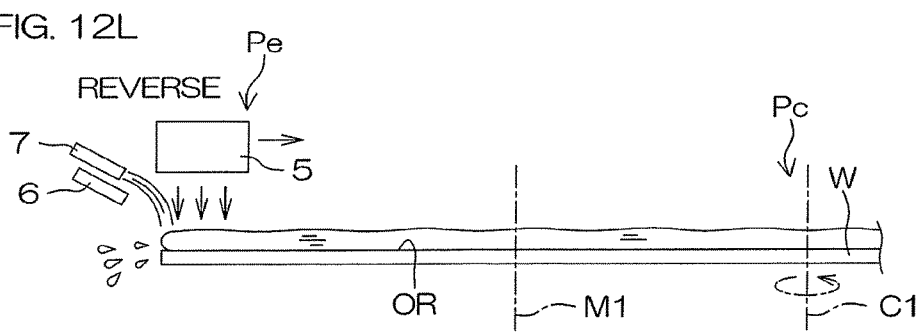
FIG. 12L  REVERSE

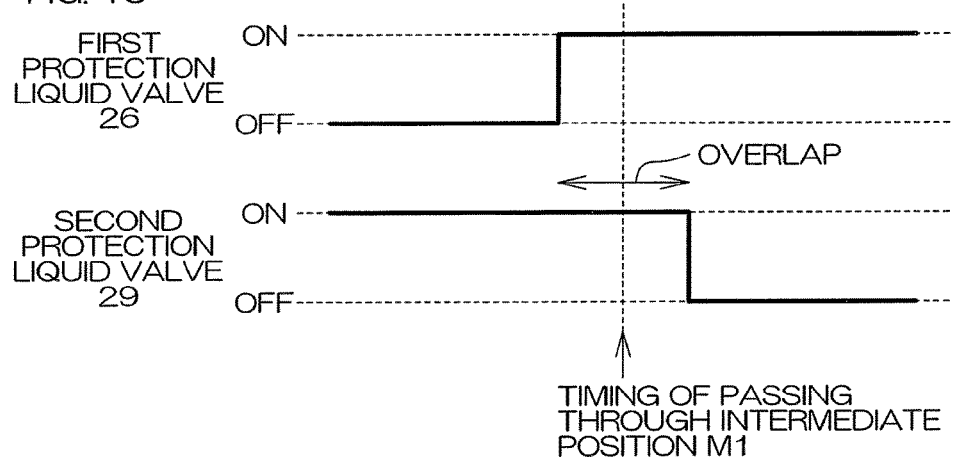
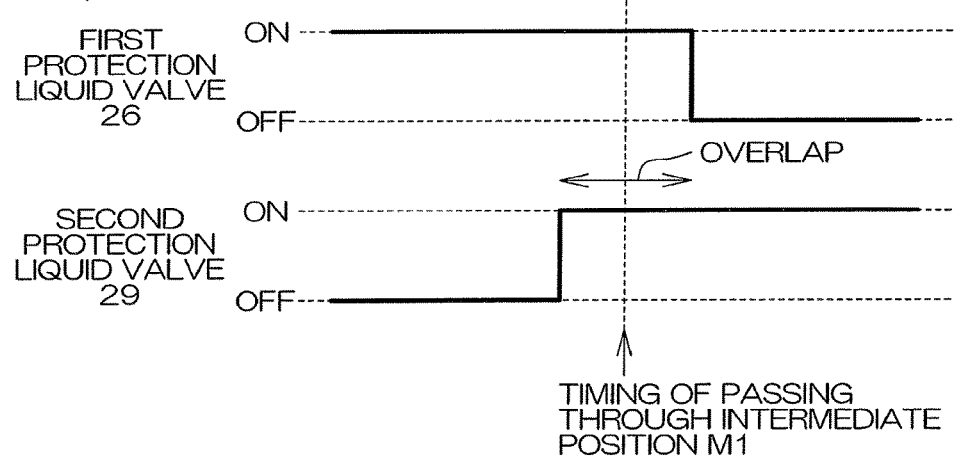

SUBSTRATE TREATMENT METHOD

CROSS REFERENCE TO RELATED APPLICATION

This application is a divisional of U.S. patent application Ser. No. 14/193,112, filed Feb. 28, 2014, which claims the benefit of Japanese Patent Application Nos. 2013-54246, filed Mar. 15, 2013 and 2013-54247, filed Mar. 15, 2013, which are all incorporated herein by reference.

BACKGROUND OF THE INVENTION

1. Field of the Invention

The present invention relates to a substrate treatment apparatus and a substrate treatment method. Exemplary substrates to be treated include semiconductor wafers, substrates for liquid crystal display devices, substrates for plasma display devices, substrates for FED (Field Emission Display) devices, substrates for optical disks, substrates for magnetic disks, substrates for magneto-optical disks, substrates for photo masks, ceramic substrates and substrates for solar cells.

2. Description of Related Art

In production processes for semiconductor devices, liquid crystal display devices and the like, substrates such as semiconductor wafers and glass substrates for the liquid crystal display devices are treated with a treatment liquid.

A substrate treatment apparatus of a single substrate treatment type adapted to treat a single substrate at a time includes a spin chuck which horizontally holds and rotates the substrate, a liquid droplet nozzle which causes liquid droplets of the treatment liquid to impinge on an upper surface of the substrate held by the spin chuck, and a protection liquid nozzle which spouts a protection liquid toward the upper surface of the substrate held by the spin chuck (see, for example, US2012/0247506A1). In this substrate treatment apparatus, the liquid droplet nozzle and the protection liquid nozzle are moved while being maintained in predetermined positional relation.

In the substrate treatment apparatus, the liquid droplet nozzle spouts the treatment liquid toward a region (hereinafter referred to as "spraying region") on the upper surface of the substrate. Simultaneously with the spouting of the treatment liquid from the liquid droplet nozzle, the protection liquid is spouted from the protection liquid nozzle toward the upper surface of the substrate. The protection liquid spouted from the protection liquid nozzle flows into the spraying region, whereby a liquid film of the protection liquid having a sufficient thickness is formed on the spraying region. Thus, the spraying region is covered with the protection liquid film and, in this state, the treatment liquid droplets impinge on the spraying region.

SUMMARY OF THE INVENTION

In the substrate treatment apparatus disclosed in US2012/0247506A1, the position and the attitude of the protection liquid nozzle relative to the liquid droplet nozzle should be set so that the protection liquid supplied to the upper surface of the substrate can flow into the spraying region against the treatment liquid droplets and the spraying region can be entirely covered with the protection liquid.

However, the protection liquid spreads in different ways in a center portion of the substrate and in a peripheral portion of the substrate on the upper surface of the substrate. If the position and the attitude of the protection liquid nozzle are set based on a state in which the protection liquid is supplied to the upper surface center portion of the substrate, the protection liquid does not spread over the entire spraying region on the upper surface peripheral portion of the substrate. Therefore, the spraying region is liable to have a portion not formed with a sufficiently thick protection liquid film. If the position and the attitude of the protection liquid nozzle are set based on a state in which the protection liquid is supplied to the upper surface peripheral portion of the substrate, the protection liquid does not spread over the entire spraying region on the upper surface center portion of the substrate. Therefore, the spraying region is liable to have a portion not formed with a sufficiently thick protection liquid film.

If the treatment liquid droplets are sprayed to the spraying region having a portion uncovered with the liquid film or covered with a thinner liquid film, a great impact is applied to a pattern formed on the substrate due to the impingement of the liquid droplets on the substrate, resulting in damage of the substrate such as collapse of the pattern.

A conceivable approach to this problem is to increase the flow rate of the protection liquid to be supplied to the substrate in order to reliably cover the entire spraying region with the protection liquid both on the upper surface center portion of the substrate and on the upper surface peripheral portion of the substrate. However, this approach increases the costs required for treating a single substrate.

It is therefore an object of the present invention to provide a substrate treatment apparatus and a substrate treatment method which suppress the damage of the substrate without increasing the flow rate of the protection liquid to be supplied to the substrate.

According to a first inventive aspect, there is provided a substrate treatment apparatus, which includes: a substrate holding unit which horizontally holds a substrate; a rotation unit which rotates the substrate held by the substrate holding unit about a vertical rotation axis; a liquid droplet nozzle which generates droplets of a treatment liquid to be sprayed to a spraying region on an upper surface of the substrate held by the substrate holding unit; a protection liquid nozzle which spouts a protection liquid to the upper surface of the substrate to form a liquid film of the protection liquid on the upper surface of the substrate so that, with the spraying region covered with the protection liquid film, the treatment liquid droplets impinge on the spraying region; a nozzle moving unit which, while maintaining the liquid droplet nozzle and the protection liquid nozzle in predetermined positional relation, moves the liquid droplet nozzle and the protection liquid nozzle so as to move the spraying region between an upper surface center portion of the substrate and an upper surface peripheral portion of the substrate; and a change controlling unit which changes at least one of a protection liquid application position relative to the liquid droplet nozzle and a protection liquid incident angle relative to the liquid droplet nozzle according to the position of the spraying region on the upper surface of the substrate, the protection liquid application position being a liquid application position at which the protection liquid spouted from the protection liquid nozzle is applied on the upper surface of the substrate, the protection liquid incident angle being an incident angle at which the protection liquid spouted from the protection liquid nozzle is incident on the liquid application position; wherein the change controlling unit controls the liquid application position and the incident angle in a first condition when the spraying region is located on the upper surface center portion of the substrate, and controls the liquid application position and the incident angle in a second condition different from the first condition when the spraying region is located on the upper surface peripheral portion of the substrate.

With this arrangement, the liquid application position and the incident angle of the protection liquid to be spouted from the protection liquid nozzle are changed according to the position of the spraying region on the upper surface of the substrate. More specifically, the liquid application position and the incident angle are controlled in the first condition when the spraying region is located on the upper surface center portion of the substrate, and controlled in the second condition when the spraying region is located on the upper surface peripheral portion of the substrate.

The first condition may be such that, with the spraying region located on the upper surface center portion of the substrate, the protection liquid spouted from the protection liquid nozzle spreads over the entire spraying region. The second condition may be such that, with the spraying region located on the upper surface peripheral portion of the substrate, the protection liquid spouted from the protection liquid nozzle spreads over the entire spraying region.

More specifically, it is preferred that the first condition is optimized for a state in which the spraying region is located on the upper surface center portion of the substrate, and the second condition is optimized for a state in which the spraying region is located on the upper surface peripheral portion of the substrate. In this case, the spraying region can be entirely covered with the protection liquid film even if the protection liquid is supplied at a lower flow rate to the substrate from the protection liquid nozzle located above the upper surface center portion of the substrate. Further, the spraying region can be entirely covered with the protection liquid film even if the protection liquid is supplied at a lower flow rate to the substrate from the protection liquid nozzle located above the upper surface peripheral portion of the substrate.

As a result, the spraying region can be entirely covered with the protection liquid film by supplying the protection liquid at a lower flow rate to the substrate irrespective of the position of the spraying region on the upper surface of the substrate.

Thus, the damage of the substrate can be suppressed without increasing the flow rate of the protection liquid to be supplied to the substrate.

According to an embodiment of the inventive aspect, the protection liquid nozzle may include a first protection liquid nozzle and a second protection liquid nozzle. The position and the attitude of the first protection liquid nozzle relative to the liquid droplet nozzle may be such that, with the spraying region located on the upper surface center portion of the substrate, the protection liquid spouted from the first protection liquid nozzle spreads over the entire spraying region. The position and the attitude of the second protection liquid nozzle relative to the liquid droplet nozzle may be such that, with the spraying region located on the upper surface peripheral portion of the substrate, the protection liquid spouted from the second protection liquid nozzle spreads over the entire spraying region. In this case, the change controlling unit includes a spouting controlling unit which spouts the protection liquid only from the first protection liquid nozzle without spouting the protection liquid from the second protection liquid nozzle when the spraying region is located on the upper surface center portion of the substrate, and spouts the protection liquid only from the second protection liquid nozzle without spouting the protection liquid from the first protection liquid nozzle when the spraying region is located on the upper surface peripheral portion of the substrate.

With this arrangement, the protection liquid is spouted only from the first protection liquid nozzle when the spraying region is located on the upper surface center portion of the substrate. The first protection liquid nozzle is set in the position and the attitude such that, with the spraying region located on the upper surface center portion of the substrate, the protection liquid spouted from the first protection liquid nozzle spreads over the entire spraying region. Therefore, the spraying region can be entirely covered with the protection liquid film even if the protection liquid is supplied at a lower flow rate to the substrate from the first protection liquid nozzle.

Further, the protection liquid is spouted only from the second protection liquid nozzle when the spraying region is located on the upper surface peripheral portion of the substrate. The second protection liquid nozzle is set in the position and the attitude such that, with the spraying region located on the upper surface peripheral portion of the substrate, the protection liquid spouted from the second protection liquid nozzle spreads over the entire spraying region. Therefore, the spraying region can be entirely covered with the protection liquid film even if the protection liquid is supplied at a lower flow rate to the substrate from the second protection liquid nozzle.

The spouting controlling unit may be configured to stop spouting the protection liquid from the second protection liquid nozzle when the spraying region is moved from the upper surface peripheral portion of the substrate to the upper surface center portion of the substrate and, in synchronism with the stop of the spouting of the protection liquid from the second protection liquid nozzle, start spouting the protection liquid from the first protection liquid nozzle. The spouting controlling unit may be further configured to stop spouting the protection liquid from the first protection liquid nozzle when the spraying region is moved from the upper surface center portion of the substrate to the upper surface peripheral portion of the substrate and, in synchronism with the stop of the spouting of the protection liquid from the first protection liquid nozzle, start spouting the protection liquid from the second protection liquid nozzle.

With this arrangement, the protection liquid nozzle spouting the protection liquid is switched from the second protection liquid nozzle to the first protection liquid nozzle when the spraying region is moved from the upper surface peripheral portion of the substrate toward the upper surface center portion of the substrate. Further, the protection liquid nozzle spouting the protection liquid is switched from the first protection liquid nozzle to the second protection liquid nozzle when the spraying region is moved from the upper surface center portion of the substrate toward the upper surface peripheral portion of the substrate. Thus, the protection liquid is supplied to the substrate only from the second protection liquid nozzle when the spraying region is located around the upper surface peripheral portion of the substrate, and supplied to the substrate only from the first protection liquid nozzle when the spraying region is located around the upper surface center portion of the substrate. Therefore, the spraying region can be entirely covered with the protection liquid film even if the protection liquid is supplied at a lower flow rate to the substrate.

Further, the spouting controlling unit may be configured to stop spouting the protection liquid from the second protection liquid nozzle when the spraying region is moved from the upper surface peripheral portion of the substrate to the upper surface center portion of the substrate and start spouting the protection liquid from the first protection liquid nozzle prior to the stop of the spouting of the protection liquid from the second protection liquid nozzle. The spouting controlling unit may be further configured to stop spouting the protection liquid from the first protection liquid nozzle when the spraying region is moved from the upper surface center portion of the substrate to the upper surface peripheral portion of the substrate and start spouting the protection liquid from the second protection liquid nozzle prior to the stop of the spouting of the protection liquid from the first protection liquid nozzle.

With this arrangement, the protection liquid nozzle spouting the protection liquid is switched from the second protection liquid nozzle to the first protection liquid nozzle when the spraying region is moved from the upper surface peripheral portion of the substrate toward the upper surface center portion of the substrate. Further, the protection liquid nozzle spouting the protection liquid is switched from the first protection liquid nozzle to the second protection liquid nozzle when the spraying region is moved from the upper surface center portion of the substrate toward the upper surface peripheral portion of the substrate. Thus, the protection liquid is supplied to the substrate only from the second protection liquid nozzle when the spraying region is located around the upper surface peripheral portion of the substrate, and supplied to the substrate only from the first protection liquid nozzle when the spraying region is located around the upper surface center portion of the substrate. Therefore, the spraying region can be entirely covered with the protection liquid film even if the protection liquid is supplied at a lower flow rate to the substrate.

However, if an attempt is made to simultaneously effect the stop of the spouting of the protection liquid from the second protection liquid nozzle and the start of the spouting of the protection liquid from the first protection liquid nozzle but the stop of the spouting from the second protection liquid nozzle is earlier than the start of the spouting from the first protection liquid nozzle, there is a possibility that the protection liquid is spouted from neither the first protection liquid nozzle nor the second protection liquid nozzle for a certain period of time. During this period, the upper surface of the substrate is not protected with the protection liquid, resulting in the possibility of the damage of the substrate.

Where the stop of the spouting of the protection liquid from the first protection liquid nozzle and the start of the spouting of the protection liquid from the second protection liquid nozzle are simultaneously effected, a similar problem may arise.

In the present invention, in contrast, the spouting of the protection liquid from the first protection liquid nozzle is started prior to the stop of the spouting of the protection liquid from the second protection liquid nozzle, and the spouting of the protection liquid from the second protection liquid nozzle is started prior to the stop of the spouting of the protection liquid from the first protection liquid nozzle. In other words, the period of spouting the protection liquid from the first protection liquid nozzle and the period of spouting the protection liquid from the second protection liquid nozzle are partly overlapped. Thus, the protection liquid is spouted simultaneously from the first and second protection liquid nozzles for a certain period of time when the protection liquid nozzle spouting the protection liquid is switched between the first protection liquid nozzle and the second protection liquid nozzle. This reliably prevents the protection liquid from being spouted from neither the first protection liquid nozzle nor the second protection liquid nozzle when the protection liquid nozzle spouting the protection liquid is switched.

The substrate treatment apparatus may further include a first protection liquid supply pipe which supplies the protection liquid to the first protection liquid nozzle, a first protection liquid valve provided in the first protection liquid supply pipe to switch on and off the supply of the protection liquid to the first protection liquid nozzle, a second protection liquid supply pipe which supplies the protection liquid to the second protection liquid nozzle, and a second protection liquid valve provided in the second protection liquid supply pipe to switch on and off the supply of the protection liquid to the second protection liquid nozzle. The spouting controlling unit may be configured to close the second protection liquid valve when the spraying region is moved from the upper surface peripheral portion of the substrate to the upper surface center portion of the substrate, and open the first protection liquid valve prior to the closing of the second protection liquid valve. Further, the spouting controlling unit may be configured to close the first protection liquid valve when the spraying region is moved from the upper surface center portion of the substrate to the upper surface peripheral portion of the substrate, and open the second protection liquid valve prior to the closing of the first protection liquid valve.

According to another embodiment of the inventive aspect, the protection liquid nozzle is a single protection liquid nozzle, and the change controlling unit includes a position/attitude controlling unit which, when the spraying region is located on the upper surface center portion of the substrate, controls the position and the attitude of the protection liquid nozzle relative to the liquid droplet nozzle in a first position/attitude condition such that the protection liquid spouted from the protection liquid nozzle spreads over the entire spraying region located on the upper surface center portion of the substrate and, when the spraying region is located on the upper surface peripheral portion of the substrate, controls the position and the attitude of the protection liquid nozzle relative to the liquid droplet nozzle in a second position/attitude condition such that the protection liquid spouted from the protection liquid nozzle spreads over the entire spraying region located on the upper surface peripheral portion of the substrate.

With this arrangement, the position and the attitude of the protection liquid nozzle relative to the liquid droplet nozzle is controlled in the first position/attitude condition when the spraying region is located on the upper surface center portion of the substrate. The first position/attitude condition is such that, with the spraying region located on the upper surface center portion of the substrate, the protection liquid spouted from the protection liquid nozzle spreads over the entire spraying region. Therefore, the spraying region can be entirely covered with the protection liquid film even if the protection liquid is supplied at a lower flow rate to the substrate from the protection liquid nozzle controlled in the first position/attitude condition.

Further, the position and the attitude of the protection liquid nozzle relative to the liquid droplet nozzle is controlled in the second position/attitude condition when the spraying region is located on the upper surface peripheral portion of the substrate. The second position/attitude condition is such that, with the spraying region located on the upper surface peripheral portion of the substrate, the protection liquid spouted from the protection liquid nozzle spreads over the entire spraying region. Therefore, the spraying region can be entirely covered with the protection liquid film even if the protection liquid is supplied at a lower flow rate to the substrate from the protection liquid nozzle controlled in the second position/attitude condition.

According to a second inventive aspect, there is provided a substrate treatment method, which includes: a substrate holding step of horizontally holding a substrate; a rotating step of rotating the held substrate about a vertical rotation axis; a liquid droplet supplying step of spraying droplets of a treatment liquid from a liquid droplet nozzle to a spraying region on an upper surface of the held substrate; a protection liquid spouting step of spouting a protection liquid from a protection liquid nozzle to the upper surface of the held substrate to form a liquid film of the protection liquid on the upper surface of the held substrate so that, with the spraying region covered with the protection liquid film, the treatment liquid droplets impinge on the spraying region; a nozzle moving step of, while maintaining the liquid droplet nozzle and the protection liquid nozzle in predetermined positional relation, moving the liquid droplet nozzle and the protection liquid nozzle so as to move the spraying region between an upper surface center portion of the substrate and an upper surface peripheral portion of the substrate; and a changing step of, simultaneously with the nozzle moving step, changing at least one of a protection liquid application position relative to the liquid droplet nozzle and a protection liquid incident angle relative to the liquid droplet nozzle according to the position of the spraying region on the upper surface of the substrate, the protection liquid application position being a liquid application position at which the protection liquid spouted from the protection liquid nozzle is applied on the upper surface of the substrate, the protection liquid incident angle being an incident angle at which the protection liquid spouted from the protection liquid nozzle is incident on the liquid application position; wherein the liquid application position and the incident angle are controlled in a first condition when the spraying region is located on the upper surface center portion of the substrate, and controlled in a second condition different from the first condition when the spraying region is located on the upper surface peripheral portion of the substrate.

In this method, the liquid application position and the incident angle of the protection liquid to be spouted from the protection liquid nozzle are changed according to the position of the spraying region on the upper surface of the substrate. More specifically, the liquid application position and the incident angle are controlled in the first condition when the spraying region is located on the upper surface center portion of the substrate, and controlled in the second condition when the spraying region is located on the upper surface peripheral portion of the substrate.

The first condition may be such that, with the spraying region located on the upper surface center portion of the substrate, the protection liquid spouted from the protection liquid nozzle spreads over the entire spraying region. The second condition may be such that, with the spraying region located on the upper surface peripheral portion of the substrate, the protection liquid spouted from the protection liquid nozzle spreads over the entire spraying region.

More specifically, it is preferred that the first condition is optimized for a state in which the spraying region is located on the upper surface center portion of the substrate, and the second condition is optimized for a state in which the spraying region is located on the upper surface peripheral portion of the substrate. In this case, the spraying region can be entirely covered with the protection liquid film even if the protection liquid is supplied at a lower flow rate to the substrate from the protection liquid nozzle located above the upper surface center portion of the substrate. Further, the spraying region can be entirely covered with the protection liquid film even if the protection liquid is supplied at a lower flow rate to the substrate from the protection liquid nozzle located above the upper surface peripheral portion of the substrate.

As a result, the spraying region can be entirely covered with the protection liquid film by supplying the protection liquid at a lower flow rate to the substrate irrespective of the position of the spraying region on the upper surface of the substrate. Thus, the damage of the substrate can be suppressed without increasing the flow rate of the protection liquid to be supplied to the substrate.

According to an embodiment of the inventive aspect, the protection liquid nozzle may include a first protection liquid nozzle and a second protection liquid nozzle. The position and the attitude of the first protection liquid nozzle relative to the liquid droplet nozzle may be such that, with the spraying region located on the upper surface center portion of the substrate, the protection liquid spouted from the first protection liquid nozzle spreads over the entire spraying region. The position and the attitude of the second protection liquid nozzle relative to the liquid droplet nozzle may be such that, with the spraying region located on the upper surface peripheral portion of the substrate, the protection liquid spouted from the second protection liquid nozzle spreads over the entire spraying region. In this case, the changing step may include a spouting switching step of spouting the protection liquid only from the first protection liquid nozzle without spouting the protection liquid from the second protection liquid nozzle when the spraying region is located on the upper surface center portion of the substrate, and spouting the protection liquid only from the second protection liquid nozzle without spouting the protection liquid from the first protection liquid nozzle when the spraying region is located on the upper surface peripheral portion of the substrate.

In this method, the protection liquid is spouted only from the first protection liquid nozzle when the spraying region is located on the upper surface center portion of the substrate. The position and the attitude of the first protection liquid nozzle are set such that, with the spraying region located on the upper surface center portion of the substrate, the protection liquid spouted from the first protection liquid nozzle spreads over the entire spraying region. Therefore, the spraying region can be entirely covered with the protection liquid film even if the protection liquid is supplied at a lower flow rate to the substrate from the first protection liquid nozzle.

Further, the protection liquid is spouted only from the second protection liquid nozzle when the spraying region is located on the upper surface peripheral portion of the substrate. The position and the attitude of the second protection liquid nozzle are set such that, with the spraying region located on the upper surface peripheral portion of the substrate, the protection liquid spouted from the second protection liquid nozzle spreads over the entire spraying region. Therefore, the spraying region can be entirely covered with the protection liquid film even if the protection liquid is supplied at a lower flow rate to the substrate from the second protection liquid nozzle.

The spouting switching step may include the steps of: stopping spouting the protection liquid from the second protection liquid nozzle when the spraying region is moved from the upper surface peripheral portion of the substrate to the upper surface center portion of the substrate and, in synchronism with the stop of the spouting of the protection liquid from the second protection liquid nozzle, starting spouting the protection liquid from the first protection liquid nozzle; and stopping spouting the protection liquid from the first protection liquid nozzle when the spraying region is moved from the upper surface center portion of the substrate to the upper surface peripheral portion of the substrate and, in synchronism with the stop of the spouting of the protection liquid from the first protection liquid nozzle, starting spouting the protection liquid from the second protection liquid nozzle.

In this method, the protection liquid nozzle spouting the protection liquid is switched from the second protection liquid nozzle to the first protection liquid nozzle when the spraying region is moved from the upper surface peripheral portion of the substrate toward the upper surface center portion of the substrate. Further, the protection liquid nozzle spouting the protection liquid is switched from the first protection liquid nozzle to the second protection liquid nozzle when the spraying region is moved from the upper surface center portion of the substrate toward the upper surface peripheral portion of the substrate. Thus, the protection liquid is supplied to the substrate only from the second protection liquid nozzle when the spraying region is located around the upper surface peripheral portion of the substrate, and supplied to the substrate only from the first protection liquid nozzle when the spraying region is located around the upper surface center portion of the substrate. Therefore, the spraying region can be entirely covered with the protection liquid film even if the protection liquid is supplied at a lower flow rate to the substrate.

Further, the spouting switching step may include the steps of: stopping spouting the protection liquid from the second protection liquid nozzle when the spraying region is moved from the upper surface peripheral portion of the substrate to the upper surface center portion of the substrate, and starting spouting the protection liquid from the first protection liquid nozzle prior to the stop of the spouting of the protection liquid from the second protection liquid nozzle; and stopping spouting the protection liquid from the first protection liquid nozzle when the spraying region is moved from the upper surface center portion of the substrate to the upper surface peripheral portion of the substrate, and starting spouting the protection liquid from the second protection liquid nozzle prior to the stop of the spouting of the protection liquid from the first protection liquid nozzle.

In this method, the protection liquid nozzle spouting the protection liquid is switched from the second protection liquid nozzle to the first protection liquid nozzle when the spraying region is moved from the upper surface peripheral portion of the substrate toward the upper surface center portion of the substrate. Further, the protection liquid nozzle spouting the protection liquid is switched from the first protection liquid nozzle to the second protection liquid nozzle when the spraying region is moved from the upper surface center portion of the substrate toward the upper surface peripheral portion of the substrate. Thus, the protection liquid is supplied to the substrate only from the second protection liquid nozzle when the spraying region is located around the upper surface peripheral portion of the substrate, and supplied to the substrate only from the first protection liquid nozzle when the spraying region is located around the upper surface center portion of the substrate. Therefore, the spraying region can be entirely covered with the protection liquid film even if the protection liquid is supplied at a lower flow rate to the substrate.

However, if an attempt is made to simultaneously effect the stop of the spouting of the protection liquid from the second protection liquid nozzle and the start of the spouting of the protection liquid from the first protection liquid nozzle but the stop of the spouting from the second protection liquid nozzle is earlier than the start of the spouting from the first protection liquid nozzle, there is a possibility that the protection liquid is spouted from neither the first protection liquid nozzle nor the second protection liquid nozzle for a certain period of time. During this period, the upper surface of the substrate is not protected with the protection liquid, resulting in the possibility of the damage of the substrate.

Where the stop of the spouting of the protection liquid from the first protection liquid nozzle and the start of the spouting of the protection liquid from the second protection liquid nozzle are simultaneously effected, a similar problem may arise.

In the present invention, in contrast, the spouting of the protection liquid from the first protection liquid nozzle is started prior to the stop of the spouting of the protection liquid from the second protection liquid nozzle, and the spouting of the protection liquid from the second protection liquid nozzle is started prior to the stop of the spouting of the protection liquid from the first protection liquid nozzle. In other words, the period of spouting the protection liquid from the first protection liquid nozzle and the period of spouting the protection liquid from the second protection liquid nozzle are partly overlapped. Thus, the protection liquid is spouted simultaneously from the first and second protection liquid nozzles for a certain period of time when the protection liquid nozzle spouting the protection liquid is switched between the first protection liquid nozzle and the second protection liquid nozzle. This reliably prevents the protection liquid from being spouted from neither the first protection liquid nozzle nor the second protection liquid nozzle when the protection liquid nozzle spouting the protection liquid is switched.

According to a second embodiment of the inventive aspect, the protection liquid nozzle may include a single protection liquid nozzle. In this case, the changing step may include a position/attitude shifting step of, when the spraying region is located on the upper surface center portion of the substrate, shifting the position and the attitude of the protection liquid nozzle relative to the liquid droplet nozzle into a first position/attitude condition such that the protection liquid spouted from the protection liquid nozzle spreads over the entire spraying region located on the upper surface center portion of the substrate and, when the spraying region is located on the upper surface peripheral portion of the substrate, shifting the position and the attitude of the protection liquid nozzle relative to the liquid droplet nozzle into a second position/attitude condition such that the protection liquid spouted from the protection liquid nozzle spreads over the entire spraying region located on the upper surface peripheral portion of the substrate.

In this method, the position and the attitude of the protection liquid nozzle relative to the liquid droplet nozzle is controlled in the first position/attitude condition when the spraying region is located on the upper surface center portion of the substrate. The first position/attitude condition is such that, with the spraying region located on the upper surface center portion of the substrate, the protection liquid spouted from the protection liquid nozzle spreads over the entire spraying region. Therefore, the spraying region can be entirely covered with the protection liquid film even if the protection liquid is supplied at a lower flow rate to the substrate from the protection liquid nozzle controlled in the first position/attitude condition.

Further, the position and the attitude of the protection liquid nozzle relative to the liquid droplet nozzle is controlled in the second position/attitude condition when the spraying region is located on the upper surface peripheral portion of the substrate. The second position/attitude condition is such that, with the spraying region located on the upper surface peripheral portion of the substrate, the protection liquid spouted from the protection liquid nozzle spreads over the entire spraying region. Therefore, the spraying region can be entirely covered with the protection liquid film even if the protection liquid is supplied at a lower flow rate to the substrate from the protection liquid nozzle controlled in the second position/attitude condition.

According to a third inventive aspect, there is provided a substrate treatment apparatus, which includes: a substrate holding unit which horizontally holds a substrate; a rotation unit which rotates the substrate held by the substrate holding unit about a vertical rotation axis; a liquid droplet nozzle which generates droplets of a treatment liquid to be sprayed to a spraying region on an upper surface of the substrate held by the substrate holding unit; a first protection liquid nozzle which spouts a protection liquid to the upper surface of the substrate; a second protection liquid nozzle which spouts the protection liquid to the upper surface of the substrate; a protection liquid supplying unit which supplies the protection liquid to the first and second protection liquid nozzles; a nozzle moving unit which moves the liquid droplet nozzle and the first and second protection liquid nozzles; a protection liquid spouting controlling unit which controls the protection liquid supplying unit to spout the protection liquid to the upper surface of the substrate from both of the first and second protection liquid nozzles to form a liquid film of the protection liquid on the upper surface of the substrate so that, with the spraying region covered with the protection liquid film, the treatment liquid droplets impinge on the spraying region; and a nozzle movement controlling unit which, while maintaining the liquid droplet nozzle and the first and second protection liquid nozzles in predetermined positional relation with the protection liquid spouted from the first and second protection liquid nozzles, moves the liquid droplet nozzle and the first and second protection liquid nozzles so as to move the spraying region between an upper surface center portion of the substrate and an upper surface peripheral portion of the substrate; wherein the position and the attitude of the first protection liquid nozzle relative to the liquid droplet nozzle are set in a first position/attitude condition such that a liquid application state defined for the first protection liquid nozzle relative to the liquid droplet nozzle by at least one of a liquid application position at which the protection liquid spouted from the first protection liquid nozzle is applied on the upper surface of the substrate and an incident angle at which the protection liquid spouted from the first protection liquid nozzle is incident on the liquid application position for the first protection liquid nozzle is a first liquid application state; wherein the position and the attitude of the second protection liquid nozzle relative to the liquid droplet nozzle are set in a second position/attitude condition such that a liquid application state defined for the second protection liquid nozzle relative to the liquid droplet nozzle by at least one of a liquid application position at which the protection liquid spouted from the second protection liquid nozzle is applied on the upper surface of the substrate and an incident angle at which the protection liquid spouted from the second protection liquid nozzle is incident on the liquid application position for the second protection liquid nozzle is a second liquid application state different from the first liquid application state.

With this arrangement, the protection liquid is spouted from both the first protection liquid nozzle set in the first position/attitude condition and the second protection liquid nozzle set in the second position/attitude condition. While the protection liquid is spouted from the first and second protection liquid nozzles, the spraying region is moved between the upper surface center portion of the substrate and the upper surface peripheral portion of the substrate.

The liquid application state (defined by at least one of the liquid application position and the incident angle) of the protection liquid spouted from the first protection liquid nozzle set in the first position/attitude condition is the first liquid application state, and the liquid application state of the protection liquid spouted from the second protection liquid nozzle set in the second position/attitude condition is the second liquid application state different from the first liquid application state.

In this case, the first position/attitude condition of the first protection liquid nozzle and the second position/attitude condition of the second protection liquid nozzle (i.e., the first and second liquid application states) may be respectively defined based on states in which the spraying region is located at two different positions on the upper surface of the substrate.

Therefore, the protection liquid can be efficiently supplied to the spraying region irrespective of the position of the spraying region on the upper surface of the substrate. As a result, the spraying region can be entirely covered with the protection liquid film without supplying a greater amount of the protection liquid. Thus, the damage of the substrate can be suppressed without increasing the total flow rate of the protection liquid to be supplied to the substrate.

The first position/attitude condition may be such that, with the spraying region located on the upper surface center portion of the substrate, the protection liquid spouted from the first protection liquid nozzle spreads over the entire spraying region. The second condition may be such that, with the spraying region located on the upper surface peripheral portion of the substrate, the protection liquid spouted from the second protection liquid nozzle spreads over the entire spraying region.

More specifically, it is preferred that the first liquid application state is optimized for a state in which the spraying region is located on the upper surface center portion of the substrate, and the second liquid application state is optimized for a state in which the spraying region is located on the upper surface peripheral portion of the substrate. In this case, the spraying region can be entirely covered with the protection liquid film even if the protection liquid is supplied at lower flow rates from the protection liquid nozzles located above the upper surface center portion of the substrate. Further, the spraying region can be entirely covered with the protection liquid film even if the protection liquid is supplied at lower flow rates from the protection liquid nozzles located above the upper surface peripheral portion of the substrate.

As a result, the spraying region can be entirely covered with the protection liquid film by supplying the protection liquid at a lower total flow rate to the substrate irrespective of the position of the spraying region on the upper surface of the substrate. Thus, the damage of the substrate can be suppressed without increasing the total flow rate of the protection liquid to be supplied to the substrate.

According to an embodiment of the inventive aspect, the protection liquid spouting controlling unit controls the protection liquid supplying unit to spout the protection liquid at predetermined spouting flow rates from the first and second protection liquid nozzles irrespective of the position of the spraying region on the upper surface of the substrate.

In this embodiment, the protection liquid supplying unit may include a flow rate regulating unit which regulates flow rates of the protection liquid to be supplied to the first and second protection liquid nozzles. Further, the protection liquid spouting controlling unit may include a spouting flow rate controlling unit which controls the flow rate regulating unit, and the spouting flow rate controlling unit may be adapted to change the spouting flow rates of the protection liquid to be spouted from the first and second protection liquid nozzles according to the position of the spraying region on the upper surface of the substrate.

With this arrangement, the spouting flow rates of the protection liquid to be spouted from the first and second protection liquid nozzles can be reduced when the spraying region is located on the upper surface center portion of the substrate and on the upper surface peripheral portion of the substrate. This makes it possible to further reduce the total flow rate of the protection liquid to be supplied to the substrate while suppressing the damage of the substrate.

In this case, the spouting flow rate controlling unit may be adapted to set the spouting flow rates of the protection liquid to be spouted from the first and second protection liquid nozzles at higher flow rate levels when the spraying region is located on the upper surface peripheral portion of the substrate than when the spraying region is located on the upper surface center portion of the substrate.

Further, the spouting flow rates of the protection liquid to be spouted from the first and second protection liquid nozzles may be set so as to satisfy a flow rate ratio of 1:1.

According to a fourth inventive aspect, there is provided a substrate treatment method, which includes: a substrate holding step of horizontally holding a substrate; a first position/attitude setting step of setting a first protection liquid nozzle in a first position/attitude condition such that a liquid application state defined for the first protection liquid nozzle relative to a liquid droplet nozzle by at least one of a liquid application position at which a protection liquid spouted from the first protection liquid nozzle is applied on an upper surface of the substrate and an incident angle at which the protection liquid spouted from the first protection liquid nozzle is incident on the liquid application position for the first protection liquid nozzle is a first liquid application state; a second position/attitude setting step of setting a second protection liquid nozzle in a second position/attitude condition such that a liquid application state defined for the second protection liquid nozzle relative to the liquid droplet nozzle by at least one of a liquid application position at which a protection liquid spouted from the second protection liquid nozzle is applied on the upper surface of the substrate and an incident angle at which the protection liquid spouted from the second protection liquid nozzle is incident on the liquid application position for the second protection liquid nozzle is a second liquid application state different from the first liquid application state; a rotating step of rotating the held substrate about a vertical rotation axis; a liquid droplet supplying step of spraying droplets of a treatment liquid from the liquid droplet nozzle to a spraying region on the upper surface of the held substrate; a protection liquid spouting step of spouting the protection liquid to the upper surface of the held substrate from both of the first and second protection liquid nozzles to form a liquid film of the protection liquid on the upper surface of the held substrate so that, with the spraying region covered with the protection liquid film, the treatment liquid droplets impinge on the spraying region; and a nozzle moving step of, while maintaining the liquid droplet nozzle and the first and second protection liquid nozzles in predetermined positional relation with the protection liquid spouted from the first and second protection liquid nozzles, moving the liquid droplet nozzle and the first and second protection liquid nozzles so as to move the spraying region between an upper surface center portion of the substrate and an upper surface peripheral portion of the substrate.

In this method, the protection liquid is spouted from both the first protection liquid nozzle set in the first position/attitude condition and the second protection liquid nozzle set in the second position/attitude condition. While the protection liquid is spouted from the first and second protection liquid nozzles, the spraying region is moved between the upper surface center portion of the substrate and the upper surface peripheral portion of the substrate.

The liquid application state (defined by at least one of the liquid application position and the incident angle) of the protection liquid spouted from the first protection liquid nozzle set in the first position/attitude condition is the first liquid application state, and the liquid application state of the protection liquid spouted from the second protection liquid nozzle set in the second position/attitude condition is the second liquid application state different from the first liquid application state.

In this case, the first position/attitude condition of the first protection liquid nozzle and the second position/attitude condition of the second protection liquid nozzle (i.e., the first and second liquid application states) may be defined based on states in which the spraying region is located at two different positions on the upper surface of the substrate.

Therefore, the protection liquid can be efficiently supplied to the spraying region irrespective of the position of the spraying region on the upper surface of the substrate. As a result, the spraying region can be entirely covered with the protection liquid film without supplying a greater amount of the protection liquid. Thus, the damage of the substrate can be suppressed without increasing the total flow rate of the protection liquid to be supplied to the substrate.

The first position/attitude condition may be such that, with the spraying region located on the upper surface center portion of the substrate, the protection liquid spouted from the first protection liquid nozzle spreads over the entire spraying region. The second position/attitude condition may be such that, with the spraying region located on the upper surface peripheral portion of the substrate, the protection liquid spouted from the second protection liquid nozzle spreads over the entire spraying region.

According to an embodiment of the inventive aspect, the protection liquid spouting step includes the step of spouting the protection liquid at predetermined spouting flow rates from the first and second protection liquid nozzles irrespective of the position of the spraying region on the upper surface of the substrate.

According to another embodiment of the inventive aspect, the spouting flow rates of the protection liquid to be spouted from the first and second protection liquid nozzles may be changed according to the position of the spraying region on the upper surface of the substrate in the protection liquid spouting step. In this method, the spouting flow rates of the protection liquid to be spouted from the first and second protection liquid nozzles can be reduced when the spraying region is located on the upper surface center portion of the substrate and on the upper surface peripheral portion of the substrate. This makes it possible to further reduce the total flow rate of the protection liquid to be supplied to the substrate while suppressing the damage of the substrate.

In this case, the spouting flow rates of the protection liquid to be spouted from the first and second protection liquid nozzles may be set at higher flow rate levels when the spraying region is located on the upper surface peripheral portion of the substrate than when the spraying region is located on the upper surface center portion of the substrate in the protection liquid spouting step.

The foregoing and other objects, features and effects of the present invention will become more apparent from the following detailed description of the preferred embodiments with reference to the attached drawings.

BRIEF DESCRIPTION OF THE DRAWINGS

FIGS. 7A to 7E are diagrams for explaining a first exemplary treatment process to be performed by the substrate treatment apparatus shown in FIG. 1.

FIG. 9 is a timing chart showing the opening/closing operation of first and second protection liquid valves to be performed when spraying regions are moved from an upper surface peripheral portion to an upper surface center portion of a substrate.

FIG. 10 is a timing chart showing the opening/closing operation of the first and second protection liquid valves to be performed when the spraying regions are moved from the upper surface center portion to the upper surface peripheral portion of the substrate.

FIGS. 12A to 12L are diagrams for explaining a second exemplary treatment process to be performed on the substrate by the substrate treatment apparatus shown in FIG. 1.

FIG. 13 is a timing chart showing the opening/closing operation of the first and second protection liquid valves to be performed when the spraying regions are moved from the upper surface peripheral portion toward the upper surface center portion of the substrate.

FIG. 14 is a timing chart showing the opening/closing operation of the first and second protection liquid valves to be performed when the spraying regions are moved from the upper surface center portion toward the upper surface peripheral portion of the substrate.

DETAILED DESCRIPTION OF PREFERRED EMBODIMENTS

Figure 1:
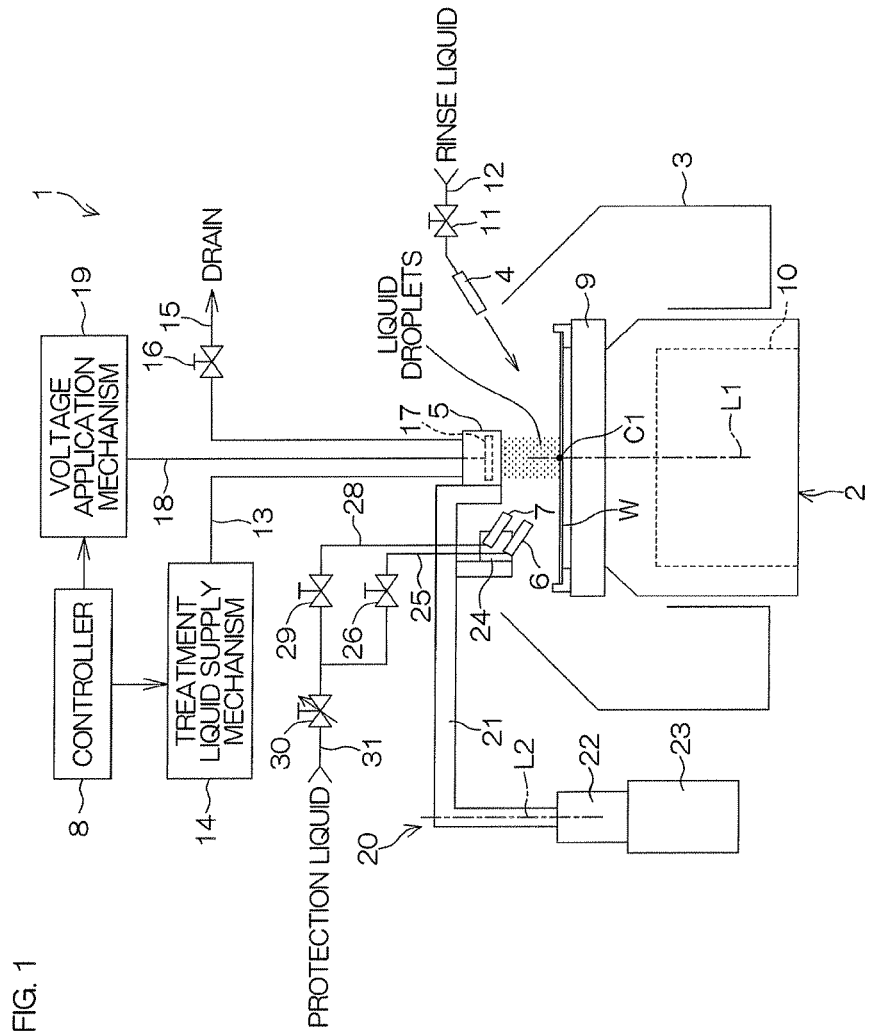
FIG. 1 is a diagram schematically showing the construction of a substrate treatment apparatus according to a first embodiment of the present invention.
Figure 2:
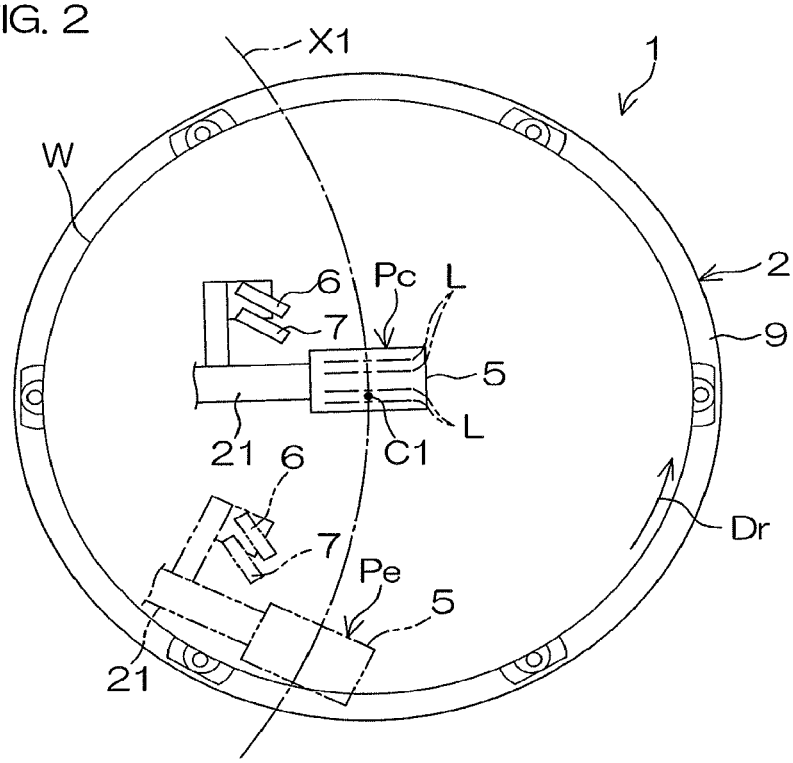
FIG. 2 is a plan view showing a liquid droplet nozzle shown in FIG. 1 and an arrangement related to the liquid droplet nozzle.

FIG. 1 is a diagram schematically showing the construction of a substrate treatment apparatus 1 according to a first embodiment of the present invention. FIG. 2 is a plan view showing a liquid droplet nozzle 5 and an arrangement related to the liquid droplet nozzle.

The substrate treatment apparatus 1 is of a single substrate treatment type adapted to treat a single disk-shaped substrate W (e.g., semiconductor wafer) at a time. The substrate treatment apparatus 1 includes a spin chuck 2 (substrate holding unit) which horizontally holds and rotates the substrate W, a tubular cup 3 which surrounds the spin chuck 2, a rinse liquid nozzle 4 which supplies a rinse liquid to the substrate W, a liquid droplet nozzle 5 which causes droplets of a treatment liquid to impinge on the substrate W, a first protection liquid nozzle 6 which supplies the protection liquid to the substrate W, a second protection liquid nozzle 7 which supplies the protection liquid to the substrate W, and a controller 8 which controls the operations of the spin chuck and other devices provided in the substrate treatment apparatus 1 and the opening/closing operation of valves.

The spin chuck 2 includes a spin base 9 which is rotatable about a vertical rotation axis L1 extending through a rotation center C1 of the substrate W while horizontally holding the substrate W, and a spin motor (rotation unit) 10 which rotates the spin base 9 about the rotation axis L1. The spin chuck 2 may be of a clamping type which is adapted to horizontally clamp the substrate W to horizontally hold the substrate W, or may be of a vacuum type which is adapted to suck a back surface (lower surface which is a non-device-formation surface) of the substrate W to horizontally hold the substrate W. In the substrate treatment apparatus 1, the spin chuck 2 is of the clamping type.

The rinse liquid nozzle 4 is connected to a rinse liquid supply pipe 12 in which a rinse liquid valve 11 is provided. With the rinse liquid valve 11 open, the rinse liquid is spouted from the rinse liquid nozzle 4 toward a center portion of an upper surface of the substrate W. With the rinse liquid valve 11 closed, on the other hand, the supply of the rinse liquid from the rinse liquid nozzle 4 is stopped. Examples of the rinse liquid to be supplied from the rinse liquid nozzle 4 include pure water (deionized water), carbonated water, electrolytic ion water, hydrogen water, ozone water and a hydrochloric acid aqueous solution having a dilute concentration (e.g., about 10 to about 100 ppm).

The liquid droplet nozzle 5 is an ink jet type nozzle which spouts a multiplicity of liquid droplets through an ink jet process. The liquid droplet nozzle 5 is connected to a treatment liquid supply mechanism 14 through a treatment liquid supply pipe 13. The liquid droplet nozzle 5 is further connected to a treatment liquid drain pipe 15 in which a drain valve 16 is provided. The treatment liquid supply mechanism 14 includes, for example, a pump. The treatment liquid supply mechanism 14 constantly supplies the treatment liquid to the liquid droplet nozzle 5 at a predetermined pressure (e.g., not higher than 10 MPa). Examples of the treatment liquid to be supplied to the liquid droplet nozzle 5 include chemical liquids such as SC-1 (a liquid mixture containing $NH_4OH$ and $H_2O_2$), pure water and carbonated water. The controller 8 controls the treatment liquid supply mechanism 14 to change the pressure of the treatment liquid to be supplied to the liquid droplet nozzle 5 at a desired pressure level.

As shown in FIG. 1, the liquid droplet nozzle 5 includes a piezo element 17 disposed therein. The piezo element 17 is connected to a voltage application mechanism 19 via a wiring 18. The voltage application mechanism 19 includes, for example, an invertor. The voltage application mechanism 19 applies an AC voltage to the piezo element 17. With the AC voltage applied to the piezo element 17, the piezo element 17 is oscillated at a frequency corresponding to the frequency of the applied AC voltage. The controller 8 controls the voltage application mechanism 19 to change the frequency of the AC voltage to be applied to the piezo element 17 at a desired frequency level (e.g., several hundreds KHz to several MHz). Therefore, the frequency of the oscillation of the piezo element 17 is controlled by the controller 8.

The substrate treatment apparatus 1 further includes a nozzle movement mechanism 20 (nozzle moving unit). The nozzle movement mechanism 20 includes a nozzle arm 21 which retains the liquid droplet nozzle 5 at its distal end, a pivot mechanism 22 connected to the nozzle arm 21, and a lift mechanism 23 connected to the pivot mechanism 22. The pivot mechanism 22 includes, for example, a motor. The lift mechanism 23 includes, for example, a ball screw mechanism and a motor which drives the ball screw mechanism. The pivot mechanism 22 pivots the nozzle arm 21 about a vertical pivot axis L2 provided on a lateral side of the spin chuck 2. The liquid droplet nozzle 5 is pivoted together with the nozzle arm 21 about the pivot axis L2. Thus, the liquid droplet nozzle 5 is horizontally moved. On the other hand, the lift mechanism 23 vertically moves up and down the pivot mechanism 22. The liquid droplet nozzle 5 and the nozzle arm 21 are vertically moved up and down together with the pivot mechanism 22. Thus, the liquid droplet nozzle 5 is vertically moved.

The pivot mechanism 22 horizontally moves the liquid droplet nozzle 5 within a horizontal plane above the spin chuck 2. As shown in FIG. 2, the pivot mechanism 22 horizontally moves the liquid droplet nozzle 5 along an arcuate path X1 extending along the upper surface of the substrate W held by the spin chuck 2. The path X1 is a curved line connecting two different positions defined outside the upper surface of the substrate W and extending through the rotation center C1 of the upper surface of the substrate W as seen vertically in a direction perpendicular to the upper surface of the substrate W held by the spin chuck 2. The lift mechanism 23 moves down the liquid droplet nozzle 5 from above the substrate W held by the spin chuck 2, whereby the liquid droplet nozzle 5 is located adjacent the upper surface of the substrate W. When the treatment liquid droplets are caused to impinge on the substrate W, the controller 8 controls the pivot mechanism 22 to horizontally move the liquid droplet nozzle 5 along the path X1 while locating the liquid droplet nozzle 5 adjacent the upper surface of the substrate W.

As shown in FIG. 1, the first protection liquid nozzle 6 and the second protection liquid nozzle 7 are held by a nozzle holder 24 attached to the nozzle arm 21. When the nozzle arm 21 is moved by at least one of the pivot mechanism 22 and the lift mechanism 23, the liquid droplet nozzle 5 and the first and second protection liquid nozzles 6, 7 are moved while being maintained in predetermined positional relation. When the pivot mechanism 22 pivots the nozzle arm 21, therefore, the first and second protection liquid nozzles 6, 7 are horizontally moved together with the liquid droplet nozzle 5 along the path X1.

The first protection liquid nozzle 6 is connected to a first protection liquid supply pipe 25. The second protection liquid nozzle 7 is connected to a second protection liquid supply pipe 28. A first protection liquid valve (protection liquid supplying unit) 26 is provided in the first protection liquid supply pipe 25. A second protection liquid valve (protection liquid supplying unit) 29 is provided in the second protection liquid supply pipe 28. The first and second protection liquid supply pipes 25, 28 are connected together to a protection liquid supply main pipe 31 connected to a protection liquid supply source. A flow rate regulating valve (protection liquid supplying unit) 30 is provided in the protection liquid supply main pipe 31.

When the first protection liquid valve 26 is opened with the second protection liquid valve 29 closed, the protection liquid is spouted only from the first protection liquid nozzle 6 toward the upper surface of the substrate W.

When the second protection liquid valve 29 is opened with the first protection liquid valve 26 closed, the protection liquid is spouted only from the second protection liquid nozzle 7 toward the upper surface of the substrate W.

When the first and second protection liquid valves 26, 29 are both opened, the protection liquid is spouted from both of the first and second protection liquid nozzles 6, 7 toward the upper surface of the substrate W. At this time, the spouting flow rate of the protection liquid to be spouted from the first protection liquid nozzle 6 is equal to the spouting flow rate of the protection liquid to be spouted from the second protection liquid nozzle 7. The spouting flow rates of the protection liquid to be respectively spouted from the first and second protection liquid nozzles 6 and 7 are each one half the spouting flow rate of the protection liquid spouted from only one of the first and second protection liquid nozzles 6, 7.

The spouting flow rate of the protection liquid to be spouted from the first protection liquid nozzle 6 and the spouting flow rate of the protection liquid to be spouted from the second protection liquid nozzle 7 can be changed by controlling the opening degree of the flow rate regulating valve 30 by the controller 8.

Examples of the protection liquid to be supplied to the first and second protection liquid nozzles 6, 7 include chemical liquids such as SC-1 and a rinse liquid.

Figure 3:
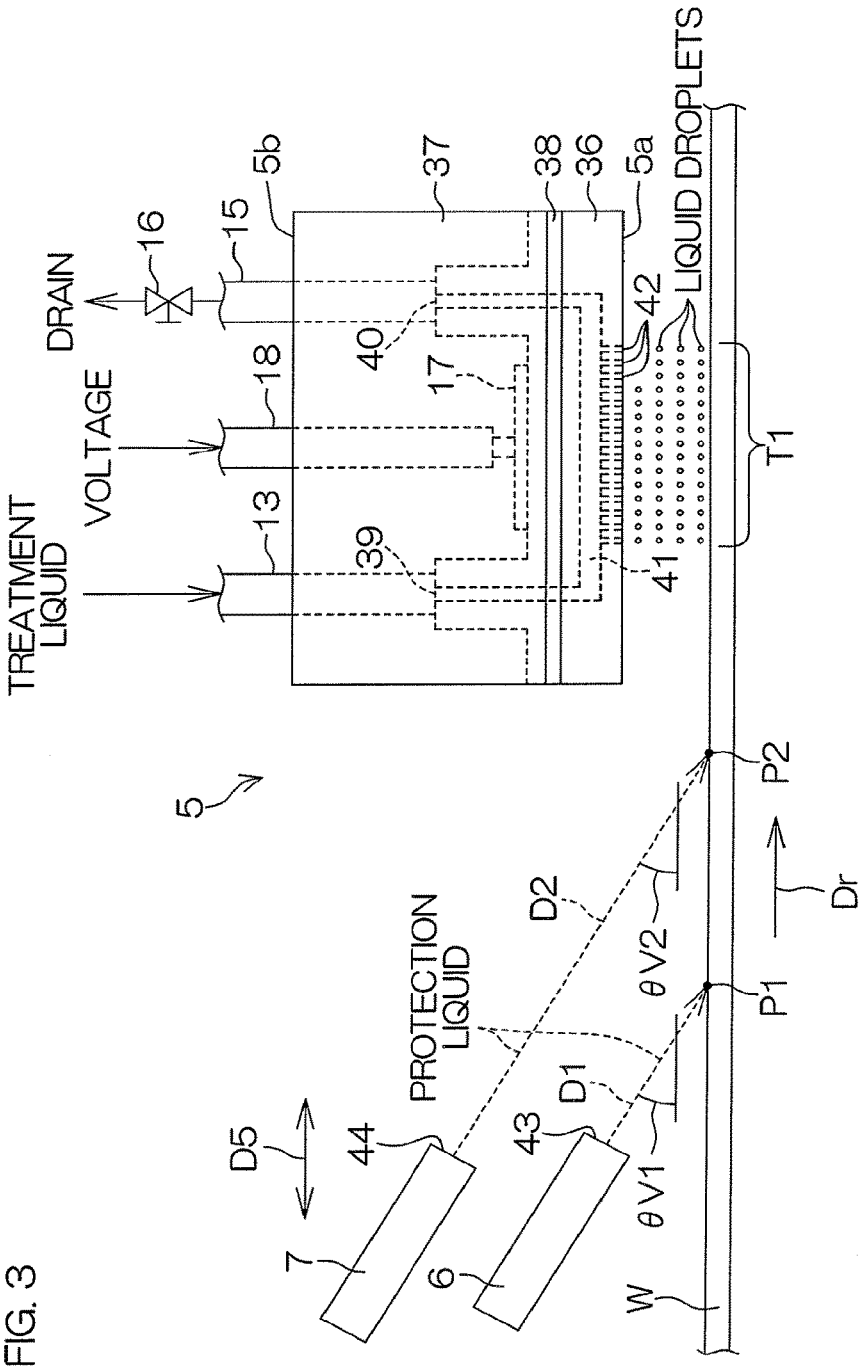
FIG. 3 is a schematic side view of the liquid droplet nozzle and first and second protection liquid nozzles shown in FIG. 1.
Figure 4:
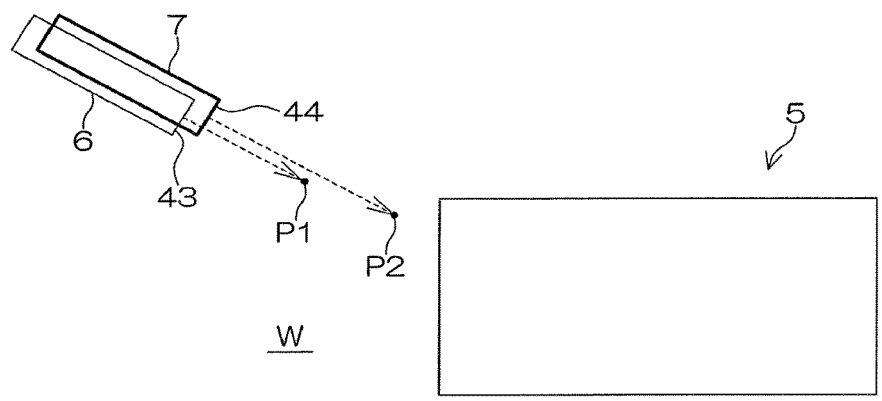
FIG. 4 is a schematic plan view of the liquid droplet nozzle and the first and second protection liquid nozzles shown in FIG. 1.
Figure 5:
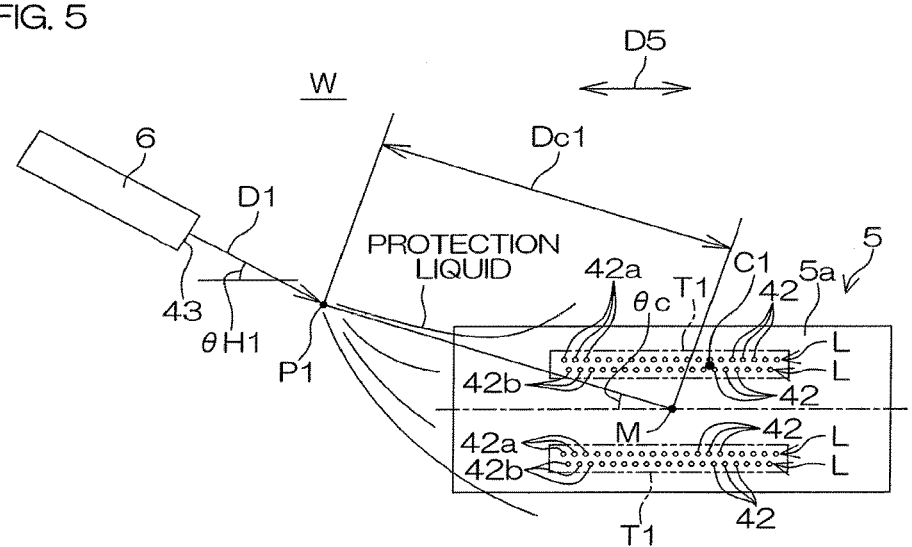
FIG. 5 is a schematic plan view showing a positional relationship between the liquid droplet nozzle and the first protection liquid nozzle shown in FIG. 1.
Figure 6:
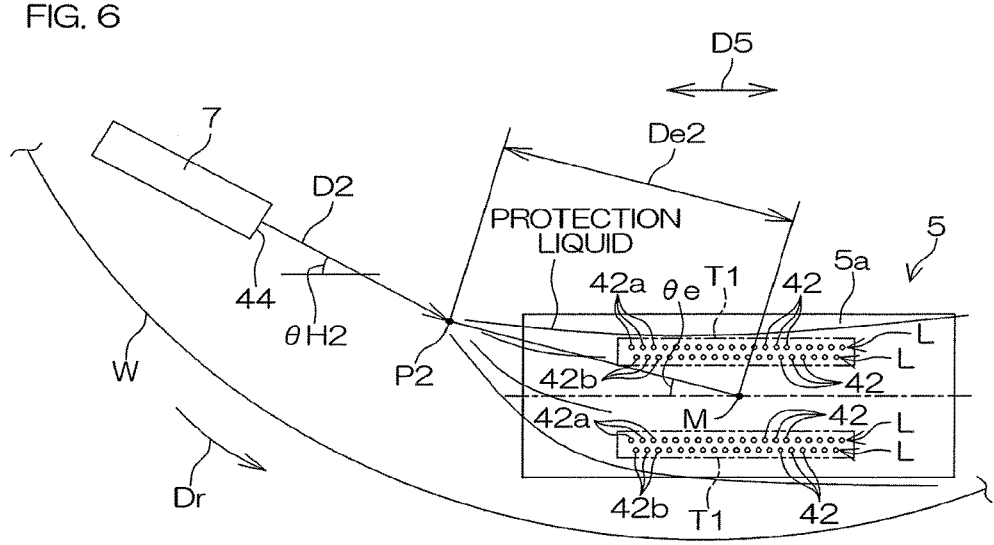
FIG. 6 is a schematic plan view showing a positional relationship between the liquid droplet nozzle and the second protection liquid nozzle shown in FIG. 1.

FIG. 3 is a schematic side view of the liquid droplet nozzle 5 and the first and second protection liquid nozzles 6, 7. FIG. 4 is a schematic plan view of the liquid droplet nozzle 5 and the first and second protection liquid nozzles 6, 7. FIG. 5 is a schematic plan view showing a positional relationship between the liquid droplet nozzle 5 and the first protection liquid nozzle 6. FIG. 6 is a schematic plan view showing a positional relationship between the liquid droplet nozzle 5 and the second protection liquid nozzle 7. In FIG. 4, the liquid droplet nozzle 5 is shown only by its upper surface 5b. In FIGS. 5 and 6, the liquid droplet nozzle 5 is shown only by its lower surface 5a (opposed surface). For convenience of drawing, spraying regions T1 to be described later are located on the upper surface center portion of the substrate W in FIG. 5, and located on the upper surface peripheral portion of the substrate W in FIG. 6. The liquid droplet nozzle 5 and the first and second protection liquid nozzles 6, 7 will hereinafter be described. First, the liquid droplet nozzle 5 will be described.

As shown in FIG. 3, the liquid droplet nozzle 5 includes a main body 36 which spouts the treatment liquid droplets, a cover 37 which covers the main body 36 and the piezo element 17, and a seal 38 provided between the main body 36 and the cover 37. The main body 36 and the cover 37 are each made of a chemical-resistant material. The main body 36 is made of, for example, quartz. The cover 37 is made of, for example, a fluororesin. The seal 38 is made of, for example, an elastic material such as EPDM (ethylene-propylene-diene rubber). The main body 36 is pressure-resistant. A part of the main body 36 and the piezo element 17 are accommodated in the cover 37. An end of the wiring 18 is connected to the piezo element 17 in the cover 37 by solder. The inside of the cover 37 is sealed with the seal 38.

As shown in FIG. 3, the main body 36 includes a supply port 39 to which the treatment liquid is supplied, a drain port 40 which drains the treatment liquid supplied to the supply port 39, a treatment liquid flow passage 41 which connects the supply port 39 to the drain port 40, and a plurality of spray ports 42 connected to the treatment liquid flow passage 41. The treatment liquid flow passage 41 is provided in the main body 36. The supply port 39, the drain port 40 and the spray ports 42 open in surfaces of the main body 36. The supply port 39 and the drain port 40 are located at a higher level than the spray ports 42. The lower surface 5a of the main body 36 is, for example, a horizontal flat surface, and the spray ports 42 open in the lower surface 5a of the main body 36. The spray ports 42 are minute openings each having a diameter of, for example, several μm to several tens μm. The treatment liquid supply pipe 13 and the treatment liquid drain pipe 15 are respectively connected to the supply port 39 and the drain port 40.

As shown in FIGS. 5 and 6, the plurality of spray ports 42 are arranged along a plurality of lines L (e.g., four lines in FIGS. 5 and 6). A plurality of spray ports 42 (e.g., 10 or more spray ports 42) are equidistantly aligned in each of the lines L. The lines L each extend linearly horizontally in a longitudinal direction D5. The lines L may each be curved rather than linear. The four lines L are parallel to each other. Two of the four lines L are disposed in horizontally closely adjacent relation with respect to a direction perpendicular to the longitudinal direction D5. Similarly, the other two lines L are disposed in horizontally closely adjacent relation with respect to the direction perpendicular to the longitudinal direction D5. The each two adjacent lines L are paired. Spray ports 42 (42a in FIGS. 5 and 6) aligned in one of the paired lines L are staggered from spray ports 42 (42b in FIGS. 5 and 6) aligned in the other line L in the longitudinal direction D5. As seen vertically, the liquid droplet nozzle 5 is retained by the nozzle arm 21, for example, with the four lines L crossing the path X1 (also see FIG. 2).

The treatment liquid supply mechanism 14 (see FIG. 1) constantly supplies the treatment liquid to the liquid droplet nozzle 5 at a higher pressure. The treatment liquid supplied to the supply port 39 from the treatment liquid supply mechanism 14 through the treatment liquid supply pipe 13 is further supplied to the treatment liquid flow passage 41. With the drain valve 16 closed, the treatment liquid has a higher pressure (liquid pressure) in the treatment liquid flow passage 41. Therefore, the treatment liquid is spouted from the respective spray ports 42 by the liquid pressure with the drain valve 16 closed. When the AC voltage is applied to the piezo element 17 with the drain valve 16 closed, the oscillation of the piezo element 17 is applied to the treatment liquid flowing through the treatment liquid flow passage 41, whereby the treatment liquid spouted from the respective spray ports 42 is fragmented by the oscillation. Thus, the treatment liquid droplets are spouted from the spray ports 42 when the AC voltage is applied to the piezo element 17 with the drain valve 16 closed. In this manner, a multiplicity of treatment liquid droplets having uniform diameters are simultaneously spouted at a uniform speed.

With the drain valve 16 open, on the other hand, the treatment liquid supplied to the treatment liquid flow passage 41 is drained from the drain port 40 to the treatment liquid drain pipe 15. That is, the liquid pressure is not sufficiently increased in the treatment liquid flow passage 41 with the drain valve 16 open, so that the treatment liquid supplied to the treatment liquid flow passage 41 is not spouted from the minute spray ports 42 but drained to the treatment liquid drain pipe 15 from the drain port 40. Therefore, the spouting of the treatment liquid from the spray ports 42 is controlled by the opening and the closing of the drain valve 16. When the liquid droplet nozzle 5 is not used for the treatment of the substrate W (the liquid droplet nozzle 5 is in standby), the controller 8 opens the drain valve 16. Therefore, the treatment liquid constantly flows through the liquid droplet nozzle 5 even when the liquid droplet nozzle 5 is in standby.

When the treatment liquid droplets are caused to impinge on the upper surface of the substrate W, the controller 8 causes the nozzle movement mechanism 20 (see FIG. 1) to move the liquid droplet nozzle 5 to thereby locate the lower surface 5a of the liquid droplet nozzle 5 (the lower surface 5a of the main body 36) adjacent the upper surface of the substrate W. With the lower surface 5a of the liquid droplet nozzle 5 opposed to the upper surface of the substrate W, the controller 8 closes the drain valve 16 to increase the internal pressure of the treatment liquid flow passage 41, and drives the piezo element 17 to apply the oscillation to the treatment liquid in the treatment liquid flow passage 41. Thus, a multiplicity of treatment liquid droplets having uniform diameters are simultaneously spouted at a uniform speed. Then, as shown in FIGS. 3, 5 and 6, the multiplicity of liquid droplets spouted from the liquid droplet nozzle 5 are sprayed to two spraying regions T1 on the upper surface of the substrate W. More specifically, one of the spraying regions T1 is located immediately below one of the two pairs of lines L, and treatment liquid droplets spouted from the spray ports 42 aligned in these two lines L are sprayed to the one spraying region T1. Similarly, the other spraying region T1 is located immediately below the other pair of lines L, and treatment liquid droplets spouted from the spray ports 42 aligned in these two lines L are sprayed on the other spraying region T1. As shown in FIGS. 5 and 6, the spraying regions T1 each have a rectangular shape elongated in the longitudinal direction D5 as seen in plan. These two spraying regions T1 are parallel to each other.

Referring to FIGS. 3 to 5, the first protection liquid nozzle 6 will be described.

The first protection liquid nozzle 6 has a first outlet port 43 which spouts the protection liquid. The first outlet port 43 is located at a lower height level than an upper end of the liquid droplet nozzle 5. The first outlet port 43 has, for example, a round shape. The shape of the first outlet port 43 is not limited to the round shape, but may be an oval shape or a slit shape.

The first protection liquid nozzle 6 spouts the protection liquid so that the spouted protection liquid is applied in a first liquid application state on the upper surface of the substrate W. More specifically, the first protection liquid nozzle 6 spouts the protection liquid toward a first liquid application position P1 on the substrate W. The first liquid application position P1 is located upstream of the spraying regions T1 with respect to a rotation direction Dr of the substrate W. A distance Dc1 (see FIG. 5) from the first liquid application position P1 to a middle position M between the spraying regions T1 is, for example, 15 to 40 mm. The protection liquid is spouted from the first outlet port 43 in a first spouting direction D1 toward the first liquid application position P1. In other words, the protection liquid spouted from the first outlet port 43 is incident in the first spouting direction D1 on the first liquid application position P1 on the substrate W. The first spouting direction D1 extends from the first outlet port 43 toward the first liquid application position P1, and extends from the first outlet port 43 toward the liquid droplet nozzle 5 as seen in plan. The first spouting direction D1 is tilted with respect to the longitudinal direction D5. An angle (incident angle) θH1 (see FIG. 5) defined between the longitudinal direction D5 and the first spouting direction D1 as seen in plan is set to a predetermined angle, for example, in the range of 25 to 35 degrees.

As shown in FIG. 3, the first spouting direction D1 is tilted toward the spraying regions T1 with respect to the vertical direction. That is, the first liquid application position P1 is located between the first outlet port 43 and the spraying regions T1 with respect to the horizontal direction, and the first spouting direction D1 is tilted with respect to the upper surface of the substrate W. An angle (incident angle) θV1 (see FIG. 3) defined between the upper surface of the substrate W and the first spouting direction D1 is set to a predetermined angle, for example, in the range of 10 to 40 degrees.

The second protection liquid nozzle 7 has a second outlet port 44 which spouts the protection liquid. The second outlet port 44 is located at a lower height level than an upper end of the liquid droplet nozzle 5. The second outlet port 44 has, for example, a round shape. The shape of the second outlet port 44 is not limited to the round shape, but may be an oval shape or a slit shape.

The second protection liquid nozzle 7 spouts the protection liquid so that the spouted protection liquid is applied in a second liquid application state on the upper surface of the substrate W. More specifically, the second protection liquid nozzle 7 spouts the protection liquid toward a second liquid application position P2 on the substrate W. The second liquid application position P2 is located upstream of the spraying regions T1 with respect to the rotation direction Dr of the substrate W. A distance Dc2 (see FIG. 6) from the second liquid application position P2 to the middle position M is, for example, 15 to 40 mm.

The second outlet port 44 spouts the protection liquid in a second spouting direction D2 toward the second liquid application position P2. In other words, the protection liquid spouted from the second outlet port 44 is incident in the second spouting direction D2 on the second liquid application position P2 on the substrate W. The second spouting direction D2 extends from the second outlet port 44 toward the second liquid application position P2, and extends from the second outlet port 44 toward the liquid droplet nozzle 5 as seen in plan. The second spouting direction D2 is tilted with respect to the longitudinal direction D5. An angle (incident angle) θH2 (see FIG. 6) defined between the longitudinal direction D5 and the second spouting direction D2 as seen in plan is set to a predetermined angle, for example, in the range of 25 to 35 degrees.

As shown in FIG. 3, the second spouting direction D2 is tilted toward the spraying regions T1 with respect to the vertical direction. That is, the second liquid application position P2 is located between the second outlet port 44 and the spraying regions T1 with respect to the horizontal direction, and the second spouting direction D2 is tilted with respect to the upper surface of the substrate W. An angle (incident angle) θV2 (see FIG. 3) defined between the upper surface of the substrate W and the second spouting direction D2 is set to a predetermined angle, for example, in the range of 10 to 40 degrees.

The first and second protection liquid nozzles 6, 7 are attached to the nozzle holder 24 (see FIG. 1). The position and the attitude (first position/attitude condition) of the first protection liquid nozzle 6 is optimized for a state in which the spraying regions T1 are located on the upper surface center portion of the substrate W including the rotation center C1 of the substrate W. That is, the first liquid application state (first liquid application position P1 (see FIG. 3), angle θV1 (see FIG. 3) and angle θH1 (see FIG. 5) is such that, when the protection liquid is spouted only from the first protection liquid nozzle 6 with the spraying regions T1 located on the upper surface center portion of the substrate W, the protection liquid most efficiently spreads over the entire spraying regions T1. In other words, the first position/attitude condition of the first protection liquid nozzle 6 is such that, when the protection liquid is spouted only from the first protection liquid nozzle 6 with the spraying regions T1 located on the upper surface center portion of the substrate W, the protection liquid most efficiently spreads over the entire spraying regions T1.

The position and the attitude (second position/attitude condition) of the second protection liquid nozzle 7 is optimized for a state in which the spraying regions T1 are located on the upper surface peripheral portion of the substrate W. That is, the second liquid application state (second liquid application position P2 (see FIG. 3), angle θV2 (see FIG. 3) and angle θH2 (see FIG. 6) is such that, when the protection liquid is spouted only from the second protection liquid nozzle 7 with the spraying regions T1 located on the upper surface peripheral portion of the substrate W, the protection liquid most efficiently spreads over the entire spraying regions T1. In other words, the second position/attitude condition of the second protection liquid nozzle 7 is such that, when the protection liquid is spouted only from the second protection liquid nozzle 7 with the spraying regions T1 located on the upper surface peripheral portion of the substrate W, the protection liquid most efficiently spreads over the entire spraying regions T1.

In the substrate treatment apparatus 1, as shown in FIGS. 3 and 4, the first and second protection liquid nozzles 6, 7 assume the same attitude, but are vertically offset from each other. In other words, the first and second protection liquid nozzles 6, 7 coincide with each other as seen in plan (in FIG. 4, the first and second protection liquid nozzles 6, 7 are slightly offset from each other for convenience of drawing).

In the substrate treatment apparatus 1, more specifically, the outlet port 43 of the first protection liquid nozzle 6 and the outlet port 44 of the second protection liquid nozzle 7 are vertically offset from each other. As a result, the second liquid application position P2 is closer to the spraying regions T1 than the first liquid application position P1 (Dc1 (see FIG. 5) >De2 (see FIG. 6)). The second liquid application position P2 is located on an extension of a line connecting the first outlet port 43 to the first liquid application position P1.

The first spouting direction D1 and the second spouting direction D2 are the same direction. That is, the angle θV2 (see FIG. 3) is equal to the angle θV1 (see FIG. 3), and the angle θH2 (see FIG. 6) is equal to the angle θH1 (see FIG. 5).

As long as the position and the attitude of the first protection liquid nozzle 6 and the position and the attitude of the second protection liquid nozzle 7 are respectively optimized for the upper surface center portion of the substrate W and for the upper surface peripheral portion of the substrate W, the first and second protection liquid nozzles 6, 7 may assume different attitudes with their outlet ports 43, 44 located at different positions. In this case, the first spouting direction D1 and the second spouting direction D2 are different from each other. Further, the first and second protection liquid nozzles 6, 7 may be arranged so that the first liquid application position P1 coincides with the second liquid application position P2 when the protection liquid is spouted from the first and second protection liquid nozzles 6, 7. In this case, however, the first spouting direction D1 and the second spouting direction D2 should be different from each other.

In first and second exemplary treatment processes to be performed by the substrate treatment apparatus 1 (to be described later), the controller 8 spouts the protection liquid only from the first protection liquid nozzle 6 without spouting the protection liquid from the second protection liquid nozzle 7, when the spraying regions T1 are located on an upper surface inner portion IR of the substrate W including the upper surface center portion including the rotation center C1 of the substrate W (around the upper surface center portion). Further, the controller 8 spouts the protection liquid only from the second protection liquid nozzle 7 without spouting the protection liquid from the first protection liquid nozzle 6, when the spraying regions T1 are located on an upper surface outer portion OR of the substrate W including the upper surface peripheral portion (around the upper surface peripheral portion). Further, the controller 8 controls the spin chuck 2 to rotate the substrate W.

Referring to FIGS. 1, 3 and 5, how the protection liquid flows when the spraying regions T1 are located on the upper surface center portion of the substrate W in the first and second exemplary treatment processes will be described.

Since the protection liquid is supplied to the rotating substrate W, the protection liquid supplied from the first protection liquid nozzle 6 to the upper surface center portion of the substrate W is accelerated radially (in a rotation radius direction) due to contact with the substrate W and accelerated in the rotation direction Dr of the substrate W (see FIG. 6). Therefore, the protection liquid flows in the rotation direction while spreading radially from the first liquid application position P1. Since the first spouting direction D1 is tilted with respect to the vertical direction and the rotation speed of the substrate W is lower in the center portion of the substrate W, the protection liquid supplied to the upper surface center portion of the substrate W extensively spreads in a triangular shape having a vertex at the first liquid application position P1.

Referring to FIGS. 1, 3 and 6, how the protection liquid flows when the spraying regions T1 are located on the upper surface peripheral portion of the substrate W in the first and second exemplary treatment processes will be described.

Since the protection liquid is supplied to the rotating substrate W, the protection liquid supplied from the second protection liquid nozzle 7 to the upper surface peripheral portion of the substrate W is accelerated radially (in the rotation radius direction) due to contact with the substrate W and accelerated in the rotation direction Dr of the substrate W. Therefore, the protection liquid supplied to the substrate W flows in the rotation direction while spreading radially from the second liquid application position P2. Since the rotation speed of the substrate W is higher in the peripheral portion of the substrate W, the protection liquid supplied to the upper surface peripheral portion of the substrate W spreads at a higher speed in an acute angle triangular shape having a vertex at the second liquid application position P2 (generally linearly circumferentially of the substrate W).

In third and fourth exemplary treatment processes to be performed by the substrate treatment apparatus 1 (to be described later), the controller 8 causes the first and second protection liquid nozzles 6, 7 to spout the protection liquid while moving (scanning) the spraying regions T1. At this time, the protection liquid is spouted at the same flow rate from the first and second protection liquid nozzles 6, 7 (in a flow rate ratio of 1:1). Further, the controller 8 controls the spin chuck 2 to rotate the substrate W.

Referring to FIGS. 1, 3 and 5, how the protection liquid flows when the spraying regions T1 are located on the upper surface center portion of the substrate W in the third and fourth exemplary treatment processes will be described. Reference will be also made to FIG. 6 for description of the second protection liquid nozzle 7.

The protection liquid spouted from the first protection liquid nozzle 6 is applied on the first liquid application position P1, while the protection liquid spouted from the second protection liquid nozzle 7 is applied on the second liquid application position P2. Since the protection liquid is supplied to the rotating substrate W, the protection liquid supplied to the substrate W is accelerated radially (in the rotation radius direction) due to contact with the substrate W and accelerated in the rotation direction Dr of the substrate W (see FIG. 6). Therefore, the protection liquid supplied to the substrate W flows in the rotation direction while spreading radially from the first and second liquid application positions P1, P2. Since the first and second spouting directions D1, D2 are tilted with respect to the vertical direction and the rotation speed of the substrate W is lower in the center portion of the substrate W, the protection liquid supplied to the upper surface center portion of the substrate W extensively spreads in triangular shapes respectively having vertices at the first and second liquid application positions P1, P2.

Referring to FIGS. 1, 3 and 6, how the protection liquid flows when the spraying regions T1 are located on the upper surface peripheral portion of the substrate W in the second exemplary treatment process will be described. Reference will be also made to FIG. 5 for description of the first protection liquid nozzle 6.

The protection liquid spouted from the first protection liquid nozzle 6 is applied to the first liquid application position P1, while the protection liquid spouted from the second protection liquid nozzle 7 is applied to the second liquid application position P2. Since the protection liquid is supplied to the rotating substrate W, the protection liquid supplied to the substrate W is accelerated radially (in the rotation radius direction) due to contact with the substrate W and accelerated in the rotation direction Dr of the substrate W. Therefore, the protection liquid supplied to the substrate W flows in the rotation direction while spreading radially from the first and second liquid application positions P1, P2. Since the rotation speed of the substrate W is higher in the peripheral portion of the substrate W, the protection liquid supplied to the upper surface peripheral portion of the substrate W radially spreads at higher speeds in acute angle triangular shapes respectively having vertices at the first and second liquid application positions P1, P2 (generally linearly circumferentially of the substrate W).

FIGS. 7A to 7E are diagrams for explaining the first exemplary treatment process to be performed on the substrate W by the substrate treatment apparatus 1 according to the embodiment of the present invention. Referring to FIGS. 1 and 7A to 7E, the first exemplary treatment process will be described.

An untreated round substrate W, for example, having a diameter of 300 mm is transported by a transport robot (not shown) and placed on the spin chuck 2 with its front surface (device formation surface) facing up. Then, the controller 8 causes the spin chuck 2 to hold the substrate W. Thereafter, the controller 8 controls the spin motor 10 to rotate the substrate W held by the spin chuck 2.

Subsequently, a first covering step is performed to supply pure water (an example of the rinse liquid) to the substrate W from the rinse liquid nozzle 4 to cover the upper surface of the substrate W with the pure water. More specifically, the controller 8 opens the rinse liquid valve 11 to spout the pure water from the rinse liquid nozzle 4 toward the upper surface center portion of the substrate W held by the spin chuck 2, as shown in FIG. 7A, while causing the spin chuck 2 to rotate the substrate W. The pure water spouted from the rinse liquid nozzle 4 is supplied to the upper surface center portion of the substrate W and receives a centrifugal force generated by the rotation of the substrate W to spread outward on the upper surface of the substrate W. Thus, the pure water is supplied over the entire upper surface of the substrate W, whereby a liquid film of the pure water is formed as covering the entire upper surface of the substrate W. After a lapse of a predetermined period from the opening of the rinse liquid valve 11, the controller 8 closes the rinse liquid valve 11 to stop spouting the pure water from the rinse liquid nozzle 4.

In turn, a cleaning step is performed to supply droplets of carbonated water (an example of the treatment liquid) from the liquid droplet nozzle 5 to clean the substrate W and, simultaneously with the cleaning step, a second covering step is performed to supply SC-1 (an example of the protection liquid) to the substrate W to cover the upper surface of the substrate W with the SC-1. That is, as shown in FIGS. 7B and 7C, the controller 8 spouts the SC-1 from the first and second protection liquid nozzles 6, 7 and sprays the carbonated water droplets from the liquid droplet nozzle 5, while rotating the substrate W at a predetermined speed and causing the nozzle movement mechanism 20 to reciprocate the liquid droplet nozzle 5 along the path X1 between a center position Pc and a peripheral position Pe a plurality of times (half scan). Since the controller 8 rotates the substrate W and moves the liquid droplet nozzle 5 between the center position Pc and the peripheral position Pe, the upper surface of the substrate W is scanned with the spraying regions T1. Thus, the spraying regions T1 pass over the entire upper surface of the substrate W. As indicated by a solid line in FIG. 2, the center position Pc is a position at which the liquid droplet nozzle 5 overlaps with the upper surface center portion of the substrate W as seen in plan. As indicated by a two-dot-and-dash line in FIG. 2, the peripheral position Pe is a position at which the liquid droplet nozzle 5 overlaps with the upper surface peripheral portion of the substrate W as seen in plan.

After the completion of the cleaning step and the second covering step, a rinsing step is performed to supply pure water (an example of the rinse liquid) to the substrate W from the rinse liquid nozzle 4 to rinse away liquid and foreign matter adhering to the substrate W. More specifically, the controller 8 opens the rinse liquid valve 11 to spout the pure water from the rinse liquid nozzle 4 toward the upper surface center portion of the substrate W held by the spin chuck 2, as shown in FIG. 7D, while causing the spin chuck 2 to rotate the substrate W. The pure water spouted from the rinse liquid nozzle 4 is supplied to the upper surface center portion of the substrate W, and receives a centrifugal force generated by the rotation of the substrate W to spread outward on the upper surface of the substrate W. Thus, the pure water is supplied over the entire upper surface of the substrate W to rinse away liquid and foreign matter adhering to the substrate W. After a lapse of a predetermined period from the opening of the rinse liquid valve 11, the controller 8 closes the rinse liquid valve 11 to stop spouting the pure water from the rinse liquid nozzle 4.

Subsequently, a drying step is performed to dry (spin-dry) the substrate W. More specifically, the controller 8 controls the spin motor 10 to rotate the substrate W at a higher rotation speed (e.g., several thousands rpm). Thus, a greater centrifugal force acts on the water adhering to the substrate W, whereby the adhering water is spun off around the substrate W as shown in FIG. 7E. In this manner, the water is removed from the substrate W to dry the substrate W. After the drying step is performed for a predetermined period, the controller 8 controls the spin motor 10 to cause the spin chuck 2 to stop rotating the substrate W. Thereafter, the treated substrate W is unloaded from the spin chuck 2 by the transport robot.

FIGS. 8A to 8H are diagrams for explaining the cleaning step and the second covering step. FIGS. 9 and 10 are timing charts showing the opening/closing operation of the first and second protection liquid valves 26, 29. FIG. 9 shows a case in which the spraying regions T1 are moved from the upper surface peripheral portion to the upper surface center portion of the substrate W, and FIG. 10 shows a case in which the spraying regions T1 are moved from the upper surface center portion toward the upper surface peripheral portion of the substrate W. Referring to FIGS. 1, 8A to 8H, 9 and 10, the cleaning step and the second covering step will be described.

Figure 8A:
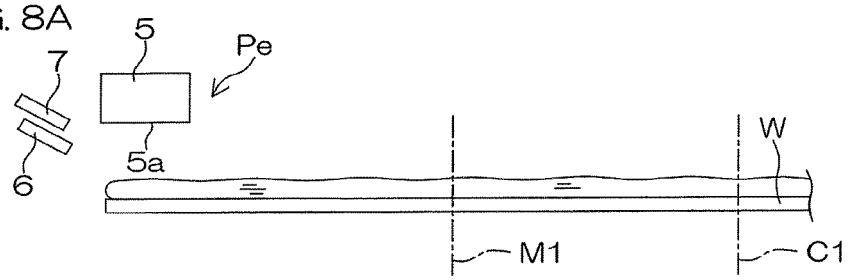
FIGS. 8A to 8H are diagrams for explaining a cleaning step and a second covering step shown in FIG. 7B.

The controller 8 controls the nozzle movement mechanism 20 to move the liquid droplet nozzle 5 and the first and second protection liquid nozzles 6, 7 from home positions (not shown) defined outside the rotation range of the substrate W to above the spin chuck 2 as shown in FIG. 8A and locate the lower surface 5a of the liquid droplet nozzle 5 adjacent the upper surface peripheral portion of the substrate W. That is, the liquid droplet nozzle 5 is located at the peripheral position Pe.

Figure 8B:
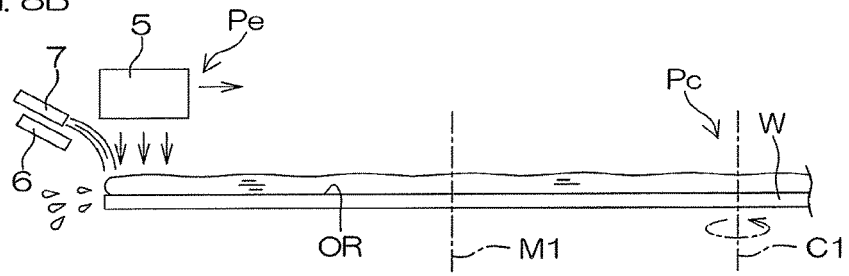

Thereafter, the controller 8 opens the second protection liquid valve 29 to spout the SC-1 from the second protection liquid nozzle 7, as shown in FIG. 8B, while causing the spin chuck 2 to rotate the substrate W. The opening degree of the flow rate regulating valve 30 is controlled so that the total spouting flow rate of the protection liquid to be spouted from the first and second protection liquid nozzles 6, 7 is regulated at a first spouting flow rate which is a predetermined lower flow rate (e.g., about 0.5 L/min). Therefore, the SC-1 is spouted at a spouting flow rate of about 0.5 L/min from the second protection liquid nozzle 7.

The controller 8 sprays liquid droplets of the carbonated water from the liquid droplet nozzle 5 while spouting the SC-1 from the second protection liquid nozzle 7. More specifically, the controller 8 closes the drain valve 16 with the lower surface 5a of the liquid droplet nozzle 5 located adjacent the upper surface of the substrate W and with the SC-1 being spouted from the second protection liquid nozzle 7, and causes the voltage application mechanism 19 to apply the AC voltage of the predetermined frequency to the piezo element 17 of the liquid droplet nozzle 5. The multiplicity of carbonated water droplets are sprayed downward from the liquid droplet nozzle 5, whereby the spraying regions T1 are located on the upper surface peripheral portion of the substrate W. The SC-1 spouted from the second protection liquid nozzle 7 spreads over the entire spraying regions T1 located on the upper surface peripheral portion of the substrate W to form a liquid film of the SC-1, and the multiplicity of carbonated water droplets are sprayed from the liquid droplet nozzle 5 to the spraying regions T1 covered with the SC-1 liquid film.

Figure 8C:
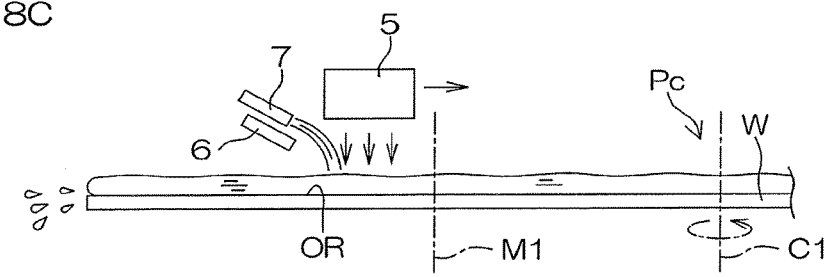

Further, as shown in FIG. 8B, the controller 8 causes the nozzle movement mechanism 20 to move the liquid droplet nozzle 5 toward the center position Pc on the upper surface of the substrate W while rotating the substrate W at a predetermined rotation speed and spouting the SC-1 at a predetermined spouting flow rate from the second protection liquid nozzle 7. Thus, as shown in FIG. 8C, the spraying regions T1 are moved toward the rotation center C1 of the substrate W on the upper surface outer region OR of the substrate W, while being covered with the SC-1 liquid film.

Figure 8D:
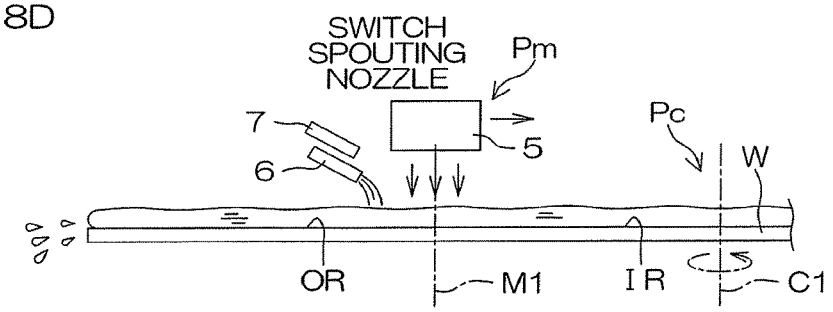

When the liquid droplet nozzle 5 passes through an intermediate position Pm, as shown in FIGS. 8D and 9, the controller 8 closes the second protection liquid valve 29 to stop spouting the SC-1 from the second protection liquid nozzle 7 and, at the same time, opens the first protection liquid valve 26 to spout the SC-1 from the first protection liquid nozzle 6.

That is, the protection liquid nozzle spouting the protection liquid is switched from the second protection liquid nozzle 7 to the first protection liquid nozzle 6. As described above, the opening degree of the flow rate regulating valve 30 is controlled so that the total spouting flow rate of the protection liquid to be spouted from the first and second protection liquid nozzles 6, 7 is regulated at the predetermined lower first spouting flow rate (e.g., about 0.5 L/min).

Therefore, the SC-1 is spouted at a spouting flow rate of about 0.5 L/min from the first protection liquid nozzle 6. The carbonated water droplets are continuously sprayed from the liquid droplet nozzle 5, and the SC-1 spouted from the first protection liquid nozzle 6 spreads over the entire spraying regions T1, which are now located on an intermediate portion M1 of the substrate W. Thus, a liquid film of the SC-1 is formed as covering the entire spraying regions T1. The intermediate position Pm is a position at which the liquid droplet nozzle 5 overlaps with the intermediate portion M1 of the substrate W (more specifically, the middle position M between the spraying regions T1 overlaps with the intermediate portion M1 of the substrate W) as seen in plan. The intermediate portion M1 of the substrate W is a portion intermediate between the rotation center C1 of the substrate W and the periphery of the substrate W (where the substrate W has a diameter of 300 mm, the intermediate portion M1 is positioned 75 mm apart from the rotation center C1).

Further, the controller 8 continuously rotates the substrate W at the predetermined rotation speed and continuously moves the liquid droplet nozzle 5 toward the center position Pc, while spouting the SC-1 at the predetermined spouting flow rate from the first protection liquid nozzle 6. Thus, the spraying regions T1 are moved toward the rotation center C1 of the substrate W on the upper surface inner region IR, while being covered with the SC-1 liquid film.

Figure 8E:
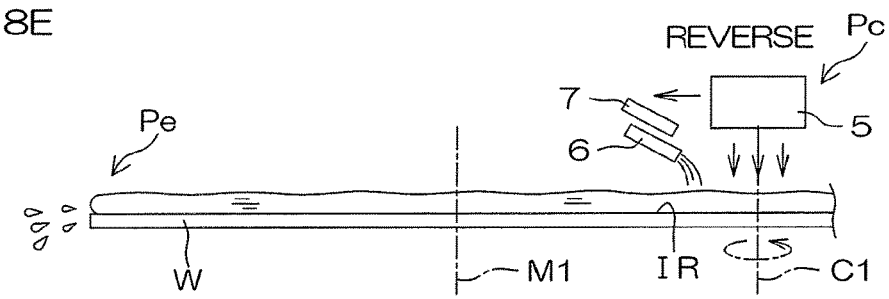
Figure 8F:
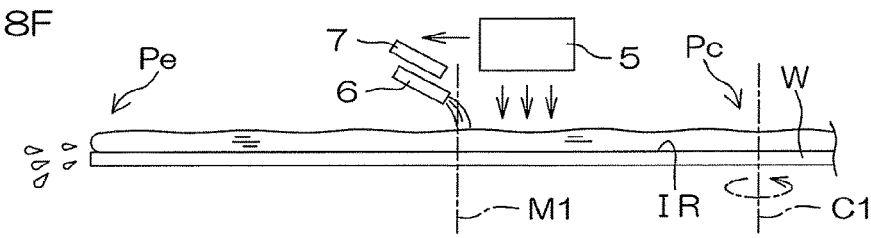

When the liquid droplet nozzle 5 thereafter reaches the center position Pc, as shown in FIG. 8E, the controller 8 controls the pivot mechanism 22 to reverse the pivoting direction of the nozzle arm 21. Therefore, the liquid droplet nozzle 5 starts moving from the center position Pc toward the peripheral position Pe. Thus, the liquid droplet nozzle 5 and the first and second protection liquid nozzles 6, 7 are moved toward the peripheral position Pe, while the carbonated water droplets are sprayed from the liquid droplet nozzle 5 and the SC-1 is spouted from the first protection liquid nozzle 6. Thus, the spraying regions T1 are moved toward the periphery of the substrate W on the upper surface inner region IR, as shown in FIG. 8F, while being covered with the SC-1 liquid film.

Figure 8G:
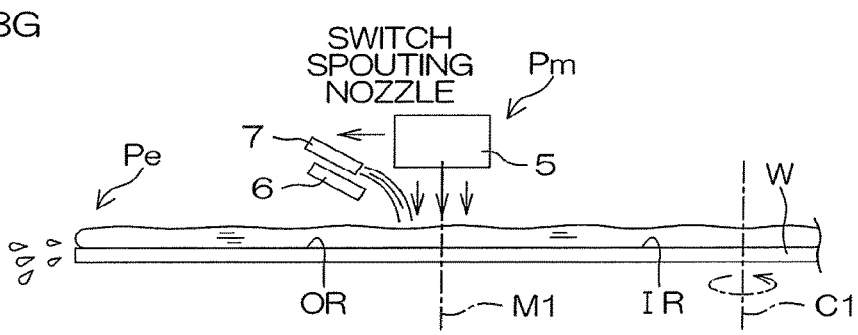

As shown in FIGS. 8G and 10, the controller 8 closes the first protection liquid valve 26 to stop spouting the SC-1 from the first protection liquid nozzle 6 and opens the second protection liquid valve 29 to spout the SC-1 from the second protection liquid nozzle 7 when the liquid droplet nozzle 5 passes through the intermediate position Pm.

That is, the protection liquid nozzle spouting the protection liquid is switched from the first protection liquid nozzle 6 to the second protection liquid nozzle 7. Thus, the SC-1 is spouted at a spouting flow rate of about 0.5 L/min from the second protection liquid nozzle 7. The carbonated water droplets are continuously sprayed from the liquid droplet nozzle 5, and the SC-1 spouted from the second protection liquid nozzle 7 spreads over the entire spraying regions T1, which are now located on the intermediate portion M1 of the substrate W. Thus, a liquid film of the SC-1 is formed as covering the spraying regions T1.

Further, the controller 8 continuously rotates the substrate W at the predetermined rotation speed and continuously moves the liquid droplet nozzle 5 toward the peripheral position Pe, while spouting the SC-1 at the predetermined spouting flow rate from the second protection liquid nozzle 7. Thus, the spraying regions T1 are moved toward the periphery of the substrate W on the upper surface outer region OR, while being covered with the SC-1 liquid film.

Figure 8H:
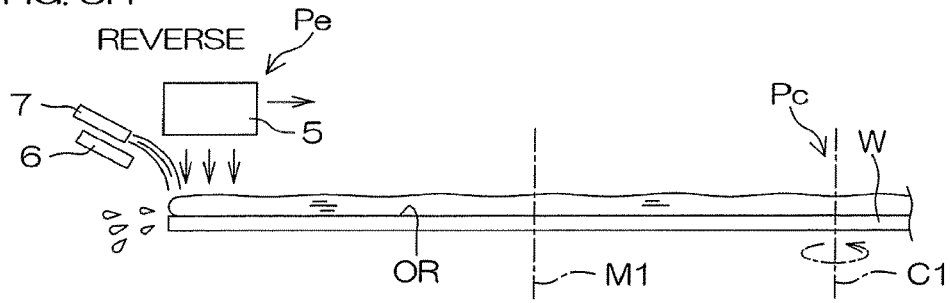

When the liquid droplet nozzle 5 thereafter reaches the peripheral position Pe, as shown in FIG. 8H, the controller 8 controls the pivot mechanism 22 to reverse the pivoting direction of the nozzle arm 21. Thus, the liquid droplet nozzle 5 starts moving from the peripheral position Pe toward the center position Pc.

The controller 8 thus moves the liquid droplet nozzle 5 between the center position Pc and the peripheral position Pe while rotating the substrate W. Thus, the upper surface of the substrate W is scanned with the spraying regions T1, so that the spraying regions T1 pass over the entire upper surface of the substrate W.

The multiplicity of carbonated water droplets are spouted downward from the liquid droplet nozzle 5 to be thereby sprayed to the spraying regions T1 covered with the SC-1 liquid film. Therefore, the carbonated water droplets are sprayed over the entire upper surface of the substrate W. Foreign matter such as particles adhering to the upper surface of the substrate W is physically removed by the impingement of the liquid droplets on the substrate W. The bonding force of the foreign matter to the substrate W is reduced by slightly dissolving the substrate W with the SC-1. Thus, the foreign matter is more reliably removed. Since the carbonated water droplets are sprayed to the spraying regions T1 with the upper surface of the substrate W entirely covered with the liquid film, the foreign matter is substantially prevented from adhering again to the substrate W. In this manner, the second covering step and the cleaning step are performed.

Where the scanning spraying regions T1 are located on the upper surface inner region IR in the cleaning step and the second covering step, the controller 8 spouts the protection liquid only from the first protection liquid nozzle 6 without spouting the protection liquid from the second protection liquid nozzle 7. As described above, the position and the attitude of the first protection liquid nozzle 6 are optimized for the state in which the spraying regions T1 are located on the upper surface center portion of the substrate W. Therefore, the protection liquid spouted from the first protection liquid nozzle 6 spreads over the entire spraying regions T1 irrespective of the position of the spraying regions T1 on the upper surface inner region IR. Thus, the SC-1 liquid film can be formed as covering the entire spraying regions T1.

Where the scanning spraying regions T1 are located on the upper surface outer region OR in the cleaning step and the second covering step, the controller 8 spouts the protection liquid only from the second protection liquid nozzle 7 without spouting the protection liquid from the first protection liquid nozzle 6. As described above, the position and the attitude of the second protection liquid nozzle 7 are optimized for the state in which the spraying regions T1 are located on the upper surface peripheral portion of the substrate W. Therefore, the protection liquid spouted from the second protection liquid nozzle 7 spreads over the entire spraying regions T1 irrespective of the position of the spraying regions T1 on the upper surface outer region OR. Thus, the SC-1 liquid film can be formed as covering the entire spraying regions T1.

The upper surface inner region IR is a region located inward of the intermediate portion M1 on the upper surface of the substrate W, and the upper surface outer region OR is a region located outward of the intermediate portion M1 on the upper surface of the substrate W.

After the reciprocal pivot operation of the nozzle arm 21 is performed a predetermined number of times, the controller 8 opens the drain valve 16 to stop spraying the liquid droplets from the liquid droplet nozzle 5. Further, the controller 8 closes an open one of the first and second protection liquid valves 26, 29 to stop spouting the SC-1 from the corresponding one of the first and second protection liquid nozzle 6 and 7.

Figure 11:
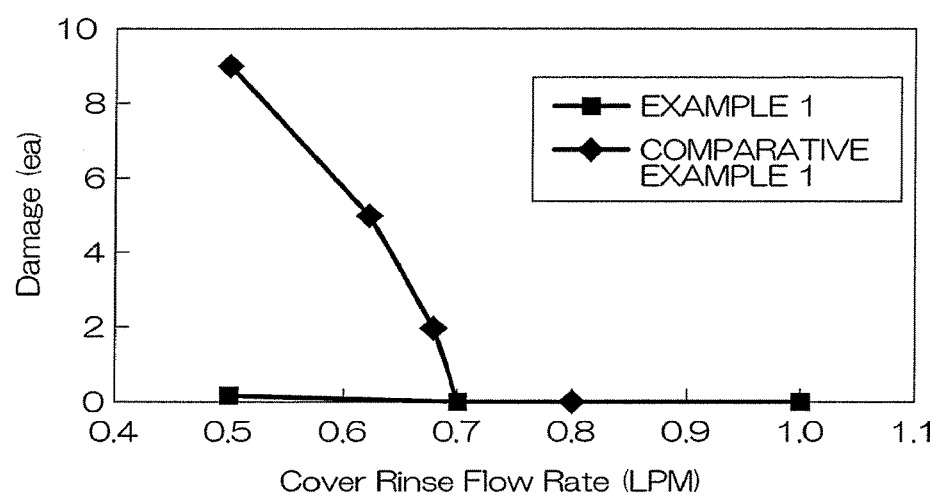
FIG. 11 is a graph showing relationships between the flow rate of a protection liquid supplied to a substrate and the number of damages of the substrate in Example 1 and Comparative Example 1.

FIG. 11 is a graph showing relationships between the flow rate of the protection liquid supplied to the substrate W and the number of damages of the substrate W in Example 1 and Comparative Example 1.

In Example 1, the second covering step and the cleaning step were performed by switching the protection liquid nozzle spouting the protection liquid as in the first exemplary treatment process described above. In Comparative example 1, the second covering step and the cleaning step were performed by spouting the protection liquid only from the first protection liquid nozzle 6. Substrates W each having a thin polysilicon film (having a thickness of 37 nm) formed on an upper surface thereof were used. The numbers of damages shown in FIG. 11 are measurement values obtained when the substrates W were treated under substantially the same conditions except for the flow rate of the protection liquid supplied to the substrates W. More specifically, the liquid temperature of the supplied protection liquid (SC-1) was 40° C., and the spouting flow rate of the protection liquid was 38 m/s. The rotation speed of the substrate was 300 rpm. The time required for each reciprocal pivot operation (reciprocal half scan) of the nozzle arm 21 was 10 sec, and the half scan was performed three times.

In Comparative Example 1, a greater number of damages were observed when the flow rate of the protection liquid supplied to the substrate W was less than 0.7 L/min. In Example 1, in contrast, a very small number of damages were observed when the flow rate of the protection liquid supplied to the substrate W was 0.5 L/min. Therefore, the damage of the substrate W can be suppressed without increasing the flow rate of the protection liquid to be supplied to the substrate W in the first exemplary treatment process.

In the first exemplary treatment process according to the first embodiment, as described above, the protection liquid is spouted only from the first protection liquid nozzle 6 when the spraying regions T1 are located on the upper surface inner region IR of the substrate W. The first protection liquid nozzle 6 is optimized so that, with the spraying regions T1 located on the upper surface center portion of the substrate W, the protection liquid spouted from the first protection liquid nozzle 6 spreads over the entire spraying regions T1. Therefore, the spraying regions T1 located on the upper surface inner region IR can be entirely covered with the protection liquid film even if the protection liquid is supplied at a lower flow rate to the substrate W.

Further, the protection liquid is spouted only from the second protection liquid nozzle 7 when the spraying regions T1 are located on the upper surface outer region OR of the substrate W. The second protection liquid nozzle 7 is optimized so that, with the spraying regions T1 located on the upper surface peripheral portion of the substrate W, the protection liquid spouted from the second protection liquid nozzle 7 spreads over the entire spraying regions T1. Therefore, the spraying regions T1 located on the upper surface outer region OR can be entirely covered with the protection liquid film even if the protection liquid is supplied at a lower flow rate to the substrate W.

As a result, the spraying regions T1 can be entirely covered with the protection liquid film by supplying the protection liquid at a lower flow rate to the substrate W irrespective of the position of the spraying regions T1 on the upper surface of the substrate W. Thus, the damage of the substrate W can be suppressed without increasing the flow rate of the protection liquid to be supplied to the substrate W.

The protection liquid nozzle spouting the protection liquid is switched from the first protection liquid nozzle 6 to the second protection liquid nozzle 7 when the spraying regions T1 are moved from the upper surface center portion of the substrate W toward the upper surface peripheral portion of the substrate W. Further, the protection liquid nozzle spouting the protection liquid is switched from the second protection liquid nozzle 7 to the first protection liquid nozzle 6 when the spraying regions T1 are moved from the upper surface peripheral portion of the substrate W toward the upper surface center portion of the substrate W. Thus, the protection liquid is spouted only from the first protection liquid nozzle 6 when the spraying regions T1 are located on the upper surface inner region IR of the substrate W, and spouted only from the second protection liquid nozzle 7 when the spraying regions T1 are located on the upper surface outer region OR of the substrate W. Therefore, the spraying regions T1 can be entirely covered with the protection liquid film by supplying the protection liquid at a lower flow rate irrespective of the position of the spraying regions T1 on the upper surface of the substrate W.

However, the first exemplary treatment process has the following drawback.

Where the stop of the spouting from the second protection liquid nozzle 7 is earlier than the start of the spouting from the first protection liquid nozzle 6 when the spraying regions T1 are moved from the upper surface peripheral portion of the substrate W toward the upper surface center portion of the substrate W, there is a possibility that the protection liquid is spouted from neither the first protection liquid nozzle 6 nor the second protection liquid nozzle 7 for a certain period of time. During this period, the upper surface of the substrate W is not protected with the protection liquid, resulting in the possibility of the damage of the substrate W.

Where the stop of the spouting from the first protection liquid nozzle 6 is earlier than the start of the spouting from the second protection liquid nozzle 7 when the spraying regions T1 are moved from the upper surface center portion of the substrate W toward the upper surface peripheral portion of the substrate W, a similar problem may arise.

To solve this problem, the following second exemplary treatment process may be employed.

FIGS. 12A to 12L are diagrams for explaining the second exemplary treatment process to be performed by the substrate treatment apparatus 1. FIGS. 13 and 14 are timing charts showing the opening/closing operation of the first and second protection liquid valves 26, 29. FIG. 13 shows a case in which the spraying regions T1 are moved from the upper surface peripheral portion to the upper surface center portion of the substrate W, and FIG. 14 shows a case in which the spraying regions T1 are moved from the upper surface center portion to the upper surface peripheral portion of the substrate W.

FIGS. 12A to 12L show only a cleaning step and a second covering step of the second exemplary treatment process. In the second exemplary treatment process, only the cleaning step and the second covering step are different from those of the first exemplary treatment process. Since the other steps are performed in the same manner as in the first exemplary treatment process, duplicate description will be omitted. Referring to FIGS. 1, 12A to 12L, 13 and 14, the cleaning step and the second covering step of the second exemplary treatment process will be described.

Figure 12A:
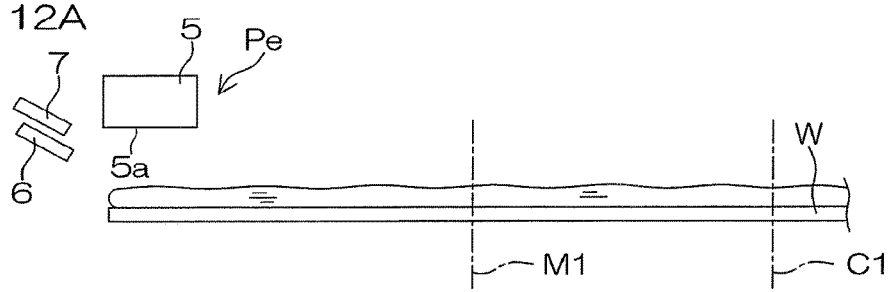

The controller 8 controls the nozzle movement mechanism 20 to move the liquid droplet nozzle 5 and the first and second protection liquid nozzles 6, 7 from the home positions (not shown) defined outside the rotation range of the substrate W to above the spin chuck 2 as shown in FIG. 12A and locate the lower surface 5a of the liquid droplet nozzle 5 adjacent the upper surface peripheral portion of the substrate W. That is, the liquid droplet nozzle 5 is located at the peripheral position Pe.

Figure 12B:
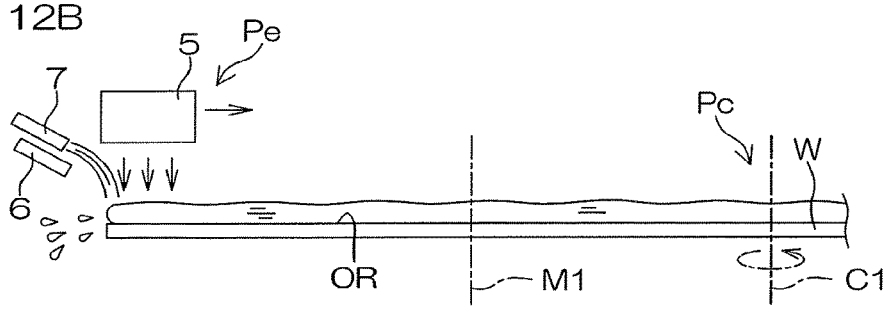

Thereafter, the controller 8 opens the second protection liquid valve 29 to spout the SC-1 from the second protection liquid nozzle 7, as shown in FIG. 12B, while causing the spin chuck 2 to rotate the substrate W. The SC-1 is spouted at a spouting flow rate of about 0.5 L/min from the second protection liquid nozzle 7.

The controller 8 sprays liquid droplets of the carbonated water from the liquid droplet nozzle 5 while spouting the SC-1 from the second protection liquid nozzle 7. The multiplicity of carbonated water droplets are spouted downward from the liquid droplet nozzle 5, whereby the spraying regions T1 are located on the upper surface peripheral portion of the substrate W. The SC-1 spouted from the second protection liquid nozzle 7 spreads over the entire spraying regions T1 located on the upper surface peripheral portion of the substrate W to form a liquid film of the SC-1, and the multiplicity of carbonated water droplets are sprayed from the liquid droplet nozzle 5 to the spraying regions T1 covered with the SC-1 liquid film.

Figure 12C:
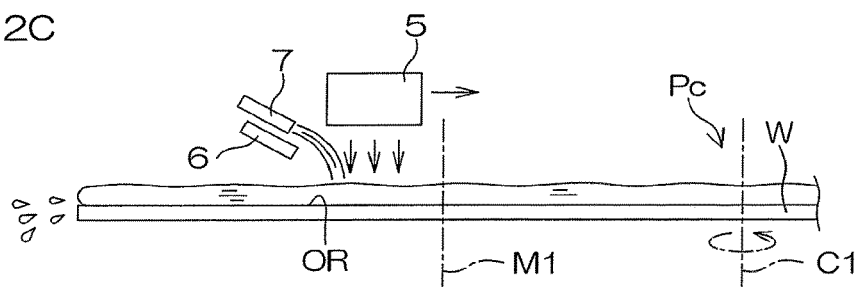

Further, as shown in FIG. 12B, the controller 8 causes the nozzle movement mechanism 20 to move the liquid droplet nozzle 5 toward the center position Pc on the upper surface of the substrate W while rotating the substrate W at the predetermined rotation speed and spouting the SC-1 at the predetermined spouting flow rate from the second protection liquid nozzle 7. Thus, as shown in FIG. 12C, the spraying regions T1 are moved toward the rotation center C1 of the substrate W on the upper surface outer region OR of the substrate W, while being covered with the SC-1 liquid film.

Figure 12D:
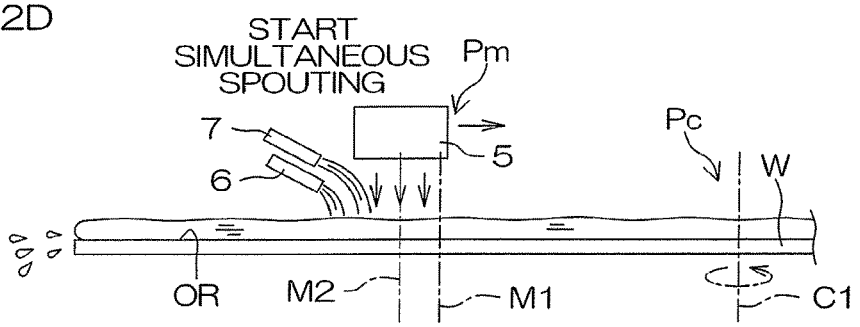

When the liquid droplet nozzle 5 passes through a predetermined position defined outward of the intermediate position Pm (more specifically, the middle position M between the spraying regions T1 passes through an outer portion M2 defined outward of the intermediate portion M1 on the upper surface of the substrate W), as shown in FIGS. 12D and 13, the controller 8 opens the first protection liquid valve 26 to spout the SC-1 from the first protection liquid nozzle 6 with the second protection liquid valve 29 kept open. Thus, simultaneous spouting of the SC-1 from both of the first and second protection liquid nozzles 6, 7 is started. As described above, the opening degree of the flow rate regulating valve 30 is controlled so that the total spouting flow rate of the protection liquid to be spouted from the first and second protection liquid nozzles 6, 7 is regulated at the predetermined lower first spouting flow rate (e.g., about 0.5 L/min). Therefore, the SC-1 is spouted at a spouting flow rate of about 0.25 L/min from each of the first and second protection liquid nozzles 6, 7.

The carbonated water droplets are continuously sprayed from the liquid droplet nozzle 5, and the SC-1 spouted from the first and second protection liquid nozzles 6, 7 spreads over the entire spraying regions T1 located on the upper surface outer portion M2 of the substrate W. Thus, a liquid film of the SC-1 is formed as covering the entire spraying regions T1.

Figure 12E:
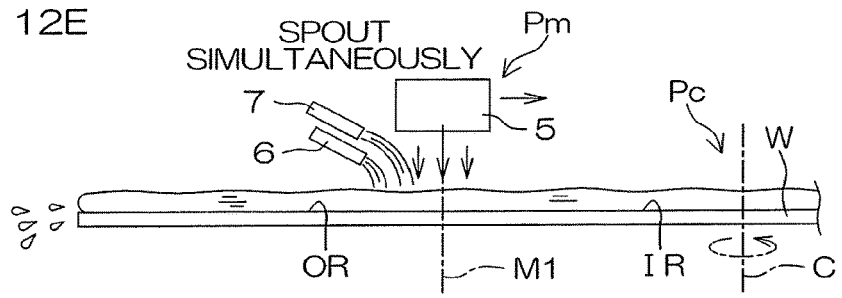

Thereafter, the controller 8 continuously rotates the substrate W at the predetermined rotation speed and continuously moves the liquid droplet nozzle 5 toward the center position Pc, while spouting the SC-1 at the predetermined spouting flow rate from the first and second protection liquid nozzles 6, 7. Thus, the liquid droplet nozzle 5 reaches the intermediate position Pm as shown in FIG. 12E and, thereafter, is further moved toward the center position Pc on the upper surface of the substrate W.

Figure 12F:
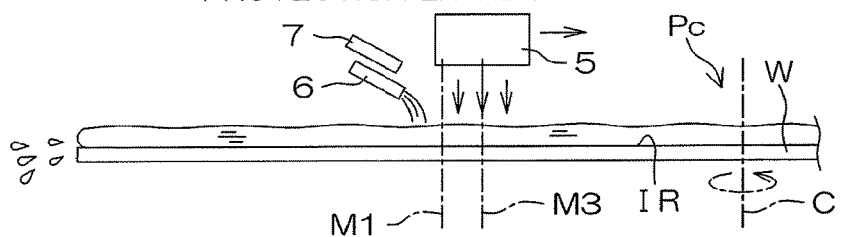

When the liquid droplet nozzle 5 thereafter passes through a predetermined position defined inward of the intermediate position Pm (more specifically, the middle position M between the spraying regions T1 passes through an inner portion M3 defined inward of the intermediate portion M1 on the upper surface of the substrate W), as shown in FIGS. 12F and 13, the controller 8 closes the second protection liquid valve 29 to stop spouting the SC-1 from the second protection liquid nozzle 7. Thus, the simultaneous spouting of the SC-1 from both of the first and second protection liquid nozzles 6, 7 ends and, thereafter, the SC-1 is spouted only from the first protection liquid nozzle 6. As described above, the opening degree of the flow rate regulating valve 30 is controlled so that the total spouting flow rate of the protection liquid to be spouted from the first and second protection liquid nozzles 6, 7 is regulated at the predetermined lower first spouting flow rate (e.g., about 0.5 L/min). Therefore, the SC-1 is spouted at a spouting flow rate of about 0.5 L/min from the first protection liquid nozzle 6.

Further, the controller 8 continuously rotates the substrate W at the predetermined rotation speed and continuously moves the liquid droplet nozzle 5 toward the center position Pc, while spouting the SC-1 at the predetermined spouting flow rate from the first protection liquid nozzle 6. Thus, the spraying regions T1 are moved toward the rotation center C1 of the substrate W on the upper surface inner region IR, while being covered with a liquid film of the SC-1.

Figure 12G:
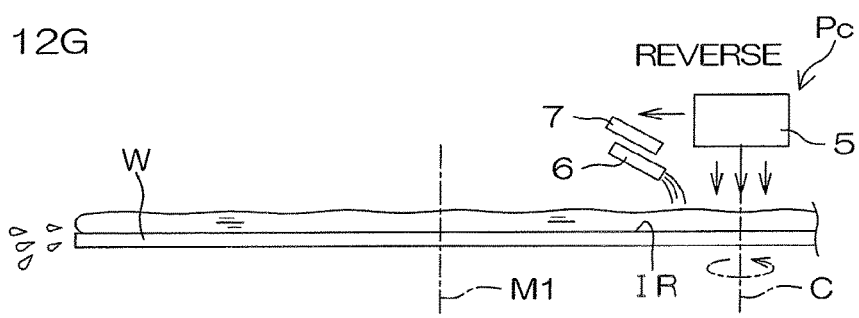

When the liquid droplet nozzle 5 thereafter reaches the center position Pc, as shown in FIG. 12G, the controller 8 controls the pivot mechanism 22 to reverse the pivoting direction of the nozzle arm 21. Thus, the liquid droplet nozzle starts moving from the center position Pc toward the peripheral position Pe. Thereafter, the liquid droplet nozzle 5 and the first and second protection liquid nozzles 6, 7 are moved toward the peripheral position Pe, while the carbonated water droplets are sprayed from the liquid droplet nozzle 5 and the SC-1 is spouted from the first protection liquid nozzle 6. Thus, the spraying regions T1 are moved from the upper surface center portion toward the upper surface peripheral portion of the substrate W, while being covered with the SC-1 liquid film.

Figure 12H:
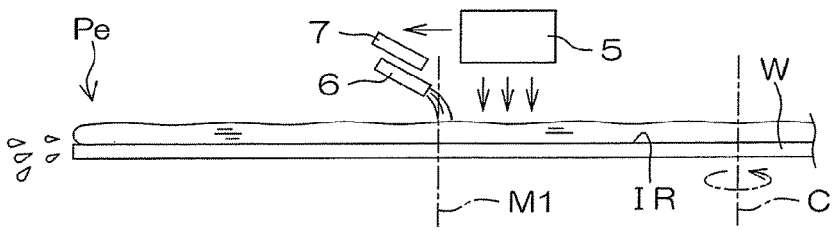

Thereafter, the liquid droplet nozzle 5 and the first and second protection liquid nozzles 6, 7 are moved toward the peripheral position Pe, as shown in FIG. 12H, while the carbonated water droplets are sprayed from the liquid droplet nozzle 5 and the SC-1 is spouted from the first protection liquid nozzle 6. Thus, the spraying regions T1 are moved toward the periphery of the substrate W on the upper surface inner region IR, while being covered with the SC-1 liquid film.

When the liquid droplet nozzle 5 passes through the predetermined position defined inward of the intermediate position Pm (more specifically, the middle position M between the spraying regions T1 passes through the upper surface inner portion M3 of the substrate W), as shown in FIGS. 12I and 14, the controller 8 opens the second protection liquid valve 29 to spout the SC-1 from the second protection liquid nozzle 7 with the first protection liquid valve 26 kept open. Thus, the simultaneous spouting of the SC-1 from both of the first and second protection liquid nozzles 6, 7 is started. At this time, the SC-1 is spouted at a spouting flow rate of about 0.25 L/min from each of the first and second protection liquid nozzles 6, 7.

The carbonated water droplets are continuously sprayed from the liquid droplet nozzle 5, and the SC-1 spouted from the first and second protection liquid nozzles 6, 7 spreads over the entire spraying regions T1 located on the upper surface inner portion M3 of the substrate W. Thus, a liquid film of the SC-1 is formed as covering the entire spraying regions T1.

Thereafter, the controller 8 continuously rotates the substrate W at the predetermined rotation speed and continuously moves the liquid droplet nozzle 5 toward the peripheral position Pe, while spouting the SC-1 at the predetermined spouting flow rate from the first and second protection liquid nozzles 6, 7. Thus, the liquid droplet nozzle 5 reaches the intermediate position Pm as shown in FIG. 12J and, thereafter, is further moved toward the peripheral position Pe on the upper surface of the substrate W.

When the liquid droplet nozzle 5 passes through the predetermined position defined outward of the intermediate position Pm (more specifically, the middle position M between the spraying regions T1 passes through the upper surface outer portion M2 of the substrate W), as shown in FIGS. 12K and 14, the controller 8 closes the first protection liquid valve 26 to stop spouting the SC-1 from the first protection liquid nozzle 6. Thus, the simultaneous spouting of the SC-1 from both of the first and second protection liquid nozzles 6, 7 ends and, thereafter, the SC-1 is spouted only from the second protection liquid nozzle 7. At this time, the SC-1 is spouted at a spouting flow rate of about 0.5 L/min from the second protection liquid nozzle 7.

Further, the controller 8 continuously rotates the substrate W at the predetermined rotation speed and continuously moves the liquid droplet nozzle 5 toward the peripheral position Pe, while spouting the SC-1 at the predetermined spouting flow rate from the second protection liquid nozzle 7. Thus, the spraying regions T1 are moved toward the periphery of the substrate W on the upper surface outer region OR, while being covered with the SC-1 liquid film.

When the liquid droplet nozzle 5 thereafter reaches the peripheral position Pe, as shown in FIG. 12L, the controller 8 controls the pivot mechanism 22 to reverse the pivoting direction of the nozzle arm 21. Thus, the liquid droplet nozzle 5 starts moving from the peripheral position Pe toward the center position Pc.

Where the period required for moving the spraying regions T1 (liquid droplet nozzle 5) from the upper surface peripheral portion of the substrate W to the upper surface center portion of the substrate W and the period required for moving the spraying regions T1 (liquid droplet nozzle 5) from the upper surface center portion of the substrate W to the upper surface peripheral portion of the substrate W are each set to 5.0 seconds, the duration of the simultaneous spouting of the protection liquid from the first and second protection liquid nozzles 6, 7 (where one of the first and second protection liquid valves 26, 29 is open, a period from the opening of the other protection liquid valve to the closing of the one protection liquid valve) is set, for example, to 0.2 seconds.

After the reciprocal pivot operation of the nozzle arm 21 is performed the predetermined number of times, the controller 8 opens the drain valve 16 to stop spraying the liquid droplets from the liquid droplet nozzle 5. Further, the controller 8 closes an open one of the first and second protection liquid valves 26, 29 to stop spouting the SC-1 from the corresponding one of the first and second protection liquid nozzles 6, 7.

In the second exemplary treatment process, as described above, the spouting of the protection liquid from the first protection liquid nozzle 6 is started prior to the stop of the spouting from the second protection liquid nozzle 7, and the spouting of the protection liquid from the second protection liquid nozzle 7 is started prior to the stop of the spouting from the first protection liquid nozzle 6. In other words, the period of the spouting of the protection liquid from the first protection liquid nozzle 6 partly overlaps with the period of the spouting of the protection liquid from the second protection liquid nozzle 7. Thus, the protection liquid is spouted simultaneously from the first and second protection liquid nozzles 6, 7 for a certain period of time when the protection liquid nozzle spouting the protection liquid is switched between the first protection liquid nozzle 6 and the second protection liquid nozzle 7. In this manner, the protection liquid is reliably prevented from being spouted from neither the first protection liquid nozzle 6 nor the second protection liquid nozzle 7 when the protection liquid nozzle spouting the protection liquid is switched.

FIGS. 15A to 15E are diagrams for explaining a third exemplary treatment process to be performed by the substrate treatment apparatus shown in FIG. 1. FIGS. 15A to 15E show a cleaning step and a second covering step of the third exemplary treatment process. In the third exemplary treatment process, only the cleaning step and the second covering step are different from those of the first exemplary treatment process. Since the other steps are performed in the same manner as in the first exemplary treatment process, duplicate description will be omitted. Referring to FIGS. 1 and 15A to 15E, the cleaning step and the second covering step of the third exemplary treatment process will be described.

Figure 15A:
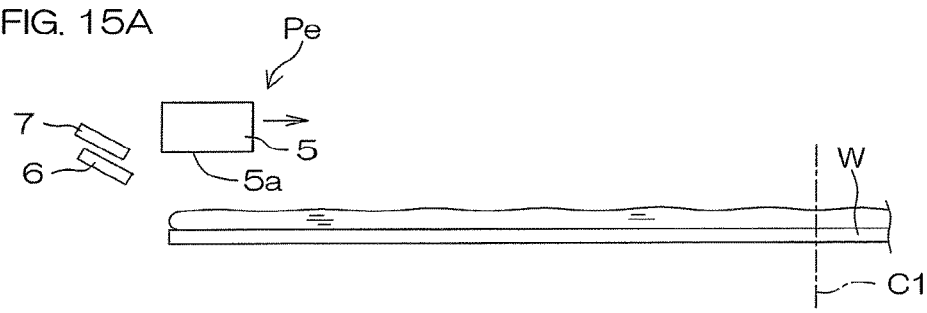
FIGS. 15A to 15E are diagrams for explaining a third exemplary treatment process to be performed by the substrate treatment apparatus shown in FIG. 1.

The controller 8 controls the nozzle movement mechanism 20 to move the liquid droplet nozzle 5 and the first and second protection liquid nozzles 6, 7 from the home positions (not shown) defined outside the rotation range of the substrate W to above the spin chuck 2 as shown in FIG. 15A and locate the lower surface 5a of the liquid droplet nozzle 5 adjacent the upper surface peripheral portion of the substrate W. That is, the liquid droplet nozzle 5 is located at the peripheral position Pe.

Thereafter, the controller 8 opens the first and second protection liquid valves 26, 29 to spout the SC-1 from both of the first and second protection liquid nozzles 6, 7, while causing the spin chuck 2 to rotate the substrate W. In the third exemplary treatment process, the opening degree of the flow rate regulating valve 30 is controlled so that the total spouting flow rate of the protection liquid to be spouted from the first and second protection liquid nozzles 6, 7 is regulated at a flow rate AF which is a predetermined lower flow rate (e.g., about 1.3 L/min). At this time, the SC-1 is spouted at a spouting flow rate of about 0.65 L/min from each of the first and second protection liquid nozzles 6, 7.

The controller 8 sprays liquid droplets of the carbonated water from the liquid droplet nozzle 5 while spouting the SC-1 from the first and second protection liquid nozzles 6, 7. More specifically, the controller 8 closes the drain valve 16 with the lower surface 5a of the liquid droplet nozzle 5 located adjacent the upper surface of the substrate W and with the SC-1 being spouted from the first and second protection liquid nozzles 6, 7, and causes the voltage application mechanism 19 to apply the AC voltage of the predetermined frequency to the piezo element 17 of the liquid droplet nozzle 5. The multiplicity of carbonated water droplets are spouted downward from the liquid droplet nozzle 5, whereby the spraying regions T1 are located on the upper surface peripheral portion of the substrate W. The SC-1 spouted from the first and second protection liquid nozzles 6, 7 spreads over the entire spraying regions T1 located on the upper surface peripheral portion of the substrate W to form a liquid film of the SC-1, and the multiplicity of carbonated water droplets are sprayed from the liquid droplet nozzle 5 to the spraying regions T1 covered with the SC-1 liquid film.

Figure 15B:
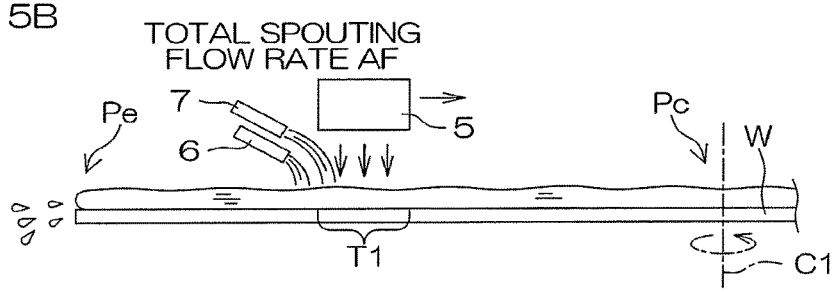

Further, as shown in FIG. 15B, the controller 8 causes the nozzle movement mechanism 20 to move the liquid droplet nozzle 5 toward the center position Pc on the upper surface of the substrate W, while rotating the substrate W at the predetermined rotation speed and spouting the SC-1 at the predetermined spouting flow rate (flow rate AF) from the first and second protection liquid nozzles 6, 7. Thus, the spraying regions T1 are moved toward the rotation center C1 of the substrate W on the upper surface of the substrate W, while being covered with the SC-1 liquid film.

Figure 15C:
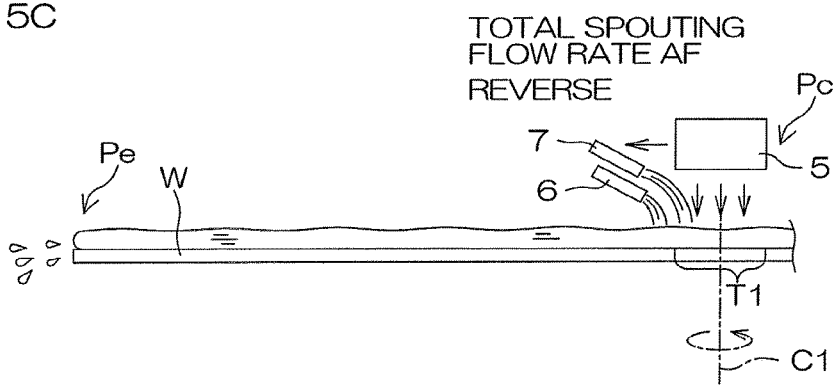
Figure 15D:
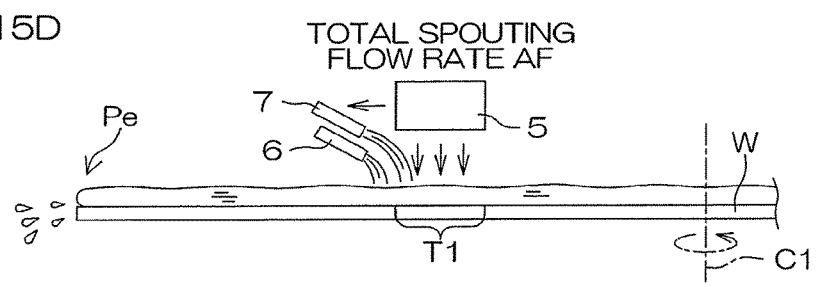

When the liquid droplet nozzle 5 thereafter reaches the center position Pc, as shown in FIG. 15C, the controller 8 controls the pivot mechanism 22 to reverse the pivoting direction of the nozzle arm 21. Thus, the liquid droplet nozzle 5 starts moving from the center position Pc toward the peripheral position Pe. Therefore, the liquid droplet nozzle 5 and the first and second protection liquid nozzles 6, 7 are moved toward the peripheral position Pe, while the carbonated water droplets are sprayed from the liquid droplet nozzle 5 and the SC-1 is spouted from the first and second protection liquid nozzles 6, 7. Thus, the spraying regions T1 are moved toward the periphery of the substrate W on the upper surface of the substrate W, as shown in FIG. 15D, while being covered with the SC-1 liquid film.

Figure 15E:
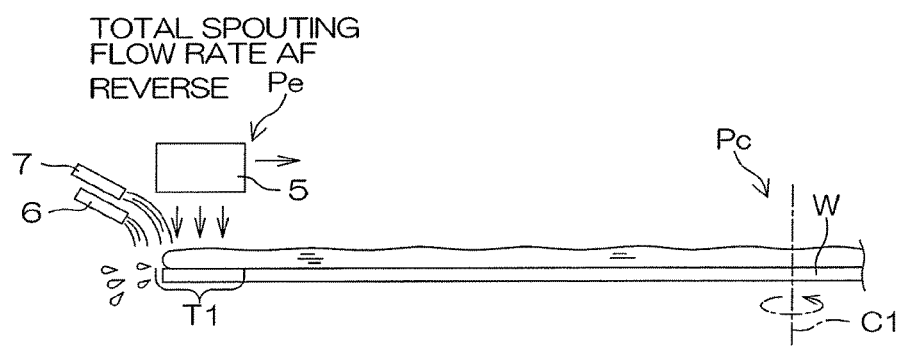

When the liquid droplet nozzle 5 thereafter reaches the peripheral position Pe, as shown in FIG. 15E, the controller 8 controls the pivot mechanism 22 to reverse the pivoting direction of the nozzle arm 21. Thus, the liquid droplet nozzle 5 starts moving from the peripheral position Pe toward the center position Pc.

The controller 8 thus moves the liquid droplet nozzle 5 between the center position Pc and the peripheral position Pe, while rotating the substrate W. Therefore, the upper surface of the substrate W is scanned with the spraying regions T1, whereby the spraying regions T1 pass over the entire upper surface of the substrate W.

The multiplicity of carbonated water droplets are spouted downward from the liquid droplet nozzle 5 to be thereby sprayed to the spraying regions T1 covered with the SC-1 liquid film. Thus, the carbonated water droplets are sprayed over the entire upper surface of the substrate W. Foreign matter such as particles adhering to the upper surface of the substrate W is physically removed by the impingement of the liquid droplets on the substrate W. The bonding force of the foreign matter to the substrate W is reduced by slightly dissolving the substrate W with the SC-1. Thus, the foreign matter is more reliably removed. Since the carbonated water droplets are sprayed to the spraying regions T1 with the upper surface of the substrate W entirely covered with the liquid film, the foreign matter is substantially prevented from adhering again to the substrate W. In this manner, the second covering step and the cleaning step are performed.

After the reciprocal pivot operation of the nozzle arm 21 is performed a predetermined number of times, the controller 8 opens the drain valve 16 to stop spraying the liquid droplets from the liquid droplet nozzle 5. Further, the controller 8 closes the open-state first and second protection liquid valves 26, 29 to stop spouting the SC-1 from the first and second protection liquid nozzles 6, 7.

Figure 16A:
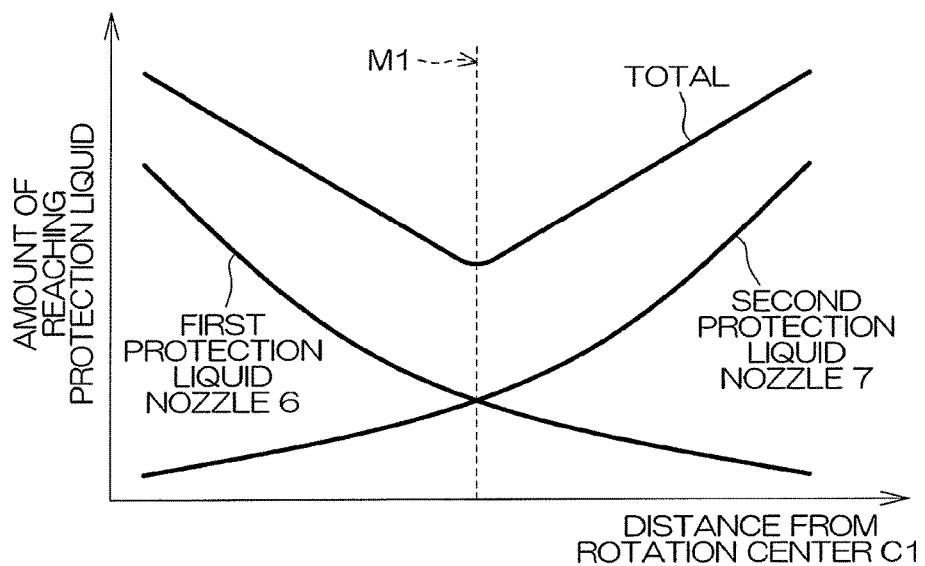
FIG. 16A is a graph schematically showing relationships between the amount of the protection liquid reaching the spraying regions and a distance from a rotation center to the spraying regions at different positions on the upper surface of the substrate.

FIG. 16A is a graph schematically showing relationships between the amount of the protection liquid reaching the spraying regions T1 and a distance from the rotation center C1 to the spraying regions T1 at different positions on the upper surface of the substrate.

The position and the attitude (first position/attitude condition) of the first protection liquid nozzle 6 is optimized for the state in which the spraying regions T1 are located on the upper surface center portion of the substrate W. In this case, the protection liquid supplied to the substrate W is efficiently supplied to the spraying regions T1 when the spraying regions T1 are located on the upper surface center portion of the substrate W. However, the amount of the protection liquid reaching the spraying regions T1 is reduced in inverse proportion to the increase in the distance between the rotation center C1 and the spraying regions T1 (as the spraying regions T1 are moved toward the periphery of the substrate W). When the spraying regions T1 are located on the upper surface peripheral portion of the substrate W, only a small amount of the protection liquid reaches the spraying regions T1. In this case, the protection liquid should be spouted at a higher flow rate from the first protection liquid nozzle 6 in order to spread the protection liquid supplied from the first protection liquid nozzle 6 to the spraying regions T1 located on the upper surface peripheral portion of the substrate W.

The position and the attitude (second position/attitude condition) of the second protection liquid nozzle 7 is optimized for the state in which the spraying regions T1 are located on the upper surface peripheral portion of the substrate W. In this case, the protection liquid supplied to the substrate W is efficiently supplied to the spraying regions T1 when the spraying regions T1 are located on the upper surface peripheral portion of the substrate W. However, the amount of the protection liquid reaching the spraying regions T1 is reduced in inverse proportion to the decrease in the distance between the rotation center C1 and the spraying regions T1 (as the spraying regions T1 are moved toward the rotation center C1 of the substrate W). When the spraying regions T1 are located on the upper surface center portion of the substrate W, only a small amount of the protection liquid reaches the spraying regions T1. In this case, the protection liquid should be spouted at a higher flow rate from the second protection liquid nozzle 7 in order to spread the protection liquid supplied from the second protection liquid nozzle 7 to the spraying regions T1 located on the upper surface center portion of the substrate W.

In the third exemplary treatment process, with the spraying regions T1 located on the upper surface center portion of the substrate W, the protection liquid spouted from the first protection liquid nozzle 6 effectively functions to be efficiently supplied to the spraying regions T1. Further, with the spraying regions T1 located on the upper surface peripheral portion of the substrate W, the protection liquid spouted from the second protection liquid nozzle 7 effectively functions to be efficiently supplied to the spraying regions T1.

With the spraying regions T1 located on a portion of the substrate W between the rotation center C1 and the upper surface peripheral portion of the substrate W, the protection liquid spouted from the first and second protection liquid nozzles 6, 7 is supplied at a moderately high total supply flow rate to the spraying regions T1, though the efficiency of the supply of the protection liquid spouted from the first and second protection liquid nozzles 6, 7 is not high. This is because the first and second protection liquid nozzles 6, 7 are optimized for the different positions. When the spraying regions T1 are located on the upper surface intermediate portion M1 of the substrate W, the SC-1 is supplied to the spraying regions T1 from the first and second protection liquid nozzles 6, 7 at the lowest efficiency.

Figure 16B:
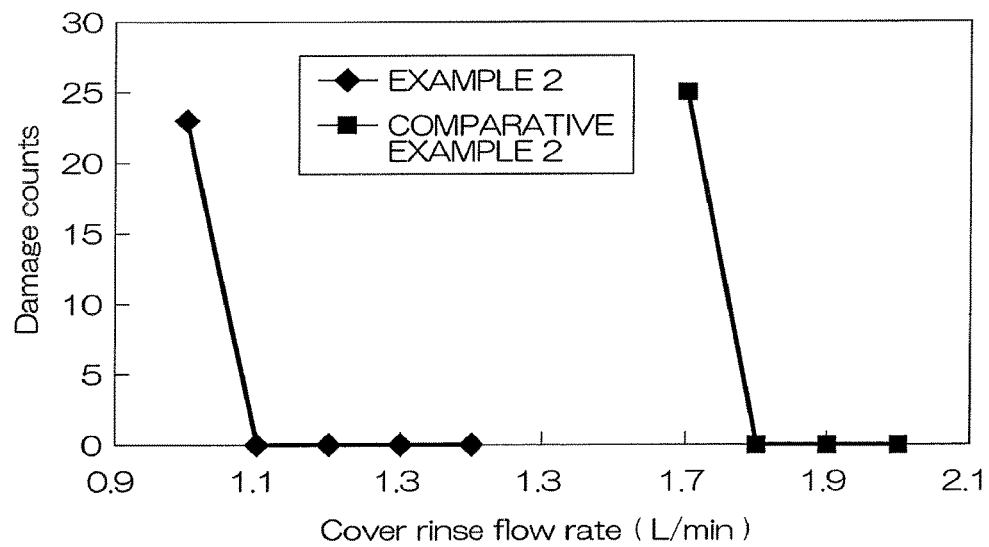
FIG. 16B is a graph showing relationships between the flow rate of the protection liquid supplied to the substrate and the number of damages of the substrate in Example 2 and Comparative Example 2.

FIG. 16B is a graph showing relationships between the flow rate of the protection liquid supplied to the substrate W and the number of damages of the substrate W in Example 2 and Comparative Example 2.

In Example 2, the second covering step and the cleaning step were performed by spouting the protection liquid from both of the first and second protection liquid nozzles 6, 7 as in the third exemplary treatment process described above. In Comparative Example 2, the second covering step and the cleaning step were performed by spouting the protection liquid only from the first protection liquid nozzle 6. Substrates W each having a thin polysilicon film (having a thickness of 37 nm) formed on an upper surface thereof were used. The numbers of damages shown in FIG. 16B are measurement values obtained when the substrates W were treated under substantially the same conditions except for the flow rate of the protection liquid supplied to the substrates W. More specifically, the rotation speed of the substrate was 300 rpm. The time required for each reciprocal pivot operation (reciprocal half scan) of the nozzle arm 21 was 15 sec, and the half scan was performed twice.

In Comparative Example 2, a greater number of damages were observed when the flow rate of the protection liquid supplied to the substrate W was less than 1.8 L/min. In Example 2, in contrast, a very small number of damages were observed even when the flow rate of the protection liquid supplied to the substrate W was 1.1 L/min. Therefore, the damage of the substrate W can be suppressed without increasing the flow rate of the protection liquid to be supplied to the substrate W in the third exemplary treatment process.

In the third exemplary treatment process, as described above, the protection liquid is spouted from both of the first and second protection liquid nozzles 6, 7, while the spraying regions T1 are moved. The position and the attitude of the first protection liquid nozzle 6 are optimized so that, with the spraying regions T1 located on the upper surface center portion of the substrate W, the protection liquid spouted from the first protection liquid nozzle 6 spreads over the entire spraying regions T1. The position and the attitude of the second protection liquid nozzle 7 are optimized so that, with the spraying regions T1 located on the upper surface peripheral portion of the substrate W, the protection liquid spouted from the second protection liquid nozzle 7 spreads over the entire spraying regions T1.

Therefore, the protection liquid spouted from the first protection liquid nozzle 6 is efficiently supplied to the spraying regions T1 when the spraying regions T1 are located on the upper surface center portion of the substrate W, and the protection liquid spouted from the second protection liquid nozzle 7 is efficiently supplied to the spraying regions T1 when the spraying regions T1 are located on the upper surface peripheral portion of the substrate W. Further, with the spraying regions T1 located on the portion of the substrate W between the rotation center C1 and the upper surface peripheral portion of the substrate W, the protection liquid spouted from the first and second protection liquid nozzles 6, 7 is supplied at a moderately high total supply flow rate to the spraying regions T1. This is because the first and second protection liquid nozzles 6, 7 are optimized for the different positions. Therefore, even if the protection liquid is supplied at a lower flow rate (flow rate AF) to the substrate W, the spraying regions T1 located on the portion of the substrate W between the rotation center C1 and the upper surface peripheral portion of the substrate W can be entirely covered with the protection liquid film.

As a result, the spraying regions T1 can be entirely covered with the protection liquid film by supplying the protection liquid at a lower flow rate to the substrate W irrespective of the position of the spraying regions T1 on the upper surface of the substrate W. Thus, the damage of the substrate W can be suppressed without increasing the flow rate of the protection liquid to be supplied to the substrate W.

Figure 17A:
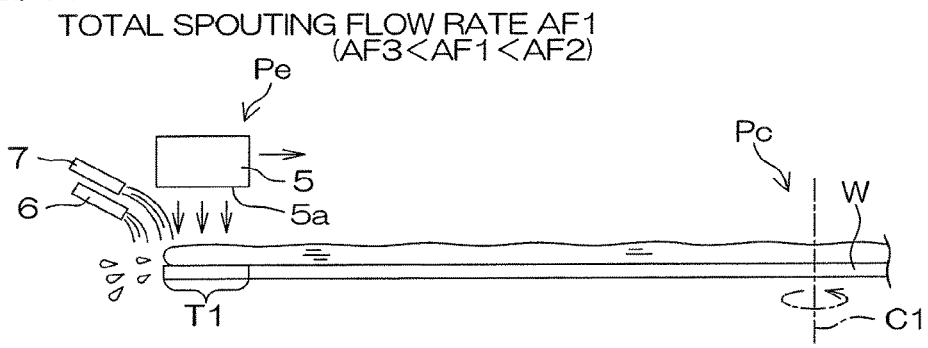
FIGS. 17A to 17C are diagrams for explaining a fourth exemplary treatment process to be performed by the substrate treatment apparatus shown in FIG. 1.
Figure 17B:
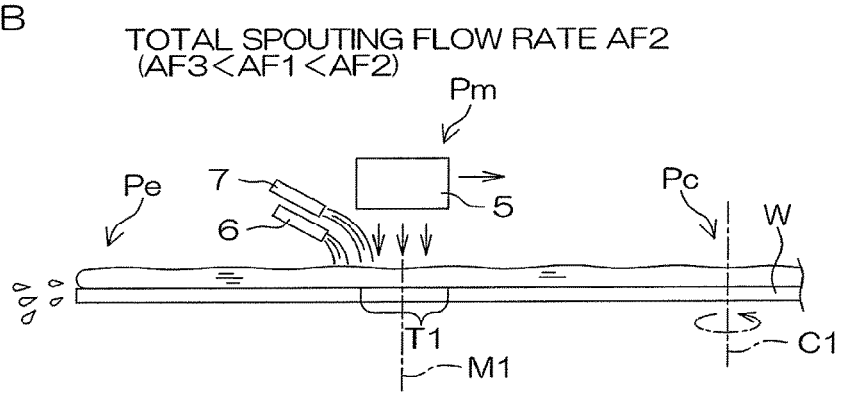
Figure 17C:
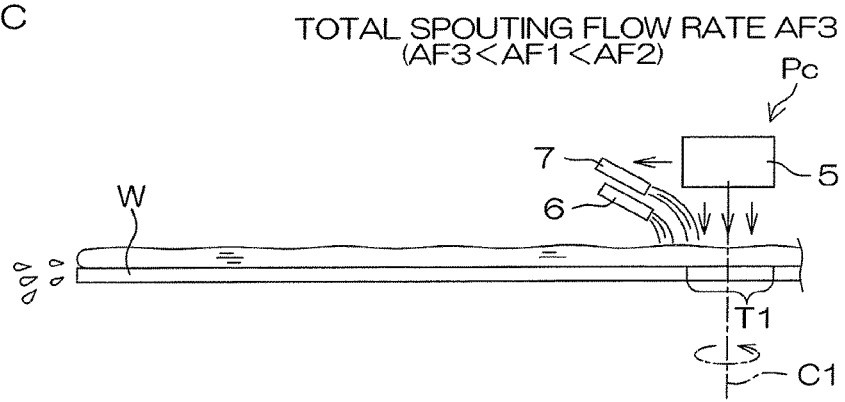

FIGS. 17A to 17C are diagrams for explaining a fourth exemplary treatment process to be performed on the substrate W by the substrate treatment apparatus 1. FIGS. 17A to 17C show a cleaning step and a second covering step of the fourth exemplary treatment process. In the fourth exemplary treatment process, only the cleaning step and the second covering step are different from those of the first exemplary treatment process. Since the other steps are performed in the same manner as in the first exemplary treatment process, duplicate description will be omitted. Referring to FIGS. 1 and 17A to 17C, the cleaning step and the second covering step of the fourth exemplary treatment process will be described.

The cleaning step and the second covering step of the fourth exemplary treatment process differ from the cleaning step and the second covering step of the third exemplary treatment process in that the flow rates of the protection liquid to be spouted from the first and second protection liquid nozzles 6, 7 are changed according to the position of the spraying regions T1 on the upper surface of the substrate W. {In the fourth exemplary treatment process, more} More specifically, the protection liquid is spouted at higher flow rates from the first and second protection liquid nozzles 6, 7 when the spraying regions T1 are located on the upper surface peripheral portion of the substrate W than when the spraying regions T1 are located on the upper surface center portion of the substrate W.

The controller 8 controls the nozzle movement mechanism 20 to move the liquid droplet nozzle 5 and the first and second protection liquid nozzles 6, 7 from the home positions (not shown) defined outside the rotation range of the substrate W to above the spin chuck 2 and locate the lower surface 5a of the liquid droplet nozzle 5 adjacent the upper surface peripheral portion of the substrate W. That is, the liquid droplet nozzle 5 is located at the peripheral position Pe.

Thereafter, the controller 8 opens the first and second protection liquid valves 26, 29 to spout the SC-1 from both of the first and second protection liquid nozzles 6, 7, while causing the spin chuck 2 to rotate the substrate W. As described above, the opening degree of the flow rate regulating valve 30 is controlled so that the total spouting flow rate of the protection liquid to be spouted from the first and second protection liquid nozzles 6, 7 is regulated at a predetermined lower flow rate AF1 (e.g., about 1.0 L/min). More specifically, the SC-1 is spouted at a spouting flow rate of about 0.5 L/min from each of the first and second protection liquid nozzles 6, 7.

The controller 8 spouts liquid droplets of the carbonated water from the liquid droplet nozzle 5, while spouting the SC-1 from the first and second protection liquid nozzles 6, 7. The multiplicity of carbonated water droplets are spouted downward from the liquid droplet nozzle 5, whereby the spraying regions T1 are located on the upper surface peripheral portion of the substrate W. The SC-1 spouted from the first and second protection liquid nozzles 6, 7 spreads over the entire spraying regions T1 located on the upper surface peripheral portion of the substrate W to form a liquid film of the SC-1, and the multiplicity of carbonated water droplets are sprayed from the liquid droplet nozzle 5 to the spraying regions T1 covered with the SC-1 liquid film.

Further, the controller 8 causes the nozzle movement mechanism 20 to move the liquid droplet nozzle 5 toward the center position Pc on the upper surface of the substrate W, as shown in FIG. 17A, while rotating the substrate W at the predetermined rotation speed. Thus, the spraying regions T1 are moved toward the rotation center C1 of the substrate W on the upper surface of the substrate W, while being covered with the SC-1 liquid film.

The controller 8 gradually increases the opening degree of the regulating valve 30 to increase the spouting flow rates of the protection liquid to be spouted from the first protection liquid nozzle 6 and the second protection liquid nozzle 7, as the spraying regions T1 is moved away from the periphery of the substrate W.

When the liquid droplet nozzle 5 passes through the intermediate position Pm (more specifically, the middle position M between the spraying regions T1 passes through the upper surface intermediate portion M1 of the substrate W), as shown in FIG. 17B, the opening degree of the flow rate regulating valve 30 is increased so that the total spouting flow rate of the protection liquid to be spouted from the first and second protection liquid nozzles 6, 7 is equal to a predetermined second flow rate AF2 (e.g., about 1.3 L/min). At this time, the SC-1 is spouted at a spouting flow rate of about 0.65 L/min from each of the first and second protection liquid nozzles 6, 7. It is noted that the intermediate portion M1 of the substrate W is a portion of the substrate W intermediate between the rotation center C1 of the substrate W and the periphery of the substrate W (where the substrate W has a diameter of 300 mm, the intermediate portion M1 is positioned 75 mm apart from the rotation center C1).

After the spraying regions T1 pass through the upper surface intermediate portion M1 of the substrate W, the controller 8 gradually reduces the opening degree of the regulating valve 30 to reduce the flow rates of the protection liquid to be spouted from the first protection liquid nozzle 6 and the second protection liquid nozzle 7 as the spraying regions T1 are moved closer to the rotation center C1 of the substrate W.

As shown in FIG. 17C, the opening degree of the flow rate regulating valve 30 is reduced so that, with the liquid droplet nozzle 5 located at the center position Pc, the total spouting flow rate of the protection liquid to be spouted from the first and second protection liquid nozzles 6, 7 is equal to a predetermined third flow rate AF3 (e.g., about 0.7 L/min). At this time, the CS-1 is spouted at a spouting flow rate of about 0.35 L/min from each of the first and second protection liquid nozzles 6, 7.

When the liquid droplet nozzle 5 reaches the center position Pc, the controller 8 controls the pivot mechanism 22 to reverse the pivoting direction of the nozzle arm 21. Thus, the liquid droplet nozzle 5 starts moving from the center position Pc toward the peripheral position Pe. Therefore, the liquid droplet nozzle 5 and the first and second protection liquid nozzles 6, 7 are moved toward the peripheral position Pe, while the carbonated water droplets are sprayed from the liquid droplet nozzle 5 and the SC-1 is spouted from the first and second protection liquid nozzles 6, 7. Thus, the spraying regions T1 are moved toward the periphery of the substrate W on the upper surface of the substrate W, while being covered with the SC-1 liquid film. The controller 8 gradually increases the opening degree of the regulating valve 30, as the spraying regions T1 are moved away from the rotation center C1 of the substrate W before reaching the upper surface intermediate portion M1 of the substrate W. Further, the controller 8 gradually reduces the opening degree of the regulating valve 30, as the spraying regions T1 are moved toward the periphery of the substrate W after passing through the upper surface intermediate portion M1 of the substrate W.

After the reciprocal pivot operation of the nozzle arm 21 is performed the predetermined number of times, the controller 8 opens the drain valve 16 to stop spraying the liquid droplets from the liquid droplet nozzle 5. Further, the controller 8 closes the open-state first and second protection liquid valves 26, 29 to stop spouting the SC-1 from the first and second protection liquid nozzles 6, 7.

When the spraying regions T1 are located at the upper surface intermediate portion M1 of the substrate W, as described above, the SC-1 spouted from the first and second protection liquid nozzles 6, 7 is supplied to the spraying regions T1 at the lowest efficiency. When the spraying regions T1 are located at this position, the total spouting flow rate of the protection liquid to be spouted from the first and second protection liquid nozzles 6, 7 is set at the second flow rate AF2 that is the maximum flow rate (e.g., about 1.3 L/min). Therefore, the spraying regions T1 can be entirely covered with the protection liquid film even if the spraying regions T1 are located at the upper surface intermediate portion M1 of the substrate W.

When the spraying regions T1 are located on the upper surface center portion of the substrate W and on the upper surface peripheral portion of the substrate W, the SC-1 spouted from the first and second protection liquid nozzles 6, 7 is efficiently supplied to the spraying regions T1. Therefore, the total spouting flow rate of the protection liquid to be spouted from the first and second protection liquid nozzles 6, 7 can be reduced. Particularly, where the spraying regions T1 are located on the upper surface center portion of the substrate W, the SC-1 spouted from the first and second protection liquid nozzles 6, 7 is more efficiently supplied to the spraying regions T1. Therefore, even if the flow rate of the SC-1 to be supplied to the substrate W is reduced to the third flow rate AF3 (e.g., about 0.7 L/min), the spraying regions T1 can be entirely covered with the protection liquid film. This makes it possible to further reduce the total flow rate of the protection liquid to be supplied to the substrate W while suppressing the damage of the substrate W.

Figure 18:
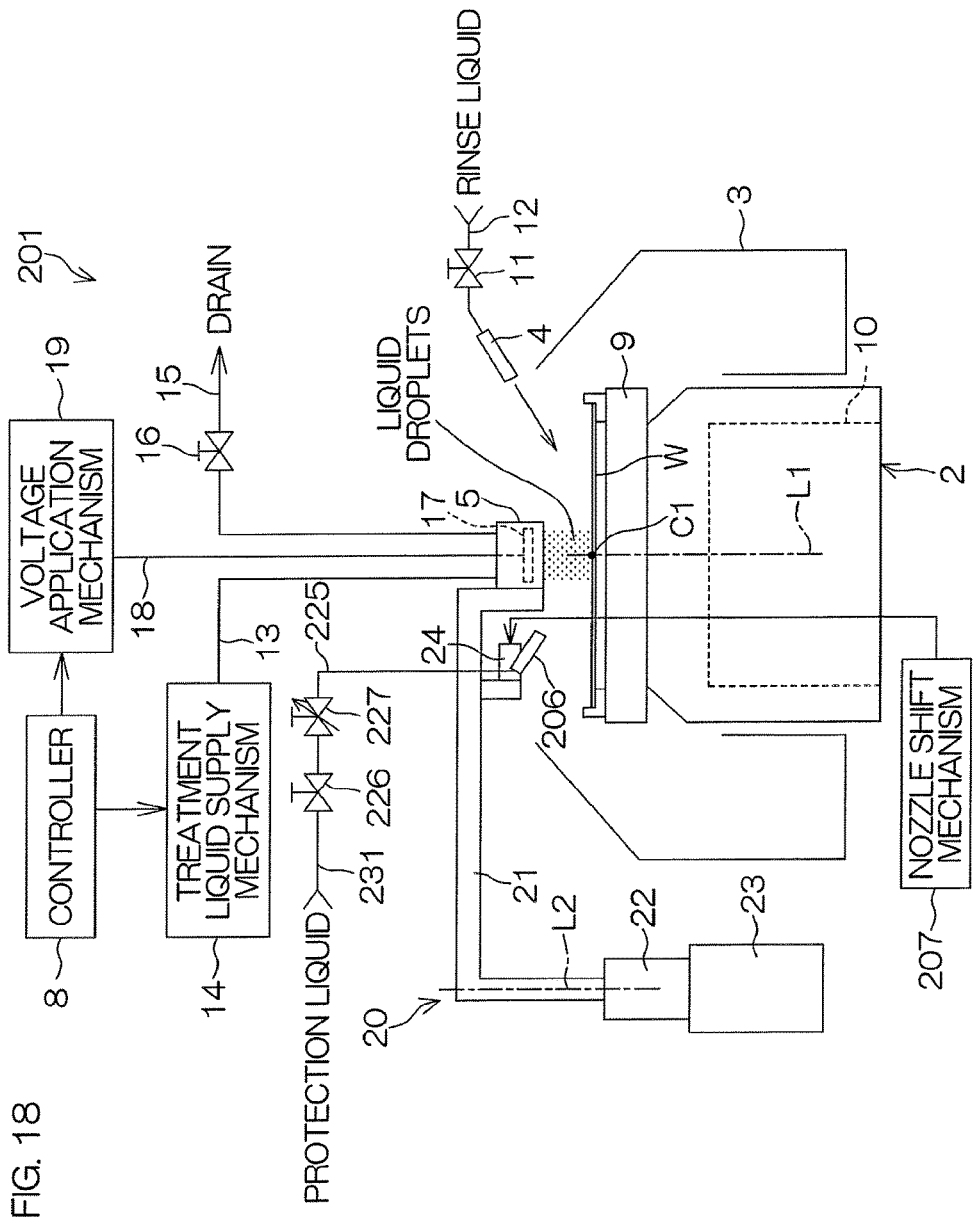
FIG. 18 is a diagram schematically showing the construction of a substrate treatment apparatus according to a second embodiment of the present invention.

FIG. 18 is a diagram schematically showing the construction of a substrate treatment apparatus 201 according to a second embodiment of the present invention. In FIG. 18, components of the substrate treatment apparatus 201 common to the substrate treatment apparatus 1 according to the first embodiment will be designated by the same reference characters, and duplicate description will be omitted.

The substrate treatment apparatus 201 according to the second embodiment has substantially the same construction as the substrate treatment apparatus 1 according to the first embodiment except for the protection liquid nozzle. The substrate treatment apparatus 201 includes a third protection liquid nozzle 206 instead of the first and second protection liquid nozzles 6, 7 of the first embodiment, and further includes a nozzle shift mechanism 207 which shifts the position and the attitude of the third protection liquid nozzle 206.

The third protection liquid nozzle 206 is held by the nozzle holder 24 attached to the nozzle arm 21. When the pivot mechanism 22 pivots the nozzle arm 21, therefore, the third protection liquid nozzle 206 is horizontally moved together with the liquid droplet nozzle 5 along the path X1 (see FIG. 2). The nozzle shift mechanism 207 shifts the position and the attitude of the third protection liquid nozzle 206 by changing the position of the nozzle holder 24 and angles of the third protection liquid nozzle 206 with respect to the vertical direction and the horizontal direction relative to the spin chuck 2.

The third protection liquid nozzle 206 is connected to a third protection liquid supply pipe 225 in which a third protection liquid valve 226 and a flow rate regulating valve 227 are provided. With the third protection liquid valve 226 open, the protection liquid is spouted from the third protection liquid nozzle 206 toward the upper surface of the substrate W. With the third protection liquid valve 226 closed, on the other hand, the spouting of the protection liquid from the third protection liquid nozzle 206 is stopped. The spouting rate of the protection liquid to be spouted from the third protection liquid nozzle 206 is changed by controlling the opening degree of the flow rate regulating valve 227 by the controller 8. Examples of the protection liquid to be supplied to the third protection liquid nozzle 206 include a rinse liquid and a chemical liquid such as SC-1.

The third protection liquid nozzle 206 has a third outlet port 243 (see FIGS. 19 to 22) which spouts the protection liquid. The third outlet port 243 is located at a lower height level than the upper end of the liquid droplet nozzle 5. The third outlet port 243 has, for example, a round shape. The shape of the third outlet port 243 is not limited to the round shape, but may be an oval shape or a slit shape.

In the substrate treatment apparatus 201, at least one of the position and the attitude of the third protection liquid nozzle 206 can be shifted according to the position of the spraying regions T1 on the upper surface of the substrate W. In a fifth exemplary treatment process to be performed by the substrate treatment apparatus 201 (to be described later), the third protection liquid nozzle 206 is vertically moved according to the position of the spraying regions T on the upper surface of the substrate W.

Figure 19:
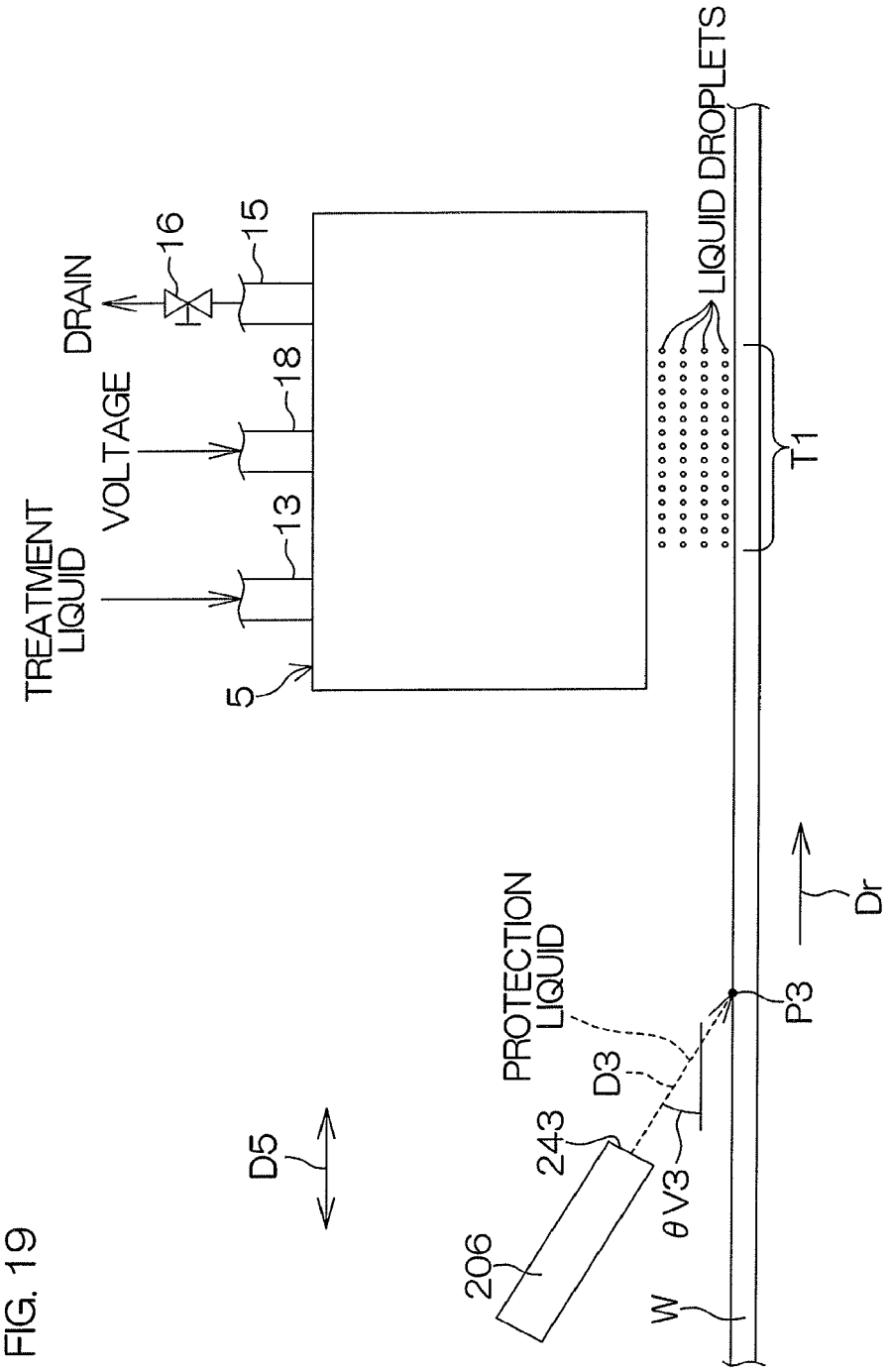
FIG. 19 is a schematic side view showing a positional relationship between a liquid droplet nozzle and a third protection liquid nozzle of FIG. 18 observed when spraying regions are located on an upper surface center portion of a substrate.
Figure 20:
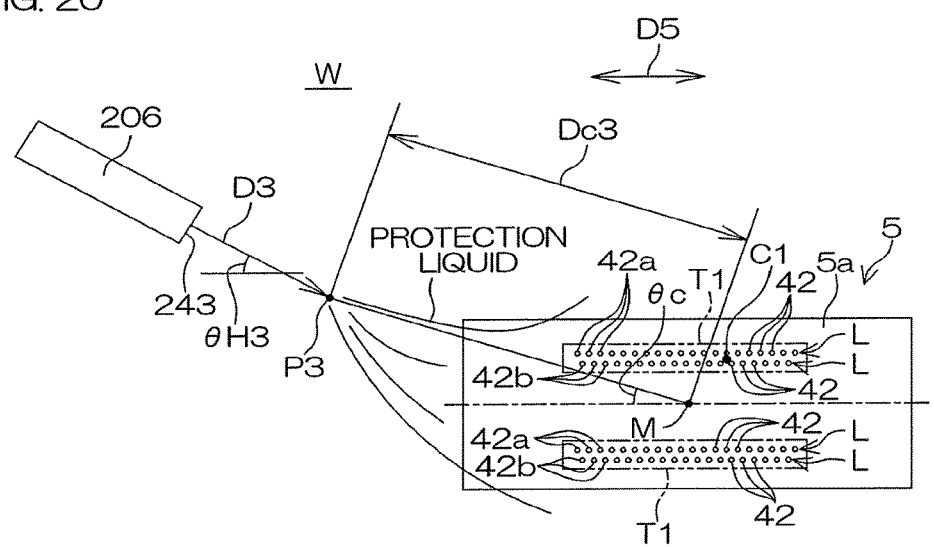
FIG. 20 is a schematic plan view showing the positional relationship between the liquid droplet nozzle and the third protection liquid nozzle of FIG. 18 observed when the spraying regions are located on the upper surface center portion of the substrate.

FIGS. 19 and 20 are schematic diagrams showing a positional relationship between the liquid droplet nozzle 5 and the third protection liquid nozzle 206 observed when the spraying regions T1 are located on the upper surface center portion of the substrate W. FIG. 19 is a side view, and FIG. 20 is a plan view.

Where the spraying regions T1 are located on the upper surface center portion of the substrate W, the third protection liquid nozzle 206 spouts the protection liquid toward a third liquid application position P3. The position and the attitude of the third protection liquid nozzle 206 shown in FIGS. 19 and 20 are herein referred to as "first position/attitude condition."

The third liquid application position P3 is located upstream of the spraying regions T1 with respect to the rotation direction Dr of the substrate W. A distance Dc3 (see FIG. 20) from the third liquid application position P3 to the middle position M between the spraying regions T1 is, for example, 15 to 40 mm. The third outlet port 243 spouts the protection liquid in a third spouting direction D3 toward the third liquid application position P3. In other words, the protection liquid spouted from the third outlet port 243 is incident in the third spouting direction D3 on the third liquid application position P3 on the substrate W. The third spouting direction D3 extends from the third outlet port 243 toward the third liquid application position P3, and extends from the third outlet port 243 toward the liquid droplet nozzle 5 as seen in plan. The third spouting direction D3 is tilted with respect to the longitudinal direction D5. As seen in plan, an angle θH3 (see FIG. 20) defined between the longitudinal direction D5 and the third spouting direction D3 is set to a predetermined angle, for example, in the range of 25 to 35 degrees.

As shown in FIG. 19, the third spouting direction D3 is tilted toward the spraying regions T1 with respect to the vertical direction. That is, the third liquid application position P3 is located between the third outlet port 243 and the spraying regions T1 with respect to the horizontal direction. The third spouting direction D3 is tilted with respect to the upper surface of the substrate W. An angle (incident angle) θV3 (see FIG. 19) defined between the upper surface of the substrate W and the third spouting direction D3 is set to a predetermined angle, for example, in the range of 10 to 40 degrees.

Figure 21:
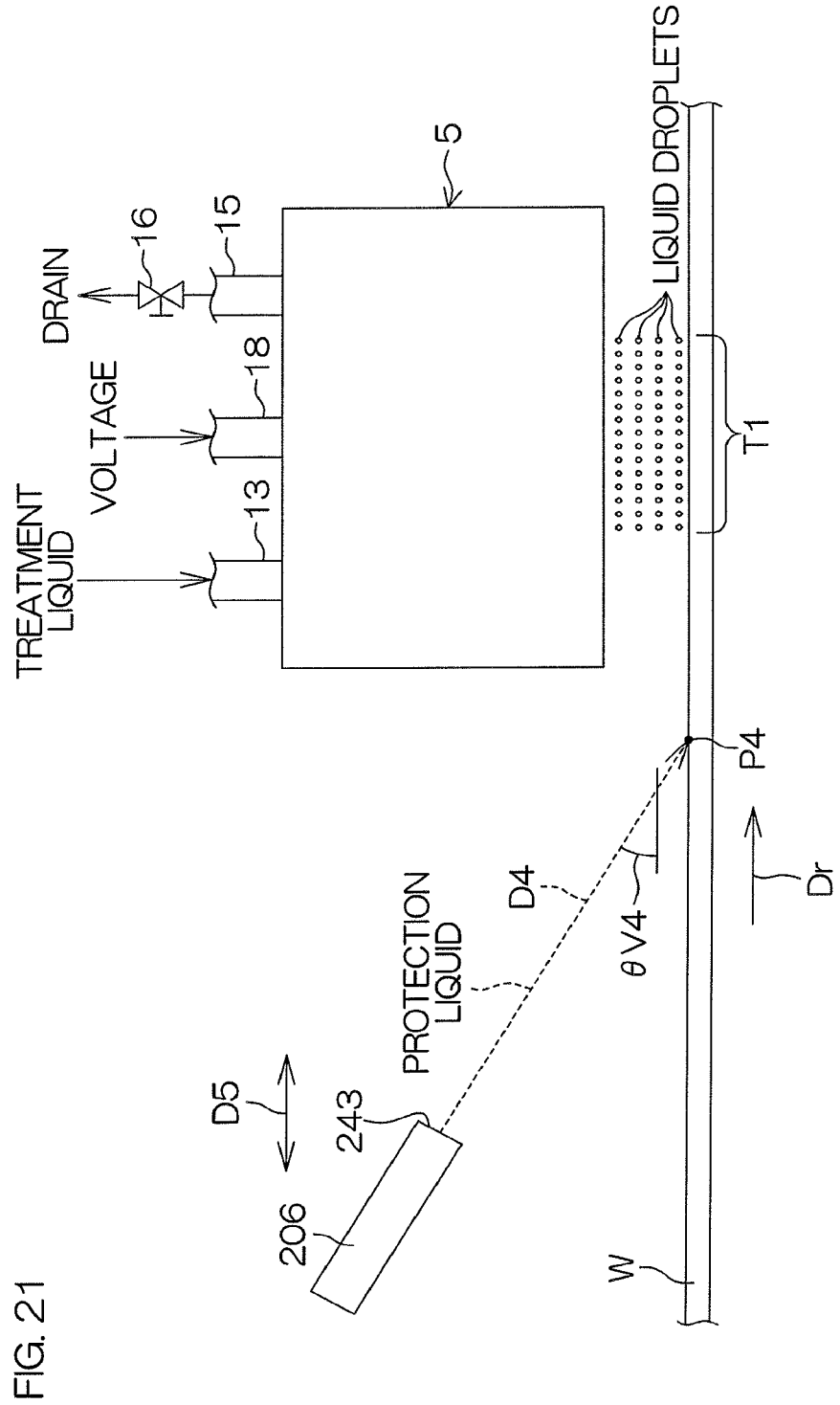
FIG. 21 is a schematic side view showing a positional relationship between the liquid droplet nozzle and the third protection liquid nozzle of FIG. 18 observed when the spraying regions are located on an upper surface peripheral portion of the substrate.
Figure 22:
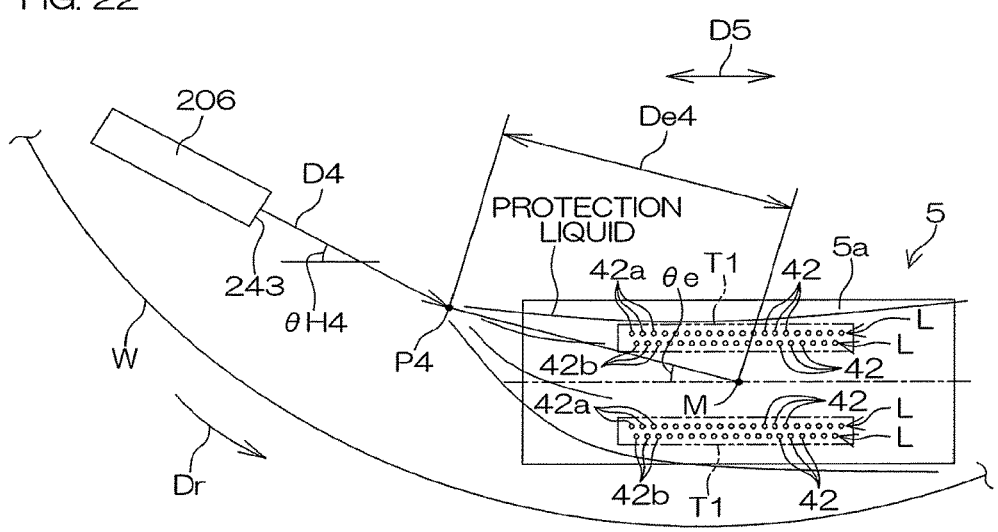
FIG. 22 is a schematic plan view showing the positional relationship between the liquid droplet nozzle and the third protection liquid nozzle of FIG. 18 observed when the spraying regions are located on the upper surface peripheral portion of the substrate.

FIGS. 21 and 22 are schematic diagrams showing a positional relationship between the liquid droplet nozzle 5 and the third protection liquid nozzle 206 observed when the spraying regions T1 are located on the upper surface peripheral portion of the substrate W. FIG. 21 is a side view, and FIG. 22 is a plan view.

Where the spraying regions T1 are located on the upper surface peripheral portion of the substrate W, the third protection liquid nozzle 206 spouts the protection liquid toward a fourth liquid application position P4 on the substrate W. The position and the attitude of the third protection liquid nozzle 206 shown in FIGS. 21 and 22 are herein referred to as "second position/attitude condition."

The fourth liquid application position P4 is located upstream of the spraying regions T1 with respect to the rotation direction Dr of the substrate W. A distance De4 (see FIG. 22) from the fourth liquid application position P4 to the middle position M between the spraying regions T1 is, for example, 15 to 40 mm. The third outlet port 243 spouts the protection liquid in a fourth spouting direction D4 toward the fourth liquid application position P4. In other words, the protection liquid spouted from the third outlet port 243 is incident in the fourth spouting direction D4 on the fourth liquid application position P4 on the substrate W. The fourth spouting direction D4 extends from the third outlet port 243 toward the fourth liquid application position P4, and extends from the third outlet port 243 toward the liquid droplet nozzle 5 as seen in plan. The fourth spouting direction D4 is tilted with respect to the longitudinal direction D5. As seen in plan, an angle θH4 (see FIG. 22) defined between the longitudinal direction D5 and the fourth spouting direction D4 is set to a predetermined angle, for example, in the range of 25 to 35 degrees.

As shown in FIG. 21, the fourth spouting direction D4 is tilted toward the spraying regions T1 with respect to the vertical direction. That is, the fourth liquid application position P4 is located between the third outlet port 243 and the spraying regions T1 with respect to the horizontal direction. The fourth spouting direction D4 is tilted with respect to the upper surface of the substrate W. An angle (incident angle) θV4 (see FIG. 21) defined between the upper surface of the substrate W and the fourth spouting direction D4 is set to a predetermined angle, for example, in the range of 10 to 40 degrees.

The first position/attitude condition of the third protection liquid nozzle 206 is optimized for the state in which the spraying regions T1 are located on the upper surface center portion of the substrate W. That is, the third liquid application position P3 (see FIG. 19), the angle θV3 (see FIG. 19) and the angle (incident angle) θH3 (see FIG. 20) provide a liquid application state such that, where the protection liquid is spouted from the third protection liquid nozzle 206 with the spraying regions T1 located on the upper surface center portion of the substrate W, the protection liquid most efficiently spreads over the entire spraying regions T1. In other words, the first position/attitude condition of the third protection liquid nozzle 206 is such that, where the protection liquid is spouted from the third protection liquid nozzle 206 with the spraying regions T1 located on the upper surface center portion of the substrate W, the protection liquid most efficiently spreads over the entire spraying regions T1.

The second position/attitude condition of the third protection liquid nozzle 206 is optimized for the state in which the spraying regions T1 are located on the upper surface peripheral portion of the substrate W. That is, the fourth liquid application position P4 (see FIG. 21), the angle θV4 (see FIG. 21) and the angle (incident angle) θH4 (see FIG. 22) provide a liquid application state such that, where the protection liquid is spouted from the third protection liquid nozzle 206 with the spraying regions T1 located on the upper surface peripheral portion of the substrate W, the protection liquid most efficiently spreads over the entire spraying regions T1. In other words, the second position/attitude condition of the third protection liquid nozzle 206 is such that, where the protection liquid is spouted from the third protection liquid nozzle 206 with the spraying regions T1 located on the upper surface peripheral portion of the substrate W, the protection liquid most efficiently spreads over the entire spraying regions T1.

In the third exemplary treatment process to be performed by the substrate treatment apparatus 201, the third protection liquid nozzle 206 assumes the same attitude but is located at vertically offset positions in the first position/attitude condition and in the second position/attitude condition. Therefore, the third outlet port 243 is located at vertically offset positions when the third protection liquid nozzle 206 is in the first position/attitude condition and in the second position/attitude condition. As a result, the fourth liquid application position P4 is located closer to the spraying regions T1 than the third liquid application position P3 (Dc3 (see FIG. 20) >De4 (see FIG. 22)). The fourth liquid application position P4 is located on an extension of a line connecting the third outlet port 243 to the third liquid application position P3.

Further, the third spouting direction D3 is equal to the fourth spouting direction D4. That is, the angle θV4 (see FIG. 21) is equal to the angle θV3 (see FIG. 19), and the angle θH4 (see FIG. 22) is equal to the angle θH3 (see FIG. 20).

As long as the first and second position/attitude conditions of the third protection liquid nozzle 206 are respectively optimized for the upper surface center portion of the substrate W and for the upper surface peripheral portion of the substrate W, the third protection liquid nozzle 206 may assume different attitudes with the third outlet ports 243 located at different positions in the first position/attitude condition and in the second position/attitude condition. In this case, the third spouting direction D3 is different from the fourth spouting direction D4.

The first and second position/attitude conditions may be set so that the liquid application positions P3, P4 of the spouted protection liquid coincide with each other. In this case, however, the third spouting direction D3 and the fourth spouting direction D4 should be different from each other.

Referring to FIGS. 18 to 20, how the protection liquid flows when the spraying regions T1 are located on the upper surface center portion of the substrate W. The controller 8 spouts the protection liquid from the third protection liquid nozzle 206 assuming the first position/attitude condition, while causing the spin chuck 2 to rotate the substrate W. Since the protection liquid is supplied to the rotating substrate W, the protection liquid supplied to the substrate W is accelerated radially (in the rotation radius direction) due to contact with the substrate W and accelerated in the rotation direction Dr (see FIG. 22) of the substrate W. Therefore, the protection liquid supplied to the substrate W flows in the rotation direction, while spreading radially from the third liquid application position P3. Since the third spouting direction D3 is tilted with respect to the vertical direction and the rotation speed of the substrate W is lower in the center portion of the substrate W, the protection liquid supplied to the upper surface center portion of the substrate W extensively spreads in a triangular shape having a vertex at the third liquid application position P3.

Referring to FIGS. 18, 21 and 22, how the protection liquid flows when the spraying regions T1 are located on the upper surface peripheral portion of the substrate W. The controller 8 spouts the protection liquid from the third protection liquid nozzle 206 assuming the second position/attitude condition, while causing the spin chuck 2 to rotate the substrate W. Since the protection liquid is supplied to the rotating substrate W, the protection liquid supplied to the substrate W is accelerated radially (in the rotation radius direction) due to contact with the substrate W and accelerated in the rotation direction Dr of the substrate W. Therefore, the protection liquid supplied to the substrate W flows in the rotation direction, while spreading radially from the fourth liquid application position P4. Since the rotation speed of the substrate W is higher in the peripheral portion of the substrate W, the protection liquid supplied to the upper surface peripheral portion of the substrate W spreads in an acute angle triangular shape having a vertex at the fourth liquid application position P4 (generally linearly circumferentially of the substrate W).

FIGS. 23A to 23F are diagrams for explaining a fifth exemplary treatment process to be performed on the substrate W by the substrate treatment apparatus 201 according to the second embodiment of the present invention.

In the fifth exemplary treatment process, only a cleaning step and a second covering step are different from those of the first exemplary treatment process to be performed by the substrate treatment apparatus 1. Since the other steps are performed in the same manner as in the first exemplary treatment process, duplicate description will be omitted. Referring to FIGS. 18 to 23F, the cleaning step and the second covering step of the fifth exemplary treatment process will be described.

Figure 23A:
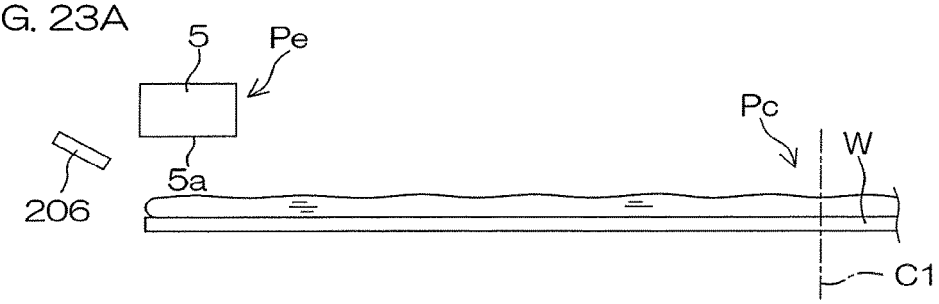
FIGS. 23A to 23F are diagrams for explaining a fifth exemplary treatment process to be performed on the substrate by the substrate treatment apparatus shown in FIG. 18.

As shown in FIG. 23A, the controller 8 controls the nozzle movement mechanism 20 to move the liquid droplet nozzle 5 and the third protection liquid nozzle 206 from home positions (not shown) defined outside the rotation range of the substrate W to above the spin chuck 2, and locate the lower surface 5a of the liquid droplet nozzle 5 adjacent the upper surface peripheral portion of the substrate W. That is, the liquid droplet nozzle 5 is located at the peripheral position Pe. In this state, the third protection liquid nozzle 206 is controlled in the second position/attitude condition (see FIGS. 21 and 22).

Figure 23B:
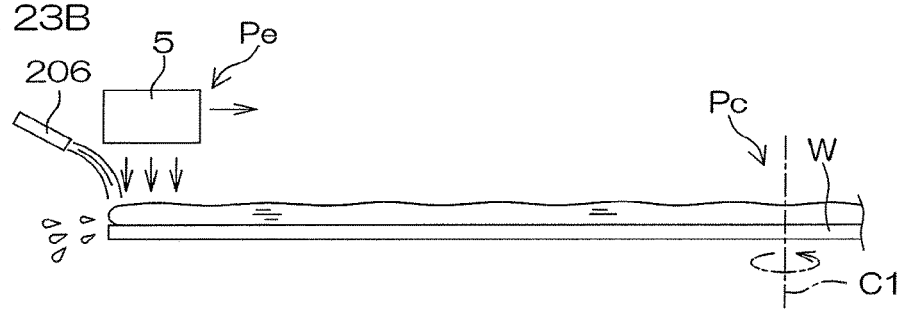

Thereafter, the controller 8 opens the third protection liquid valve 226 to spout the SC-1 from the third protection liquid nozzle 206, as shown in FIG. 23B, while causing the spin chuck 2 to rotate the substrate W. The opening degree of the flow rate regulating valve 227 is controlled so that the protection liquid is spouted from the third protection liquid nozzle 206 at a first spouting flow rate which is a predetermined lower flow rate (e.g., about 0.5 L/min). Therefore, the SC-1 is spouted at a spouting flow rate of about 0.5 L/min from the third protection liquid nozzle 206.

Further, the controller 8 spouts liquid droplets of the carbonated water from the liquid droplet nozzle 5, while spouting the SC-1 from the third protection liquid nozzle 206. The multiplicity of carbonated water droplets are spouted downward from the liquid droplet nozzle 5, whereby the spraying regions T1 are located on the upper surface peripheral portion of the substrate W. The SC-1 spouted from the third protection liquid nozzle 206 assuming the second position/attitude condition (see FIGS. 21 and 22) is applied to the fourth liquid application position P4 (see FIG. 21) on the upper surface of the substrate W. Then, the SC-1 spreads over the entire spraying regions T1 located on the upper surface peripheral portion of the substrate W to form a liquid film of the SC-1, and the multiplicity of carbonated water droplets are sprayed from the liquid droplet nozzle 5 to the spraying regions T1 covered with the SC-1 liquid film.

Further, as shown in FIG. 23B, the controller 8 causes the nozzle movement mechanism 20 to move the liquid droplet nozzle 5 toward the center position Pc on the upper surface of the substrate W, while rotating the substrate W at the predetermined rotation speed and spouting the SC-1 at the predetermined spouting flow rate from the third protection liquid nozzle 206.

Figure 23C:
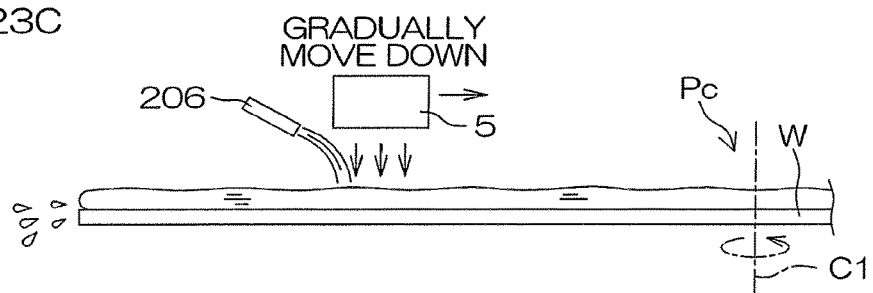

Thereafter, the liquid droplet nozzle 5 and the third protection liquid nozzle 206 are moved toward the center position Pc, as shown in FIG. 23C, while the carbonated water droplets are sprayed from the liquid droplet nozzle 5 and the SC-1 is spouted from the third protection liquid nozzle 206. Thus, the spraying regions T1 are moved toward the rotation center C1 of the substrate W on the upper surface of the substrate W, while being covered with the SC-1 liquid film.

Further, the controller 8 controls the nozzle shift mechanism 207 to gradually move down the third protection liquid nozzle 206 from the second position/attitude condition (see FIGS. 21 and 22) to the first position/attitude condition (see FIGS. 19 and 20), as the liquid droplet nozzle 5 is moved from the peripheral position Pe to the center position Pc. In the second embodiment, the third protection liquid nozzle 206 assumes the same attitude but is located at vertically offset positions in the first position/attitude condition (see FIGS. 19 and 20) and in the second position/attitude condition (see FIGS. 21 and 22). Therefore, the third protection liquid nozzle 206 is moved down in order to be shifted from the second position/attitude condition (see FIGS. 21 and 22) to the first position/attitude condition (see FIGS. 19 and 20). The downward movement speed of the third protection liquid nozzle 206 is constant. The downward movement of the third protection liquid nozzle 206 starts when the liquid droplet nozzle 5 leaves the peripheral position Pe, and ends when the liquid droplet nozzle 5 reaches the center position Pc.

Figure 23D:
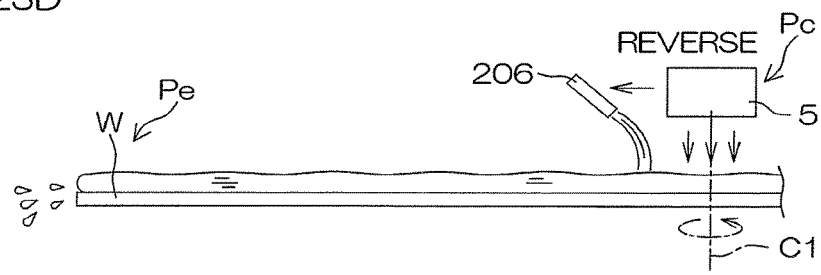

As shown in FIG. 23D, the third protection liquid nozzle 206 assumes the first position/attitude condition (see FIGS. 19 and 20) when the liquid droplet nozzle 5 reaches the center position Pc. The SC-1 spouted from the third protection liquid nozzle 206 assuming the first position/attitude condition is applied to the third liquid application position P3 (see FIGS. 21 and 22) on the upper surface of the substrate W. Then, the SC-1 spreads over the entire spraying regions T1 located on the upper surface center portion of the substrate W to form the SC-1 liquid film, and the multiplicity of carbonated water droplets are sprayed from the liquid droplet nozzle 5 to the spraying regions T1 covered with the SC-1 liquid film.

Figure 23E:
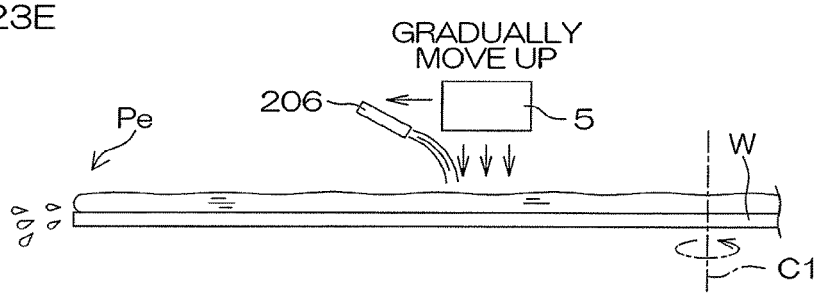

After the liquid droplet nozzle 5 reaches the center position Pc, the controller 8 controls the pivot mechanism 22 to reverse the pivoting direction of the nozzle arm 21. Thus, the liquid droplet nozzle 5 starts moving from the center position Pc toward the peripheral position Pe. Thereafter, the liquid droplet nozzle 5 and the third protection liquid nozzle 206 are moved toward the peripheral position Pe, while the carbonated water droplets are sprayed from the liquid droplet nozzle 5 and the SC-1 is spouted from the third protection liquid nozzle 206. Thus, the spraying regions T1 are moved toward the periphery of the substrate W on the upper surface of the substrate W, as shown in FIG. 23E, while being covered with the SC-1 liquid film.

As the liquid droplet nozzle 5 is moved from the center position Pc to the peripheral position Pe, the controller 8 controls the nozzle shift mechanism 207 to gradually move up the third protection liquid nozzle 206 from the first position/attitude condition (see FIGS. 19 and 20) to the second position/attitude condition (see FIGS. 21 and 22). The upward movement speed of the third protection liquid nozzle 206 is constant. The upward movement of the third protection liquid nozzle 206 starts when the liquid droplet nozzle 5 leaves the center position Pc, and ends when the liquid droplet nozzle 5 reaches the peripheral position Pe.

Figure 23F:
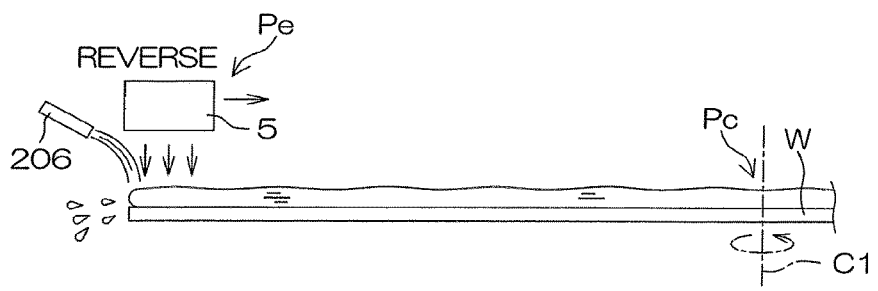

When the liquid droplet nozzle 5 thereafter reaches the peripheral position Pe, as shown in FIG. 23F, the controller 8 controls the pivot mechanism 22 to reverse the pivoting direction of the nozzle arm 21. Thus, the liquid droplet nozzle 5 starts moving from the peripheral position Pe toward the center position Pc.

After the reciprocal pivot operation of the nozzle arm 21 is performed a predetermined number of times, the controller 8 opens the drain valve 16 to stop spraying the liquid droplets from the liquid droplet nozzle 5. Further, the controller 8 closes the open-state third protection liquid valve 226 to stop spouting the SC-1 from the third protection liquid nozzle 206.

According to the second embodiment, as described above, when the spraying regions T1 are located on the center portion of the substrate W, the third protection liquid nozzle 206 is controlled in the first position/attitude condition (see FIGS. 19 and 20). The first position/attitude condition (see FIGS. 19 and 20) is optimized such that, with the spraying regions T1 located on the upper surface center portion of the substrate W, the protection liquid spouted from the third protection liquid nozzle 206 spreads over the entire spraying regions T1. Therefore, the spraying regions T1 located on the upper surface inner region IR of the substrate W can be entirely covered with the protection liquid film even if the protection liquid is supplied at a lower flow rate to the substrate W.

When the spraying regions T1 are located on the upper surface peripheral portion of the substrate W, the third protection liquid nozzle 206 is controlled in the second position/attitude condition (see FIGS. 21 and 22). The second position/attitude condition (see FIGS. 21 and 22) is optimized such that, with the spraying regions T1 located on the upper surface peripheral portion of the substrate W, the protection liquid spouted from the third protection liquid nozzle 206 spreads over the entire spraying regions T1. Therefore, the spraying regions T1 located on the upper surface outer region OR can be entirely covered with the protection liquid film even if the protection liquid is supplied at a lower flow rate to the substrate W.

As a result, the spraying regions T1 can be entirely covered with the protection liquid film by supplying the protection liquid at a lower flow rate to the substrate W irrespective of the position of the spraying regions T1 on the upper surface of the substrate W. Thus, the damage of the substrate W can be suppressed without increasing the flow rate of the protection liquid to be supplied to the substrate W.

While two embodiments of the present invention have thus been described, the invention may be embodied in other ways.

In the second embodiment, the third protection liquid nozzle 206 assumes the same attitude but is located at different vertical positions in the first position/attitude condition and in the second position/attitude condition, and the controller 8 controls the nozzle shift mechanism 207 to move up and down the third protection liquid nozzle 206 in order to shift the third protection liquid nozzle 206 between the first position/attitude condition and the second position/attitude condition. Where not only the position but also the attitude of the third protection liquid nozzle 206 is shifted between the first position/attitude condition and the second position/attitude condition, the controller 8 may control the nozzle shift mechanism 207 to move the third protection liquid nozzle 206 and shift the attitude of the third protection liquid nozzle 206.

Further, the nozzle shift mechanism 207 may be controlled to shift only the attitude of the third protection liquid nozzle 206 between the first position/attitude condition and the second position/attitude condition.

In the second embodiment described above, the position and the attitude of the third protection liquid nozzle 206 are shifted, while the spraying regions T1 are moved on the upper surface of the substrate W. Alternatively, the position and the attitude of the liquid droplet nozzle 5 may be shifted to shift the position and the attitude of the third protection liquid nozzle 206 relative to the liquid droplet nozzle 5.

In the first embodiment, the optimization of the position and the attitude of the first protection liquid nozzle 6 is based on the state in which the spraying regions T1 are located on the upper surface center portion of the substrate W, and the optimization of the position and the attitude of the second protection liquid nozzle 7 is based on the state in which the spraying regions T1 are located on the upper surface peripheral portion of the substrate W. Alternatively, the optimization of the position and the attitude of the first protection liquid nozzle 6 may be based on a state in which the spraying regions T1 are located at a predetermined position on the upper surface inner region IR of the substrate W excluding the upper surface center portion, and the optimization of the position and the attitude of the second protection liquid nozzle 7 may be based on a state in which the spraying regions T1 are located at a predetermined position on the upper surface outer region OR of the substrate W excluding the upper surface center portion.

In the second embodiment, the first position/attitude condition of the third protection liquid nozzle 206 is defined based on the state in which the spraying regions T1 are located on the upper surface center portion of the substrate W, and the second position/attitude condition of the third protection liquid nozzle 206 is defined based on the state in which the spraying regions T1 are located on the upper surface peripheral portion of the substrate W. Alternatively, the first position/attitude condition of the third protection liquid nozzle 206 may be defined based on a state in which the spraying regions T1 are located at a predetermined position on the upper surface inner region IR of the substrate W excluding the upper surface center portion, and the second position/attitude condition of the third protection liquid nozzle 206 may be defined based on a state in which the spraying regions T1 are located at a predetermined position on the upper surface outer region OR of the substrate W excluding the upper surface center portion.

In the first and second embodiments, the substrate treatment apparatuses 1, 201 are adapted to treat a disk-shaped substrate such as a semiconductor wafer. The substrate treatment apparatuses 1, 201 may be adapted to treat a polygonal substrate such as a glass substrate for a liquid crystal display device.

In the two embodiments described above, the main body 36 of the liquid droplet nozzle 5 is made of quartz for chemical resistance. Where the liquid droplets are spouted at a relatively high speed (e.g., about 20 to about 60 m/sec) for the treatment, the treatment liquid is liable to be electrically charged when flowing through the flow passage of the liquid droplet nozzle 5. Therefore, the liquid droplets are liable to be electrically charged to generate an electrostatic force, which may reduce the cleaning effect due to loss of the linearity of advancement of the liquid droplets. Further, the liquid droplets are liable to become less uniform in size to have greater sizes. Therefore, the liquid droplets are liable to have a greater kinetic energy to collapse a pattern formed on the substrate when impinging on the substrate. Further, fine mists occurring when the liquid droplets are spouted are liable to be attracted to the liquid droplet nozzle 5 due to the electrostatic force to adhere to the outer periphery of the liquid droplet nozzle 5 and condensed into water droplets, which may drip onto the substrate and the apparatus to result in contamination. These unwanted phenomena are remarkable particularly where nonconductive pure water is used as the treatment liquid.

These phenomena can be substantially prevented by imparting the treatment liquid or the flow passage interior wall of the liquid droplet nozzle 5 with electrical conductivity. The unwanted phenomena attributable to the electrostatic charges of the liquid droplets can be suppressed, for example, by using so-called carbonated water obtained by dissolving carbon dioxide gas in pure water, SC1, SC2 or other electrolytic solution as the treatment liquid. According to an experiment conducted by the inventors of the present invention, where carbonated water having a resistivity of not greater than 3 MΩ·cm was used as the treatment liquid, the damage of the substrate was suppressed. Where carbonated water having a resistivity of not greater than 1 MΩ·cm was used as the treatment liquid, the particle removal percentage was improved. Further, the unwanted phenomena can be substantially prevented by coating the flow passage interior wall of the quartz main body 36 of the liquid droplet nozzle 5 with an electric conductor such as gold or silver and grounding the conductor, or by inserting an electrically conductive rod in the flow passage and grounding the conductive rod.

Various design modifications may be made within the scope of the present invention defined by the appended claims.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application Nos. 2013-54246 and 2013-54247 filed in the Japan Patent Office on Mar. 15, 2013, the disclosure of which is incorporated herein by reference in its entirety.

What is claimed is:

1. A substrate treatment method comprising:
a substrate holding step of horizontally holding a substrate;
a first position/attitude setting step of setting a first protection liquid nozzle in a first position/attitude condition such that a first liquid application state is defined for the first protection liquid nozzle relative to a liquid droplet nozzle by at least one of:
a liquid application position at which a protection liquid spouted from the first protection liquid nozzle is applied on an upper surface of the substrate, and
an incident angle at which the protection liquid spouted from the first protection liquid nozzle is incident on the liquid application position for the first protection liquid nozzle;
a second position/attitude setting step of setting a second protection liquid nozzle in a second position/attitude condition such that a second liquid application state is defined for the second protection liquid nozzle relative to the liquid droplet nozzle by at least one of:
a liquid application position at which a protection liquid spouted from the second protection liquid nozzle is applied on the upper surface of the substrate, and
an incident angle at which the protection liquid spouted from the second protection liquid nozzle is incident on the liquid application position for the second protection liquid nozzle;
the second liquid application state being different from the first liquid application state;
a rotating step of rotating the held substrate about a vertical rotation axis;
a liquid droplet supplying step of spraying droplets of a treatment liquid from the liquid droplet nozzle to a spraying region on the upper surface of the held substrate;
a protection liquid spouting step of spouting the protection liquid to the upper surface of the substrate from both of the first and second protection liquid nozzles to form a liquid film of the protection liquid on the upper surface of the held substrate so that, with the spraying region covered with the protection liquid film, the treatment liquid droplets impinge on the spraying region; and
a nozzle moving step of, while maintaining the liquid droplet nozzle and the first and second protection liquid nozzles in predetermined positional relation with the protection liquid spouted from the first and second protection liquid nozzles, moving the liquid droplet nozzle and the first and second protection liquid nozzles so as to move the spraying region between an upper surface center portion of the substrate and an upper surface peripheral portion of the substrate,
wherein the first position/attitude condition is such that, with the spraying region located on the upper surface center portion of the substrate, the protection liquid spouted from the first protection liquid nozzle spreads over the entire spraying region, and
wherein the second position/attitude condition is such that, with the spraying region located on the upper surface peripheral portion of the substrate, the protection liquid spouted from the second protection liquid nozzle spreads over the entire spraying region.

2. The substrate treatment method according to claim 1, wherein spouting flow rates of the protection liquid to be spouted from the first and second protection liquid nozzles are changed according to a position of the spraying region on the upper surface of the substrate in the protection liquid spouting step.

3. The substrate treatment method according to claim 2, wherein the spouting flow rates of the protection liquid to be spouted from the first and second protection liquid nozzles are set at higher flow rate levels when the spraying region is located on the upper surface peripheral portion of the substrate than when the spraying region is located on the upper surface center portion of the substrate in the protection liquid spouting step.

4. The substrate treatment method according to claim 1, wherein
- the spouting flow rates of the protection liquid to be spouted from the first and second protection liquid nozzles are set at a first flow rate level when the spraying region is located at the upper surface peripheral portion of the substrate,
- the spouting flow rates of the protection liquid to be spouted from the first and second protection liquid nozzles are set at a second flow rate level when the spraying region is located at the upper surface center portion of the substrate, and
- the spouting flow rates of the protection liquid to be spouted from the first and second protection liquid nozzles are set at a third flow rate level higher than the first flow rate level and the second flow rate level when the spraying region is at a middle portion which is located between the upper surface peripheral portion and center portion in the protection liquid spouting step.

5. The substrate treatment method according to claim 1, wherein total spouting flow rates of the protection liquid to be spouted from the first and second protection liquid nozzles are changed according to a position of the spraying region on the upper surface of the substrate in the protection liquid spouting step.

6. The substrate treatment method according to claim 5, wherein the total spouting flow rates of the protection liquid to be spouted from the first and second protection liquid nozzles are set at higher flow rate levels when the spraying region is located at the upper surface peripheral portion of the substrate than when the spraying region is located at the upper surface center portion of the substrate in the protection liquid spouting step.

7. The substrate treatment method according to claim 1, wherein
- the total spouting flow rates of the protection liquid to be spouted from the first and second protection liquid nozzles are set at a first flow rate level when the spraying region is located at the upper surface peripheral portion of the substrate,
- the total spouting flow rates of the protection liquid to be spouted from the first and second protection liquid nozzles are set at a second flow rate level when the spraying region is located at the upper surface center portion of the substrate, and
- the total spouting flow rates of the protection liquid to be spouted from the first and second protection liquid nozzles are set at a third flow rate level higher than the first flow rate level and the second flow rate level when the spraying region is at a middle portion which is located between the upper surface peripheral portion and center portion in the protection liquid spouting step.

* * * * *